(12) United States Patent  (10) Patent No.: US 7,816,952 B2
Hashimoto et al.  (45) Date of Patent: *Oct. 19, 2010

(54) CLOCK SIGNAL SWITCHING DEVICE, CLOCK SIGNAL SWITCHING METHOD, DATA BUS SWITCHING DEVICE, AND DATA BUS SWITCHING METHOD

(75) Inventors: Shinichi Hashimoto, Osaka (JP); Tadahiro Yoshida, Osaka (JP); Ryogo Yanagisawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/184,949

(22) Filed: Aug. 1, 2008

(65) Prior Publication Data

US 2008/0290913 A1  Nov. 27, 2008

Related U.S. Application Data

(62) Division of application No. 11/598,020, filed on Nov. 13, 2006, now Pat. No. 7,423,459, which is a division of application No. 10/890,154, filed on Jul. 14, 2004, now Pat. No. 7,145,368.

(30) Foreign Application Priority Data

Jul. 14, 2003 (JP) .............................. 2003-274346

(51) Int. Cl.
*H03K 17/00* (2006.01)

(52) U.S. Cl. ........................................ 327/99; 327/294
(58) Field of Classification Search ................... 327/99, 327/141, 271, 291–299
See application file for complete search history.

(56) References Cited

U.S. PATENT DOCUMENTS

| 5,373,254 | A | 12/1994 | Nakauchi et al. |
| 5,537,062 | A | 7/1996 | Mote, Jr. |
| 5,926,044 | A | 7/1999 | Niimura |
| 6,453,425 | B1 | 9/2002 | Hede et al. |
| 6,600,345 | B1 | 7/2003 | Boutaud |
| 6,646,480 | B2 * | 11/2003 | Weng et al. .................. 327/99 |

(Continued)

FOREIGN PATENT DOCUMENTS

JP  02-082812  3/1990

(Continued)

OTHER PUBLICATIONS

English translation of Japanese Notice of Reasons for Rejection issued in Japanese Patent Application No. JP 2004-203253 dated Jan. 26, 2010.

(Continued)

*Primary Examiner*—Dinh T. Le
(74) *Attorney, Agent, or Firm*—McDermott Will & Emery LLP

(57) ABSTRACT

A clock signal switching device includes: a plurality of signal synchronization generation means for generating mask signals and synchronized switching signals; a plurality of clock signal mask means for generating masked clock signals; a synchronized switching signal selection means for selecting one from among the synchronized switching signals; and a masked clock signal selection means for selecting one from among the masked clock signals.

9 Claims, 46 Drawing Sheets

U.S. PATENT DOCUMENTS

| | | |
|---|---|---|
| 6,795,932 B2 | 9/2004 | Ohkawa |
| 6,845,490 B2 | 1/2005 | Natsume |
| 7,046,047 B2 * | 5/2006 | Daijo .......................... 327/99 |
| 7,180,336 B2 * | 2/2007 | Lee et al. ..................... 327/99 |
| 7,188,336 B2 | 3/2007 | Humphries |

FOREIGN PATENT DOCUMENTS

| | | |
|---|---|---|
| JP | 04-305719 | 10/1992 |
| JP | 05-324119 | 12/1993 |
| JP | 08-328687 | 12/1996 |
| JP | 09-098161 | 4/1997 |
| JP | 11-068726 | 3/1999 |
| JP | 11-506885 | 6/1999 |
| JP | 2002-117683 | 4/2002 |
| JP | 2003-51738 A | 2/2003 |

OTHER PUBLICATIONS

Japanese Notice of Reasons for Rejection, w/ English translation thereof, issued in Japanese Patent Application No. JP 2004-203253 dated Apr. 13, 2010.

* cited by examiner

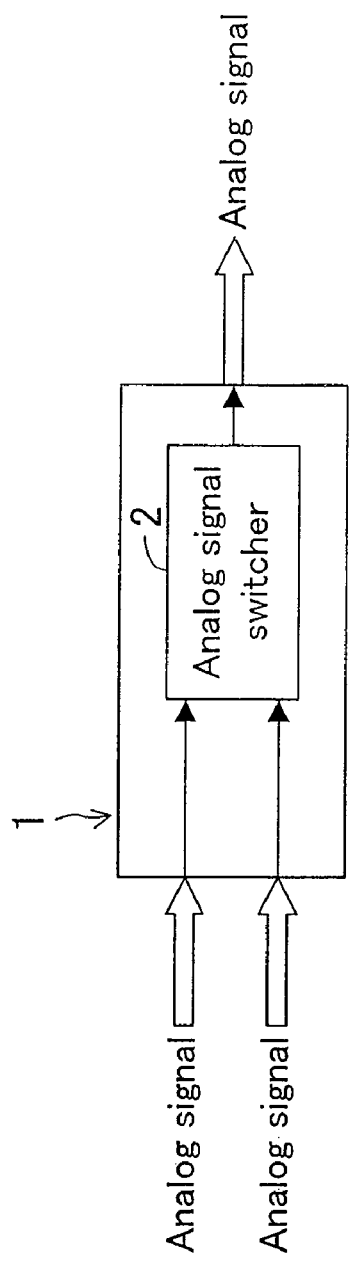
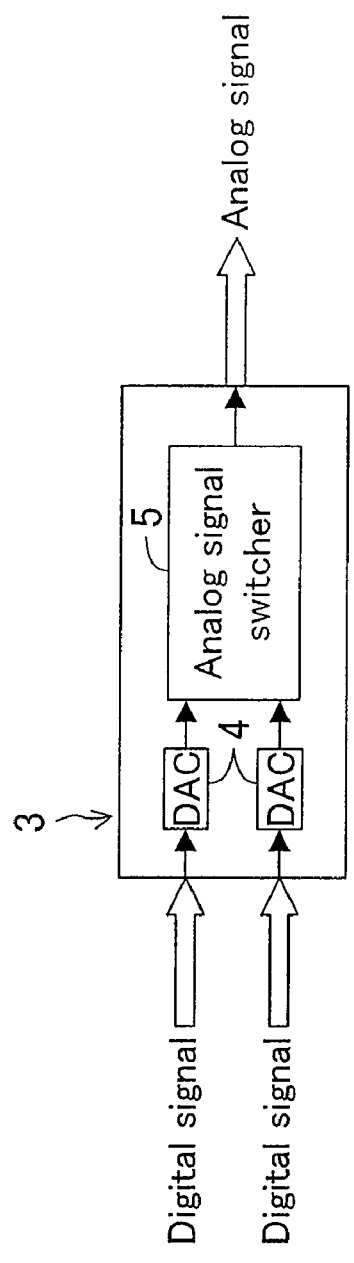
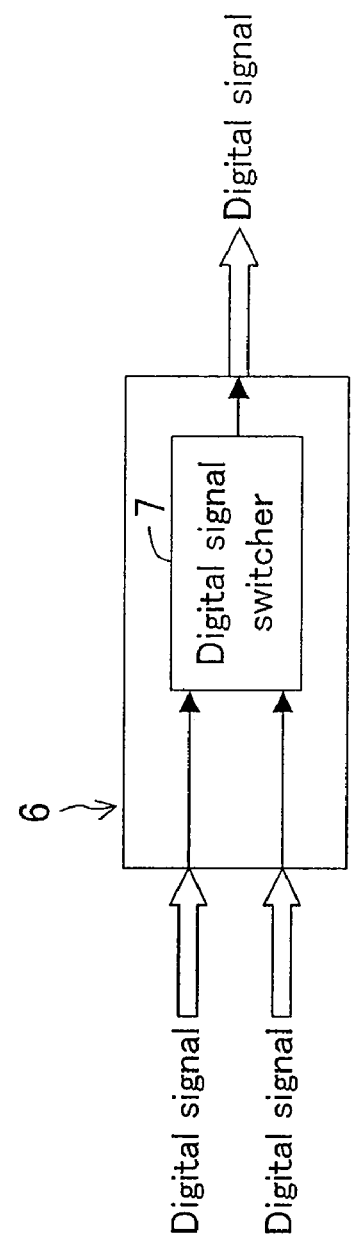
FIG.46A PRIOR ART
FIG.46B PRIOR ART
FIG.46C PRIOR ART

CLOCK SIGNAL SWITCHING DEVICE, CLOCK SIGNAL SWITCHING METHOD, DATA BUS SWITCHING DEVICE, AND DATA BUS SWITCHING METHOD

RELATED APPLICATIONS

This application is a Divisional of application Ser. No. 11/598,020 filed Nov. 13, 2006 now U.S. Pat. No. 7,423,459 which is a Divisional of application Ser. No. 10/890,154, filed Jul. 14, 2004, now U.S. Pat. No. 7,145,368, which claims priority of Japanese Patent application No. 2003-274346, filed Jul. 14, 2003, the contents of which are herewith incorporated by reference.

BACKGROUND OF THE INVENTION

The present invention relates to clock signal switching devices, clock signal switching methods, data bus switching devices, and data bus switching methods. The present invention more particularly relates to clock signal switching devices and clock signal switching methods for selecting one from among a plurality of clock signals in data receiving devices, and also relates to data bus switching devices and data bus switching methods for selecting, in data receiving devices, one from among data signals inputted via a plurality of data buses.

In recent years, receiving devices which receive data sets from a plurality of transmission paths and output one of the received data sets have been widely used in systems for transmitting video signals, audio signals, and other signals. Those receiving devices need a transmission path switcher for selecting a transmission path.

For example, some analog TV monitors can receive data sets outputted from a plurality of transmitting devices such as a video player and a DVD player, and also perform switching among those received data sets to display a selected data.

Hereinafter, a description of three exemplary prior-art receiving devices will be made, which can perform switching among data sets received via a plurality of transmission paths and output the selected data.

FIG. 46A illustrates an example of a first prior art device capable of outputting any one of a plurality of inputted analog signals in its original analog signal form. FIG. 46B illustrates an example of a second prior art device capable of converting a plurality of inputted digital signals into analog signals and then outputting any one of the analog signals.

As shown in FIG. 46A, the first prior art device 1 includes an analog signal switcher 2, which can select any one of a plurality of inputted analog signals (two kinds of analog signals in FIG. 46) and output the selected analog signal in its original analog signal form.

Also, as shown in FIG. 46B, along with recent increased usage of digital signals, the second prior art device 3, which can convert a plurality of inputted digital signals into analog signals and output any one of the converted analog signals, has also been commonly used. The second conventional device 3 is furnished with a plurality of DACs (digital to analog converters) 4 that convert the plurality of inputted digital signals into the respective analog signals, and an analog signal switcher 5 that outputs any one of the analog signals converted by the DACs 4.

However, the first conventional device 1 shown in FIG. 46A, which switches the multiple analog signal inputs, is adversely affected by noise that is peculiar to analog signals. Also, in the second prior art device 3 shown in FIG. 46B, in which digital signals have to be converted into analog signals, accurate reproduction of the inputted data as it is might become difficult depending on the accuracy of the conversion into the analog signals performed by the DACs 4.

In view of these problems, a third prior art device, which is capable of outputting an inputted digital signal in its original digital signal form, has been proposed as a result of recent advancement of digital technology. FIG. 46C illustrates such a third prior art device.

FIG. 46C illustrates an example of the third prior art device that can output any one of a plurality of inputted digital signals in its original digital signal form.

As shown in FIG. 46C, the third prior art device 6 is provided with a digital signal switcher 7, which selects any one of a plurality of inputted digital signals and outputs the selected digital signal in its original digital signal form. Therefore, for example, when the third conventional device 6 is installed in a television monitor such as a digital flat panel, the television monitor becomes able to display received digital signals without converting those digital signals into analog signals. Since such conversion to analog signals is not necessary, the received original digital images and other data can be reproduced highly accurately. Furthermore, unlike the second prior art device 3, the third prior art device 6 does not need to include DACs 4 that convert digital signals into analog signals. This results in a reduction in the size of the receiving device itself.

Nevertheless, if the third prior art device 6 shown in FIG. 46C employs a system such as DVI (digital visual interface) or HDMI (high definition multimedia interface) for transmitting video signals and audio signals, a clock signal for adjusting the timing of transmitting/receiving of the data signals such as the video and audio signals has to be transmitted separately from those data signals. In that case, a receiving device such as the third prior art device 6, e.g., operates based on the timing of such an inputted clock signal. Thus, if the clock signal is disturbed, the data signals might not be processed properly. In addition, transmission systems such as DVI and HDMI have specifications by which clock signals with different phases or different periods can be transmitted/received. Just switching over from one inputted clock signal to another in the receiving device may therefore lead to occurrence of a short-width abnormal pulse (a hazard), duty ratio breakdown, or other disturbance in the clock signal. Such a disturbance in the clock signal becomes a critical problem particularly in specifications such as DVI or HDMI by which clock signals can be switched. Therefore, digital transmission systems that transmit data signals and clock signals separately require a system that prevents clock signal disturbance when clock signals are switched.

As a means for solving the above problem, the Japanese Laid-Open Publication No. 9-98161, for example, discloses a synchronous clock signal switching circuit. More specifically, the synchronous clock signal switching circuit disclosed in the publication is designed in the following manners to prevent occurrence of a hazard or duty ratio breakdown in a newly selected clock signal.

First, as a means for preventing occurrence of a hazard (or a glitch) in a clock signal, a clock signal selection signal (a switching signal), which is inputted when an inputted first clock signal and an inputted second clock signal are both at a high level, is synchronized with a falling edge of the logical product of the first and second clock signals. In this case, either the first or second clock signal is selected and outputted based on the clock signal selection signal that is synchronized with the falling edge of the logical product of the first and second clock signals.

Also, in order to avoid duty ratio breakdown (a pulse jump) in the clock signal, when switchover from the inputted first clock signal to the inputted second clock signal is performed, a phase difference between the first and second clock signals is detected. If the detected phase difference is greater than ±90°, switchover to the inverted second clock signal is performed. On the other hand, if the detected phase difference is smaller than ±90°, switchover to the inputted second clock signal in its original state is performed.

SUMMARY OF THE INVENTION

However, in addition to the clock signals and the clock signal selection signal, a new clock signal, which has a frequency twice that of the clock signals and is in phase with the clock signals, has to be inputted to the conventional clock signal switching device in order to prevent duty ratio breakdown. Furthermore, in the circuit for hazard prevention, hazards may be prevented, but duty ratio breakdown might occur. Moreover, switching among clock signals that are asynchronous to each other is not possible.

In view of the above respects, it is therefore an object of the present invention to perform switching among clock signals that are asynchronous to each other and have different phases, without causing any hazard and any duty ratio breakdown.

In order to achieve the object, a first inventive clock signal switching device includes: first signal synchronization generation means for generating, based on a switching signal used in selecting either a first clock signal or a second clock signal and based on the first clock signal, a first mask signal and a first synchronized switching signal each synchronous with the first clock signal; second signal synchronization generation means for generating, based on the switching signal and the second clock signal, a second mask signal and a second synchronized switching signal each synchronous with the second clock signal; first clock signal mask means for masking the first clock signal with the first mask signal, thereby generating a first masked clock signal; second clock signal mask means for masking the second clock signal with the second mask signal, thereby generating a second masked clock signal; synchronized switching signal selection means for selecting either the first synchronized switching signal or the second synchronized switching signal as a selected switching signal based on the switching signal; and masked clock signal selection means for selecting either the first masked clock signal or the second masked clock signal as a selected clock signal based on the selected switching signal.

In the first clock signal switching device, the first signal synchronization generation means generates the first mask signal that is synchronous with the first clock signal. Furthermore, the first clock signal mask means generates the first masked clock signal by masking the first clock signal with the first mask signal. That is to say, part of the first clock signal in which a hazard or duty ratio breakdown might occur can be removed (masked) before the masked clock signal selection means selects the clock signal. Likewise, part of the second clock signal in which a hazard or duty ratio breakdown might occur can also be removed before the masked clock signal selection means selects the clock signal. In this manner, before either the inputted first or second clock signal is selected, respective part of the first and second clock signals in which a hazard or duty ratio breakdown might occur can be removed. Accordingly, occurrence of a hazard or duty ratio breakdown caused by the clock signal switching can be prevented beforehand.

In the first clock signal switching device, the first clock signal and the second clock signal preferably have different frequencies.

Then, the effects mentioned above can be reliably obtained even in cases where the first and second clock signals have different frequencies (it will be easily appreciated that those cases include cases where the first and second clock signals are asynchronous to each other.)

In the first clock signal switching device, the first clock signal and the second clock signal are preferably out of phase with each other.

Then, the effects mentioned above can be reliably obtained even in cases where the first and second clock signals are out of phase with each other.

A first inventive data receiving device includes: at least one said first clock signal switching device as signal switching means; first receiving means for outputting the externally received first clock signal to the signal switching means; second receiving means for outputting the externally received second clock signal to the signal switching means; and transmitting means for externally transmitting the selected clock signal selected by the signal switching means.

In the first data receiving device, either the first clock signal that the first receiving means receives externally or the second clock signal that the second receiving means receives externally can be selected by the signal switching means, and the selected clock signal can be externally transmitted by the transmitting means. Furthermore, since the signal switching means is composed of the first clock signal switching device, switching can be performed without causing any hazard or duty ratio breakdown in the clock signal. Also, if, e.g., N sets, each including the first receiving means, the second receiving means, and the signal switching means are provided, (N−1) clock signals can be received, and any one of the received (N−1) clock signals can be selected by the respective N signal switching means.

A first inventive clock signal switching method includes the steps of: generating, based on a switching signal used in selecting either a first clock signal or a second clock signal and based on the first clock signal, a first mask signal and a first synchronized switching signal each synchronous with the first clock signal, and also generating, based on the switching signal and the second clock signal, a second mask signal and a second synchronized switching signal each synchronous with the second clock signal; masking the first clock signal with the first mask signal to generate a first masked clock signal, and masking the second clock signal with the second mask signal to generate a second masked clock signal; selecting either the first synchronized switching signal or the second synchronized switching signal as a selected switching signal based on the switching signal; and selecting either the first masked clock signal or the second masked clock signal as a selected clock signal based on the selected switching signal.

According to the first clock signal switching method, the first and second mask signals that are synchronous with the first and second clock signals, respectively, can be generated. In addition, the first masked clock signal can be produced by masking the first clock signal with the generated first mask signal, while the second masked clock signal can be produced by masking the second clock signal with the generated second mask signal. That is to say, before either the inputted first or second clock signal is selected, respective part of the first and second clock signals in which a hazard or duty ratio breakdown might occur can be removed. Accordingly, occurrence of a hazard or duty ratio breakdown caused by the clock signal switching can be prevented beforehand.

In the first clock signal switching method, the first clock signal and the second clock signal preferably have different frequencies.

Then, the effects mentioned above can be reliably obtained even in cases where the first and second clock signals have different frequencies.

In the first clock signal switching method, the first clock signal and the second clock signal are preferably out of phase with each other.

Then, the effects mentioned above can be reliably obtained even in cases where the first and second clock signals are out of phase with each other.

A first inventive data bus switching device includes: first signal synchronization generation means for generating a first mask signal and a first synchronized switching signal based on a switching signal used in selecting either a first clock signal inputted via a first data bus or a second clock signal inputted via a second data bus and based on the first clock signal, the first mask signal and the first synchronized switching signal being synchronous with the first clock signal; second signal synchronization generation means for generating, based on the switching signal and the second clock signal, a second mask signal and a second synchronized switching signal each synchronous with the second clock signal; first clock signal mask means for masking the first clock signal with the first mask signal, thereby generating a first masked clock signal; second clock signal mask means for masking the second clock signal with the second mask signal, thereby generating a second masked clock signal; synchronized switching signal selection means for selecting either the first synchronized switching signal or the second synchronized switching signal as a selected switching signal based on the switching signal; masked clock signal selection means for selecting either the first masked clock signal or the second masked clock signal as a selected clock signal based on the selected switching signal; and data signal selection means for selecting either a first data signal or a second data signal as a selected data signal based on the selected switching signal, the first data signal being inputted via the first data bus and synchronous with the first clock signal, the second data signal being inputted via the second data bus and synchronous with the second clock signal.

In the first data bus switching device, the first signal synchronization generation means generates the first mask signal that is synchronous with the first clock signal. Furthermore, the first clock signal mask means generates the first masked clock signal by masking the first clock signal with the first mask signal. That is to say, part of the first clock signal in which a hazard or duty ratio breakdown might occur can be removed before the masked clock signal selection means selects either the first or second clock signal. Likewise, part of the second clock signal in which a hazard or duty ratio breakdown might occur can also be removed before the masked clock signal selection means carries out the clock signal selection. Therefore, occurrence of a hazard or duty ratio breakdown caused by the clock signal switching can be prevented beforehand. Accordingly, it is possible to output the data signals without causing any operational malfunctions by synchronizing the data signals to the clock signals containing no hazard and no duty ratio breakdown.

In the first data bus switching device, the first clock signal and the second clock signal preferably have different frequencies.

Then, the effects mentioned above can be reliably obtained even in cases where the first and second clock signals have different frequencies.

In the first data bus switching device, the first clock signal and the second clock signal are preferably out of phase with each other.

Then, the effects mentioned above can be reliably obtained even in cases where the first and second clock signals are out of phase with each other.

A second inventive data receiving device includes: at least one said first data bus switching device as signal switching means; first receiving means for outputting to the signal switching means the first clock signal and the first data signal that are received externally; second receiving means for outputting to the signal switching means the second clock signal and the second data signal that are received externally; and transmitting means for externally transmitting the selected clock signal and the selected data signal selected by the signal switching means.

In the second data receiving device, either the first clock signal that the first receiving means receives externally or the second clock signal that the second receiving means receives externally can be selected by the signal switching means, and the selected clock signal can be externally transmitted by the transmitting means. Furthermore, since the signal switching means is composed of the first data bus switching device, switching can be performed without causing any hazard or duty ratio breakdown in the clock signal. Thus, even if the second inventive data receiving device is employed in digital transmission systems such as DVI and HDMI, in which clock signals and data signals are transmitted separately, switching between the plurality of digital signals can be reliably performed without producing any operational malfunctions. Also, if, e.g., N sets, each including the first receiving means, the second receiving means, and the signal switching means, are provided, (N−1) clock signals can be received, and any one of the received (N−1) clock signals can be selected by the respective N signal switching means.

A first inventive data bus switching method includes the steps of: generating a first mask signal and a first synchronized switching signal, which are each synchronous with the first clock signal, based on a switching signal used in selecting either a first clock signal inputted via a first data bus or a second clock signal inputted via a second data bus and based on the first clock signal, and also generating a second mask signal and a second synchronized switching signal, which are each synchronous with the second clock signal, based on the switching signal and the second clock signal; masking the first clock signal with the first mask signal, thereby generating a first masked clock signal; masking the second clock signal with the second mask signal, thereby generating a second masked clock signal; selecting either the first synchronized switching signal or the second synchronized switching signal as a selected switching signal based on the switching signal; selecting either the first masked clock signal or the second masked clock signal as a selected clock signal based on the selected switching signal; and selecting either a first data signal or a second data signal as a selected data signal based on the selected switching signal, the first data signal being inputted via the first data bus and synchronous with the first clock signal, the second data signal being inputted via the second data bus and synchronous with the second clock signal.

According to the first data bus switching method, the first and second mask signals that are synchronous with the first and second clock signal, respectively, can be generated. In addition, the first masked clock signal can be produced by masking the first clock signal with the generated first mask signal, while the second masked clock signal can be produced by masking the second clock signal with the generated second mask signal. That is to say, before the clock signal to be outputted is selected, respective part of the first and second clock signals in which a hazard or duty ratio breakdown might occur can be removed (masked). Occurrence of a hazard or duty ratio breakdown caused by the clock signal switching can thus be prevented beforehand. Accordingly, it is possible to output the data signals without causing any operational malfunctions by synchronizing the data signals to the clock signals containing no hazard and no duty ratio breakdown.

In the first data bus switching method, the first clock signal and the second clock signal preferably have different frequencies.

Then, the effects mentioned above can be reliably obtained even in cases where the first and second clock signals have different frequencies.

In the first data bus switching method, the first clock signal and the second clock signal are preferably out of phase with each other.

Then, the effects mentioned above can be reliably obtained even in cases where the first and second clock signals are out of phase with each other.

A second inventive clock signal switching device includes: first clock signal mask means for masking a first clock signal with a first mask signal, thereby generating a first masked clock signal; second clock signal mask means for masking a second clock signal with a second mask signal, thereby generating a second masked clock signal; and masked clock signal selection means for selecting either the first masked clock signal or the second masked clock signal as a selected clock signal based on a switching signal used in selecting either the first clock signal or the second clock signal.

In the second clock signal switching device, the first clock signal mask means masks the first clock signal with the first mask signal, thereby generating the first masked clock signal, before the masked clock signal selection means carries out the clock signal selection. Also, the second clock signal mask means masks the second clock signal with the second mask signal, thereby generating the second masked clock signal, before the masked clock signal selection means carries out the clock signal selection. That is to say, before either the inputted first or second clock signal is selected, respective part of the first and second clock signals in which a hazard or duty ratio breakdown might occur can be removed. Thus, it is possible to prevent beforehand a hazard or duty ratio breakdown from occurring in the selected clock signal (the first or second masked clock signal) selected by the masked clock signal selection means.

In the second clock signal switching device, the first clock signal and the second clock signal preferably have different frequencies.

Then, the effects mentioned above can be reliably obtained even in cases where the first and second clock signals have different frequencies.

In the second clock signal switching device, the first clock signal and the second clock signal are preferably out of phase with each other.

Then, the effects mentioned above can be reliably obtained even in cases where the first and second clock signals are out of phase with each other.

The second clock signal switching device preferably further includes: first signal synchronization generation means for synchronizing the first mask signal to the first clock signal; and second signal synchronization generation means for synchronizing the second mask signal to the second clock signal. And in the second clock signal switching device, the first clock signal mask means preferably masks the first clock signal with the first mask signal that is synchronous with the first clock signal; and the second clock signal mask means preferably masks the second clock signal with the second mask signal that is synchronous with the second clock signal.

Then, the inputted first mask signal can be synchronized with the first clock signal by the first signal synchronization generation means, while the inputted second mask signal can be synchronized with the second clock signal by the second signal synchronization generation means. Consequently, the first clock signal mask means is allowed to reliably mask the first clock signal with the first mask signal. In other words, it is possible to suppress occurrence of a hazard or duty ratio breakdown in the first clock signal. Likewise, occurrence of a hazard or duty ratio breakdown in the second clock signal can be suppressed. As a result, the above mentioned effects can be attained reliably.

The second clock signal switching device preferably further includes: first signal synchronization generation means for synchronizing the switching signal to the first clock signal; second signal synchronization generation means for synchronizing the switching signal to the second clock signal; and switching signal selection means for selecting either the switching signal that is synchronous with the first clock signal or the switching signal that is synchronous with the second clock signal, as a selected switching signal based on the switching signal. And in the second clock signal switching device, the masked clock signal selection means preferably selects either the first masked clock signal or the second masked clock signal as the selected clock signal based on the selected switching signal.

Then, either the switching signal synchronized with the first clock signal by the first signal synchronization generation means or the switching signal synchronized with the second clock signal by the second signal synchronization generation means can be selected by the switching signal selection means. Thus, when the masked clock signal selection means performs switching of the masked clock signals, occurrence of a hazard or duty ratio breakdown in the selected masked clock signal can be suppressed. As a result, the above mentioned effects can be attained reliably.

A third inventive data receiving device includes: at least one said second clock signal switching device as signal switching means; first receiving means for outputting the externally received first clock signal to the signal switching means; second receiving means for outputting the externally received second clock signal to the signal switching means; and transmitting means for externally transmitting the selected clock signal selected by the signal switching means.

In the third data receiving device, either the first clock signal externally received by the first receiving means or the second clock signal externally received by the second receiving means can be selected by the signal switching means, and the selected clock signal can be externally transmitted by the transmitting means. Furthermore, since the signal switching means is composed of the second clock signal switching device, switching can be performed without causing any hazard or duty ratio breakdown in the clock signal. Also, if, e.g., N sets, each including the first receiving means, the second receiving means, and the signal switching means, are provided, (N−1) clock signals can be received, and any one of the received (N−1) clock signals can be selected by the respective N signal switching means.

A second inventive data bus switching device includes: first clock signal mask means for masking a first clock signal inputted via a first data bus with a first mask signal, thereby generating a first masked clock signal; second clock signal mask means for masking a second clock signal inputted via a second data bus with a second mask signal, thereby generating a second masked clock signal; masked clock signal selection means for selecting either the first masked clock signal or the second masked clock signal as a selected masked clock signal based on a switching signal used in selecting either the first clock signal or the second clock signal; and data signal selection means for selecting either a first data signal or a second data signal as a selected data signal based on the switching signal, the first data signal being inputted via the first data bus and synchronous with the first clock signal, the second data signal being inputted via the second data bus and synchronous with the second clock signal.

In the second data bus switching device, before the masked clock signal selection means selects either the first or second clock signal, the first clock signal mask means can generate the first masked clock signal by masking the first clock signal with the first mask signal. Also, the second clock signal mask means can generate the second masked clock signal by masking the second clock signal with the second mask signal. Thus, it is possible to prevent beforehand a hazard or duty ratio breakdown from occurring in the first or second masked clock signal selected by the masked clock signal selection means. Accordingly, occurrence of, e.g., operational malfunctions can be prevented by outputting the data signal that is synchronized with the corresponding clock signal containing no hazard and no duty ratio breakdown.

In the second data bus switching device, the first clock signal and the second clock signal preferably have different frequencies.

Then, the effects mentioned above can be reliably obtained even in cases where the first and second clock signals have different frequencies.

In the second data bus switching device, the first clock signal and the second clock signal are preferably out of phase with each other.

Then, the effects mentioned above can be reliably obtained even in cases where the first and second clock signals are out of phase with each other.

The second data bus switching device preferably further includes: first signal synchronization generation means for synchronizing the first mask signal to the first clock signal; and second signal synchronization generation means for synchronizing the second mask signal to the second clock signal. And in the second data bus switching device, the first clock signal mask means preferably masks the first clock signal with the first mask signal that is synchronous with the first clock signal; and the second clock signal mask means preferably masks the second clock signal with the second mask signal that is synchronous with the second clock signal.

Then, the inputted first mask signal can be synchronized with the first clock signal by the first signal synchronization generation means, while the inputted second mask signal can be synchronized with the second clock signal by the second signal synchronization generation means. Consequently, the first clock signal mask means is allowed to reliably mask the first clock signal with the first mask signal. In other words, it is possible to suppress occurrence of a hazard or duty ratio breakdown in the first clock signal. Likewise, occurrence of a hazard or duty ratio breakdown in the second clock signal can also be suppressed. As a result, the above mentioned effects can be attained reliably.

The second data bus switching device preferably further includes: first signal synchronization generation means for synchronizing the switching signal to the first clock signal; second signal synchronization generation means for synchronizing the switching signal to the second clock signal; and switching signal selection means for selecting either the switching signal that is synchronous with the first clock signal or the switching signal that is synchronous with the second clock signal, as a selected switching signal based on the switching signal. And in the second data bus switching device, the masked clock signal selection means preferably selects either the first masked clock signal or the second masked clock signal as the selected clock signal based on the selected switching signal, and the data signal selection means preferably selects either the first data signal or the second data signal as the selected data signal based on the selected switching signal.

Then, either the switching signal synchronized with the first clock signal by the first signal synchronization generation means or the switching signal synchronized with the second clock signal by the second signal synchronization generation means can be selected by the switching signal selection means. Thus, when the masked clock signal selection means performs switching of the masked clock signals, occurrence of a hazard or duty ratio breakdown can be suppressed in the selected masked clock signal. As a result, the above mentioned effects can be attained reliably.

A fourth inventive data receiving device includes: at least one said second data bus switching device as signal switching means; first receiving means for outputting to the signal switching means the first clock signal and the first data signal that are received externally; second receiving means for outputting to the signal switching means the second clock signal and the second data signal that are received externally; and transmitting means for externally transmitting the selected clock signal and the selected data signal selected by the signal switching means.

In the fourth data receiving device, either the first clock signal externally received by the first receiving means or the second clock signal externally received by the second receiving means can be selected by the signal switching means, and the selected clock signal can be externally transmitted by the transmitting means. Furthermore, since the signal switching means is composed of the second data bus switching device, switching can be performed without causing any hazard or duty ratio breakdown in the clock signal. Thus, even if the fourth inventive data receiving device is employed in digital transmission systems such as DVI and HDMI, in which clock signals and data signals are transmitted separately, switching between the plurality of digital signals can be reliably performed without producing any operational malfunctions. Also, if, e.g., N sets, each including the first receiving means, the second receiving means, and the signal switching means, are provided, (N−1) clock signals can be received, and any one of the received (N−1) clock signals can be selected by the respective N signal switching means.

A third inventive clock signal switching device includes: first signal synchronization generation means for generating, based on a switching signal used in selecting either a first clock signal or a second clock signal and based on the first clock signal, a first mask signal and a first synchronized switching signal each synchronous with the first clock signal; second signal synchronization generation means for generating, based on the switching signal and the second clock signal, a second mask signal and a second synchronized switching signal each synchronous with the second clock signal; synchronized switching signal selection means for selecting either the first synchronized switching signal or the second synchronized switching signal as a selected switching signal based on the switching signal; clock signal selection means for selecting either the first clock signal or the second clock signal as a selected clock signal based on the selected switching signal; synthesized mask signal generation means for generating a synthesized mask signal having a masking portion where a masking portion of the first mask signal and a masking portion of the second mask signal overlap each other; and clock signal mask means for masking the selected clock signal with the synthesized mask signal.

In the third clock signal switching device, the first mask signal and the first synchronized switching signal that are synchronous with the first clock signal can be generated by the first signal synchronization generation means, while the second mask signal and the second synchronized switching signal that are synchronous with the second clock signal can be generated by the second signal synchronization generation means. Also, either the first or second clock signal can be selected as the selected clock signal by the clock signal selection means based on the first or second synchronized switching signal selected as the selected switching signal by the synchronized switching signal selection means. Moreover, the synthesized mask signal generation means generates the synthesized mask signal that has a masking portion where a masking portion of the first mask signal and a masking portion of the second mask signal overlap each other, while the clock signal mask means masks the selected clock signal with the generated synthesized mask signal. That is to say, after the clock signal selection means selects the selected clock signal, part of the selected clock signal in which a hazard or duty ratio breakdown might have occurred can be removed. In other words, the selected clock signal can be masked with the synthesized mask signal that masks the part of the selected clock signal in which a hazard or duty ratio breakdown might occur. This allows removal of the produced hazard or duty ratio breakdown before the selected clock signal is outputted. As a result, the clock signal from which the hazard or duty ratio breakdown has been removed can be outputted as the output clock signal.

In the third clock signal switching device, the first clock signal and the second clock signal preferably have different frequencies.

Then, the effects mentioned above can be reliably obtained even in cases where the first and second clock signals have different frequencies.

In the third clock signal switching device, the first clock signal and the second clock signal are preferably out of phase with each other.

Then, the effects mentioned above can be reliably obtained even in cases where the first and second clock signals are out of phase with each other.

A fifth inventive data receiving device includes: at least one said third clock signal switching device as signal switching means; first receiving means for outputting the externally received first clock signal to the signal switching means; second receiving means for outputting the externally received second clock signal to the signal switching means; and transmitting means for externally transmitting the selected clock signal selected by the signal switching means.

In the fifth data receiving device, either the first clock signal externally received by the first receiving means or the second clock signal externally received by the second receiving means can be selected by the signal switching means, and the selected clock signal can be externally transmitted by the transmitting means. Furthermore, since the signal switching means is composed of the third clock signal switching device, switching can be performed without causing any hazard or duty ratio breakdown in the clock signal. Also, if, e.g., N sets, each including the first receiving means, the second receiving means, and the signal switching means, are provided, (N−1) clock signals can be received, and any one of the received (N−1) clock signals can be selected by the respective N signal switching means.

A second inventive clock signal switching method includes the steps of: generating, based on a switching signal used in selecting either a first clock signal or a second clock signal and based on the first clock signal, a first mask signal and a first synchronized switching signal each synchronous with the first clock signal, and also generating, based on the switching signal and the second clock signal, a second mask signal and a second synchronized switching signal each synchronous with the second clock signal; selecting either the first synchronized switching signal or the second synchronized switching signal as a selected switching signal based on the switching signal; selecting either the first clock signal or the second clock signal as a selected clock signal based on the selected switching signal; generating a synthesized mask signal having a masking portion where a masking portion of the first mask signal and a masking portion of the second mask signal overlap each other; and masking the selected clock signal with the synthesized mask signal.

In the second clock signal switching method, the first mask signal and the first synchronized switching signal that are synchronous with the inputted first clock signal can be generated, while the second mask signal and the second synchronized switching signal that are synchronous with the inputted second clock signal can be generated. Also, either the generated first or second synchronized switching signal can be selected as the selected switching signal, and based on the selected switching signal, either the first or second clock signal can be selected as the selected clock signal. Moreover, the synthesized mask signal that has a masking portion where a masking portion of the first mask signal and a masking portion of the second mask signal overlap each other can also be created, and the selected clock signal can be masked with the synthesized mask signal. That is to say, after either the first or second clock signal is selected as the selected clock signal, part of the selected clock signal in which a hazard or duty ratio breakdown might have occurred can be removed using the synthesized mask signal. In other words, the selected clock signal can be masked with the synthesized mask signal that masks the part of the selected clock signal in which a hazard or duty ratio breakdown might occur. This allows removal of the produced hazard or duty ratio breakdown, and thereafter the clock signal from which the hazard or duty ratio breakdown has been removed can be outputted as the output clock signal.

In the second clock signal switching method, the first clock signal and the second clock signal preferably have different frequencies.

Then, the effects mentioned above can be reliably obtained even in cases where the first and second clock signals have different frequencies.

In the second clock signal switching method, the first clock signal and the second clock signal are preferably out of phase with each other.

Then, the effects mentioned above can be reliably obtained even in cases where the first and second clock signals are out of phase with each other.

A third inventive data bus switching device includes: first signal synchronization generation means for generating a first mask signal and a first synchronized switching signal based on a switching signal used in selecting either a first clock signal inputted via a first data bus or a second clock signal inputted via a second data bus and based on the first clock signal, the first mask signal and the first synchronized switching signal each being synchronous with the first clock signal; second signal synchronization generation means for generating, based on the switching signal and the second clock signal, a second mask signal and a second synchronized switching signal each synchronous with the second clock signal; synchronized switching signal selection means for selecting either the first synchronized switching signal or the second synchronized switching signal as a selected switching signal based on the switching signal; clock signal selection means for selecting either the first clock signal or the second clock signal as a selected clock signal based on the selected switching signal; synthesized mask signal generation means for generating a synthesized mask signal having a masking portion where a masking portion of the first mask signal and a masking portion of the second mask signal overlap each other; clock signal mask means for masking the selected clock signal with the synthesized mask signal; and data signal selection means for selecting either a first data signal or a second data signal as a selected data signal based on the selected switching signal, the first data signal being inputted via the first data bus and synchronous with the first clock signal, the second data signal being inputted via the second data bus and synchronous with the second clock signal.

In the third data bus switching device, the first signal synchronization generation means produces the first mask signal and the first synchronized switching signal that are synchronous with the first clock signal inputted via the first data bus, while the second signal synchronization generation means generates the second mask signal and the second synchronized switching signal that are synchronous with the second clock signal inputted via the second data bus. Also, either the first or second clock signal can be selected as the selected clock signal by the clock signal selection means based on the first or second synchronized switching signal selected as the selected switching signal by the synchronized switching signal selection means. Moreover, the synthesized mask signal generation means generates the synthesized mask signal that has a masking portion where a masking portion of the first mask signal and a masking portion of the second mask signal overlap each other, while the clock signal mask means masks the selected clock signal with the synthesized mask signal. That is to say, after the clock signal selection means selects the selected clock signal, part of the selected clock signal in which a hazard or duty ratio breakdown might have occurred can be removed. In other words, the selected clock signal is masked with the synthesized mask signal that masks the part of the selected clock signal in which a hazard or duty ratio breakdown might occur. This prevents occurrence of a hazard or duty ratio breakdown. Accordingly, occurrence of, e.g., operational malfunctions can be prevented by outputting the data signal that is synchronized with the corresponding clock signal containing no hazard and no duty ratio breakdown. Then, the clock signal from which the hazard or duty ratio breakdown has been removed can be outputted as the output clock signal.

In the third data bus switching device, the first clock signal and the second clock signal preferably have different frequencies.

Then, the effects mentioned above can be reliably obtained even in cases where the first and second clock signals have different frequencies.

In the third data bus switching device, the first clock signal and the second clock signal are preferably out of phase with each other.

Then, the effects mentioned above can be reliably obtained even in cases where the first and second clock signals are out of phase with each other.

A sixth inventive data receiving device includes: at least one said third data bus switching device as signal switching means; first receiving means for outputting to the signal switching means the first clock signal and the first data signal that are received externally; second receiving means for outputting to the signal switching means the second clock signal and the second data signal that are received externally; and transmitting means for externally transmitting the selected clock signal and the selected data signal selected by the signal switching means.

In the sixth data receiving device, either the first clock signal externally received by the first receiving means or the second clock signal externally received by the second receiving means can be selected by the signal switching means, and the selected clock signal can be externally transmitted by the transmitting means. Furthermore, since the signal switching means is composed of the third data bus switching device, switching can be performed without causing any hazard or duty ratio breakdown in the clock signal. Thus, even if the sixth inventive data receiving device is employed in digital transmission systems such as DVI and HDMI, in which clock signals and data signals are transmitted separately, switching between the plurality of digital signals can be reliably performed without producing any operational malfunctions. Also, if, e.g., N sets, each including the first receiving means, the second receiving means, and the signal switching means, are provided, (N−1) clock signals can be received, and any one of the received (N−1) clock signals can be selected by the respective N signal switching means.

A second inventive data bus switching method includes the steps of: generating a first mask signal and a first synchronized switching signal, which are each synchronous with the first clock signal, based on a switching signal used in selecting either a first clock signal inputted via a first data bus or a second clock signal inputted via a second data bus and based on the first clock signal, and also generating a second mask signal and a second synchronized switching signal, which are each synchronous with the second clock signal, based on the switching signal and the second clock signal; selecting either the first synchronized switching signal or the second synchronized switching signal as a selected switching signal based on the switching signal; selecting either the first clock signal or the second clock signal as a selected clock signal based on the selected switching signal; generating a synthesized mask signal having a masking portion where a masking portion of the first mask signal and a masking portion of the second mask signal overlap each other; masking the selected clock signal with the synthesized mask signal; and selecting either a first data signal or a second data signal as a selected data signal based on the selected switching signal, the first data signal being inputted via the first data bus and synchronous with the first clock signal, the second data signal being inputted via the second data bus and synchronous with the second clock signal.

According to the second data bus switching method, it is possible to generate the first mask signal and the first synchronized switching signal that are synchronous with the first clock signal inputted via the first data bus, and the second mask signal and the second synchronized switching signal that are synchronous with the second clock signal inputted via the second data bus. Also, either the generated first or second synchronized switching signal can be selected as the selected switching signal. And based on the selected switching signal, either the first or second clock signal can be selected as the selected clock signal. Moreover, the synthesized mask signal that has a masking portion where a masking portion of the first mask signal and a masking portion of the second mask signal overlap each other can be produced, while the selected clock signal can be masked with the generated synthesized mask signal. That is to say, after either the first or second clock signal is selected as the selected clock signal, part of the selected clock signal in which a hazard or duty ratio breakdown might have occurred can be removed using the synthesized mask signal. In other words, the selected clock signal is masked with the synthesized mask signal that masks the part of the selected clock signal in which a hazard or duty ratio breakdown might occur. This allows removal of the produced hazard or duty ratio breakdown. Accordingly, occurrence of, e.g., operational malfunctions can be prevented by outputting the data signal that is synchronized with the corresponding clock signal containing no hazard and no duty ratio breakdown.

In the second data bus switching method, the first clock signal and the second clock signal preferably have different frequencies.

Then, the effects mentioned above can be reliably obtained even in cases where the first and second clock signals have different frequencies.

In the second data bus switching method, the first clock signal and the second clock signal are preferably out of phase with each other.

Then, the effects mentioned above can be reliably obtained even in cases where the first and second clock signals are out of phase with each other.

A fourth inventive clock signal switching device includes: clock signal selection means for selecting either a first clock signal or a second clock signal as a selected clock signal based on a switching signal used in selecting either the first clock signal inputted via a first data bus or the second clock signal inputted via a second data bus, and clock signal mask means for masking the selected clock signal with an inputted mask signal.

In the fourth clock signal switching device, the clock signal selection means selects either the first or second clock signal as the selected clock signal based on the inputted switching signal. In addition, the clock signal mask means masks the selected clock signal with the inputted mask signal. That is to say, after the clock signal selection means selects the selected clock signal, part of the selected clock signal in which a hazard or duty ratio breakdown might have occurred can be removed using the mask signal. Accordingly, the clock signal from which the hazard or duty ratio breakdown has been removed can be outputted as the output clock signal.

In the fourth clock signal switching device, the first clock signal and the second clock signal preferably have different frequencies.

Then, the effects mentioned above can be reliably obtained even in cases where the first and second clock signals have different frequencies.

In the fourth clock signal switching device, the first clock signal and the second clock signal are preferably out of phase with each other.

Then, the effects mentioned above can be reliably obtained even in cases where the first and second clock signals are out of phase with each other.

A seventh inventive data receiving device includes: at least one said fourth clock signal switching device as signal switching means; first receiving means for outputting the externally received first clock signal to the signal switching means; second receiving means for outputting the externally received second clock signal to the signal switching means; and transmitting means for externally transmitting the selected clock signal selected by the signal switching means.

In the seventh data receiving device, either the first clock signal externally received by the first receiving means or the second clock signal externally received by the second receiving means can be selected by the signal switching means, and the selected clock signal can be externally transmitted by the transmitting means. Furthermore, since the signal switching means is composed of the fourth clock signal switching device, switching can be performed without causing any hazard or duty ratio breakdown in the clock signal. Also, if, e.g., N sets, each including the first receiving means, the second receiving means, and the signal switching means, are provided, (N−1) clock signals can be received, and any one of the received (N−1) clock signals can be selected by the respective N signal switching means.

A fourth inventive data bus switching device includes: clock signal selection means for selecting either a first clock signal or a second clock signal as a selected clock signal based on a switching signal used in selecting either the first clock signal inputted via a first data bus or the second clock signal inputted via a second data bus, clock signal mask means for masking the selected clock signal with an inputted mask signal, and data signal selection means for selecting either a first data signal or a second data signal as a selected data signal based on the switching signal, the first data signal being inputted via the first data bus and synchronous with the first clock signal, the second data signal being inputted via the second data bus and synchronous with the second clock signal.

In the fourth data bus switching device, the clock signal selection means selects as the selected clock signal either the first clock signal inputted via the first data bus or the second clock signal inputted via the second data bus. Also, the clock signal mask means masks the selected clock signal with the mask signal. That is to say, after the clock signal selection means selects the selected clock signal, part of the selected clock signal in which a hazard or duty ratio breakdown might have occurred can be removed using the mask signal. Accordingly, occurrence of, e.g., operational malfunctions can be prevented by outputting the data signal that is synchronized with the corresponding clock signal containing no hazard and no duty ratio breakdown.

In the fourth data bus switching device, the first clock signal and the second clock signal preferably have different frequencies.

Then, the effects mentioned above can be reliably obtained even in cases where the first and second clock signals have different frequencies.

In the fourth data bus switching device, the first clock signal and the second clock signal are preferably out of phase with each other.

Then, the effects mentioned above can be reliably obtained even in cases where the first and second clock signals are out of phase with each other.

An eighth inventive data receiving device includes: at least one said fourth data bus switching device as signal switching means; first receiving means for outputting to the signal switching means the first clock signal and the first data signal that are received externally; second receiving means for outputting to the signal switching means the second clock signal and the second data signal that are received externally; and transmitting means for externally transmitting the selected clock signal and the selected data signal selected by the signal switching means.

In the eighth data receiving device, either the first clock signal externally received by the first receiving means or the second clock signal externally received by the second receiving means can be selected by the signal switching means, and the selected clock signal can be externally transmitted by the transmitting means. Furthermore, since the signal switching means is composed of the fourth data bus switching device, switching can be performed without causing any hazard or duty ratio breakdown in the clock signal. Thus, even if the eighth inventive data receiving device is employed in digital transmission systems such as DVI and HDMI, in which clock signals and data signals are transmitted separately, switching between the plurality of digital signals can be reliably performed without producing any operational malfunctions. Also, if, e.g., N sets, each including the first receiving means, the second receiving means, and the signal switching means, are provided, (N−1) clock signals can be received, and any one of the received (N−1) clock signals can be selected by the respective N signal switching means.

In the above-described clock signal switching devices, clock signal switching methods, data bus switching devices, data bus switching methods, and data receiving devices in accordance with the present invention, any one of a plurality of inputted clock signals can be selected as an output clock signal, and it is possible to avoid situations in which a hazard or duty ratio breakdown occurs in the output clock signal. Thus, the inventive devices and methods are effective in, e.g., devices that perform switching of a plurality of clock signals, particularly, in, e.g., devices that employ digital transmission systems such as HDMI or DVI.

BRIEF DESCRIPTION OF THE DRAWINGS

FIG. 46A is a view illustrating the structure of a first prior art device that selects any one of a plurality of inputted analog signals in its original analog signal form. FIG. 46B is a view illustrating the structure of a second prior art device that converts any one of a plurality of inputted digital signals into an analog signal and then selects the analog signal. FIG. 46C is a view illustrating the structure of a third prior art device that selects any one of a plurality of inputted digital signals in its original digital signal form.

DESCRIPTION OF THE PREFERRED EMBODIMENTS

First Embodiment

Hereinafter, a clock signal switching device in accordance with a first embodiment of the present invention will be described with reference to the accompanying drawings.

Figure 1:
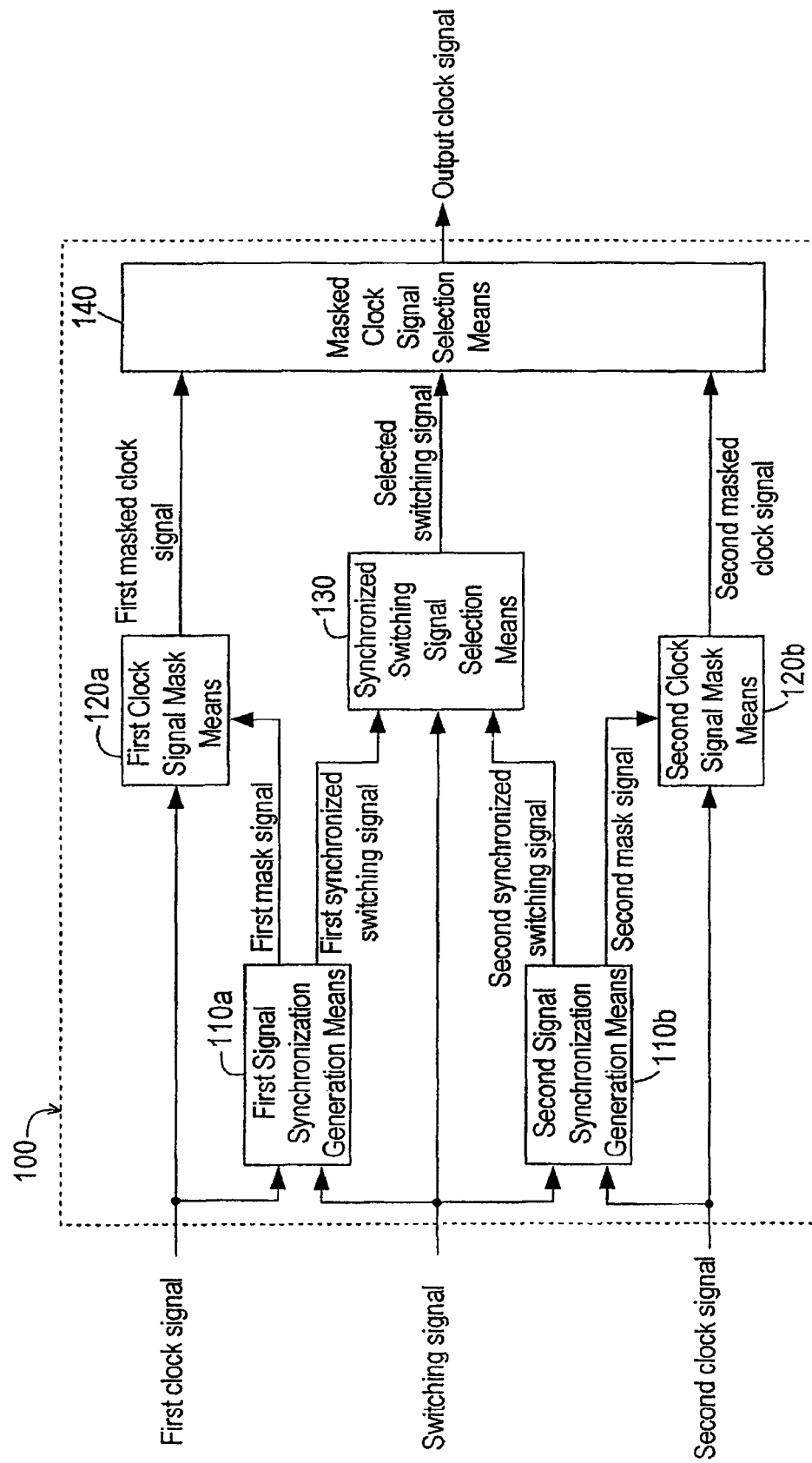
FIG. 1 is a view illustrating the structure of a clock signal switching device in accordance with a first embodiment of the present invention.

FIG. 1 is a block diagram illustrating the structure of a clock signal switching device in accordance with the first embodiment.

As shown in FIG. 1, the clock signal switching device 100 of the first embodiment is composed of a first signal synchronization generation means 110a, a second signal synchronization generation means 110b, a first clock signal mask means 120a, a second clock signal mask means 120b, a synchronized switching signal selection means 130, and a masked clock signal selection means 140.

When a first clock signal, a second clock signal, and a switching signal are inputted into the clock signal switching device 100, the clock signal switching device 100 with the above structure outputs either the first or second clock signal.

More specifically, the first signal synchronization generation means 110a generates a first mask signal and a first synchronized switching signal based on the inputted first clock signal and switching signal. The second signal synchronization generation means 110b, on the other hand, generates a second mask signal and a second synchronized switching signal based on the inputted second clock signal and switching signal. The first clock signal mask means 120a masks the first clock signal with the first mask signal generated by the first signal synchronization generation means 110a, thereby creating a first masked clock signal. The second clock signal mask means 120b masks the second clock signal with the second mask signal generated by the second signal synchronization generation means 110b, thereby producing a second masked clock signal. The synchronized switching signal selection means 130 selects either the first or second synchronized switching signal as a selected switching signal based on the inputted switching signal. The masked clock signal selection means 140 selects and outputs either the first or second masked clock signal as a selected clock signal based on the selected switching signal selected by the synchronized switching signal selection means 130.

Hereinafter, operation of a specific circuit structure that realizes the above functions, and of the structure components will be described.

Figure 2:
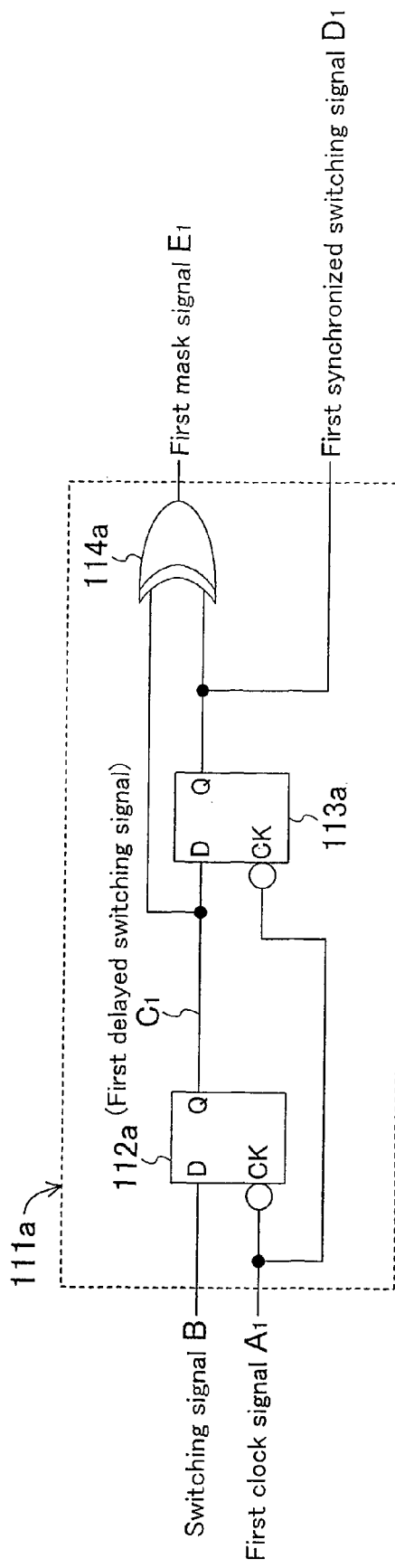
FIG. 2 is a view illustrating the structure of a first signal synchronization generation circuit that realizes functions of a first signal synchronization generation means in the clock signal switching device shown in FIG. 1.

FIG. 2 is a view illustrating a first signal synchronization generation circuit 111a realizing the functions of the first signal synchronization generation means 110a. Description of a circuit structure realizing the functions of the second signal synchronization generation means 110b will be omitted herein, because it will be the same as the description for the first signal synchronization generation means 110a.

As shown in FIG. 2, the first signal synchronization generation circuit 111a is composed of a first flip flop 112a, a second flip flop 113a, and an exclusive OR circuit 114a.

When a switching signal and a first clock signal are inputted into the first flip flop 112a, the first flip flop 112a synchronizes the switching signal to a negative edge (a falling edge) of the first clock signal, thereby outputting a first delayed switching signal. When the first delayed switching signal and the first clock signal are inputted into the second flip flop 113a, the second flip flop 113a delays the first delayed switching signal by one period of the first clock signal, thereby outputting a first synchronized switching signal. When the first delayed switching signal and the first synchronized switching signal are inputted into the exclusive OR circuit 114a, the exclusive OR circuit 114a outputs a first mask signal, which is the exclusive OR of the first delayed switching signal and the first synchronized switching signal.

Next, the waveforms of the signals transmitted in the first signal synchronization generation circuit 111a will be discussed with reference to a timing chart shown in FIG. 3.

Figure 3:
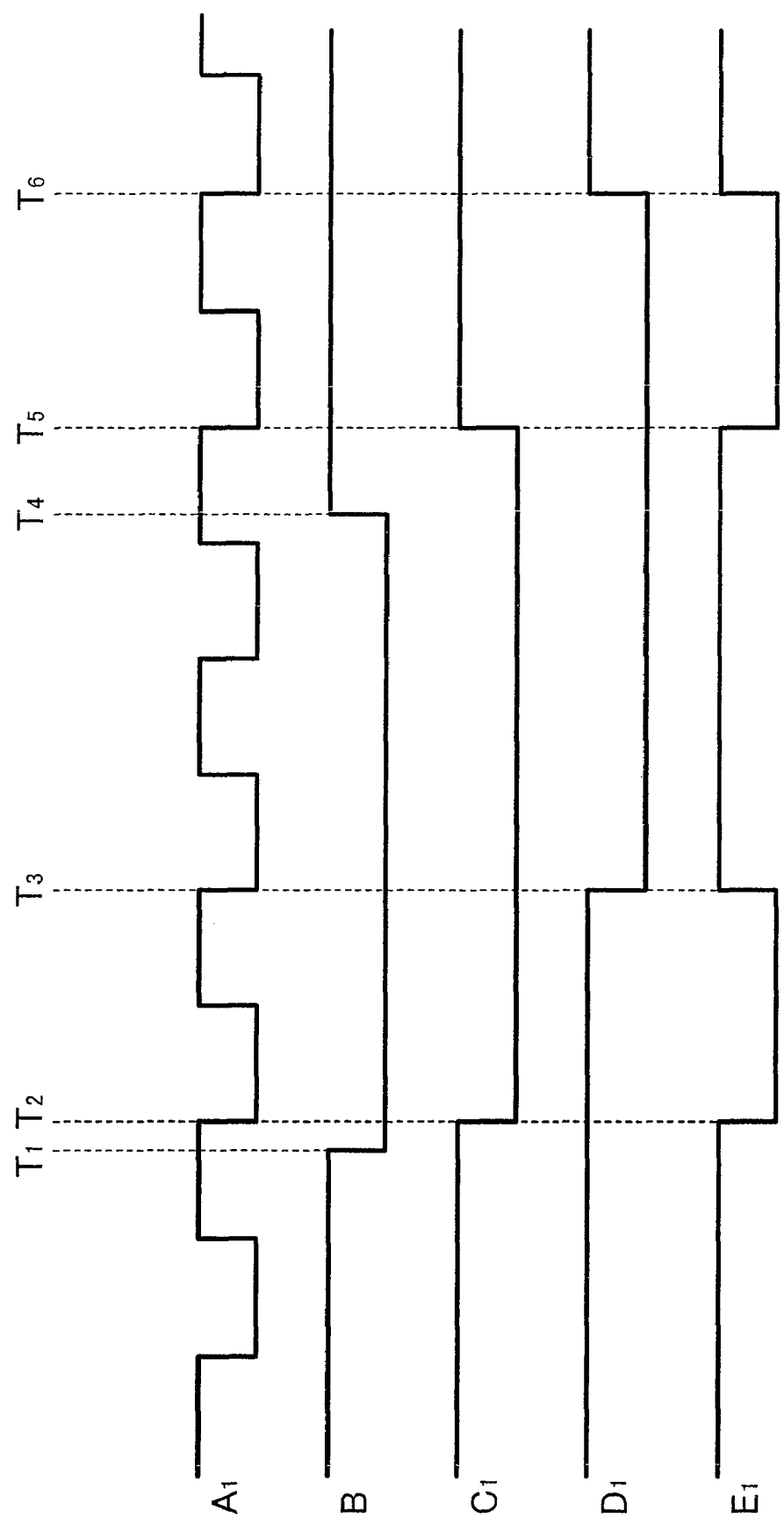
FIG. 3 is a timing chart of signals that are inputted/outputted into/from circuits composing the first signal synchronization generation circuit shown in FIG. 2.

FIG. 3 is a timing chart of the signals that are transmitted through $A_1$, $B_1$, $C_1$, $D_1$, and $E_1$ shown in FIG. 2.

As shown in FIG. 3, after the switching signal (B) changes from a high level to a low level at time $T_1$, the first delayed switching signal ($C_1$) outputted from the first flip flop 112a changes from a high level to a low level at the first negative edge (at time $T_2$) of the first clock signal ($A_1$). After the first delayed switching signal ($C_1$) changes from a high level to a low level at the time $T_2$, the first synchronized switching signal ($D_1$) outputted from the second flip flop 113a changes from a high level to a low level at time $T_3$, which is delayed behind the time $T_2$ by one period of the first clock signal ($A_1$). In other word, the first synchronized switching signal ($D_1$) is delayed behind the first delayed switching signal ($C_1$) by one period of the first clock signal ($A_1$). Since the first mask signal ($E_1$) is the exclusive OR of the first delayed switching signal ($C_1$) and the first synchronized switching signal ($D_1$), the first mask signal ($E_1$) is at a low level during the period of time from the time $T_2$ to the time $T_3$, in which the first delayed switching signal ($C_1$) and the first synchronized switching signal ($D_1$) are at the different levels. That is to say, the first mask signal ($E_1$) is at a low level during the period of time from the first negative edge (the time $T_2$) to the second negative edge (the time $T_3$) of the first clock signal ($A_1$) that occur after the switching signal (B) has changed from a high level to a low level.

On the other hand, when the switching signal (B) changes from a low level to a high level at time $T_4$, similar processes occur. More specifically, after the switching signal (B) changes from a low level to a high level at the time $T_4$, the first delayed switching signal ($C_1$) changes from a low level to a high level, while the mask signal ($E_1$) changes from a high level to a low level at the first negative edge (the time $T_5$) of the first clock signal ($A_1$) that occurs after the switching signal (B) has changed from a low level to a high level. At the second negative edge (time $T_6$) of the first clock signal ($A_1$) that occurs after the switching signal (B) has changed from a low level to a high level, the first synchronized switching signal ($D_1$) changes from a low level to a high level, and the first mask signal ($E_1$) also changes from a low level to a high level. Accordingly, the first mask signal ($E_1$) is at a low level during the period of time from the first negative edge (the time $T_5$) to the second negative edge (the time $T_6$) of the first clock signal ($A_1$) that occur after the switching signal (B) has changed from a low level to a high level. It should be noted that signals transmitted in a second signal synchronization generation circuit that realizes the functions of the second signal synchronization generation means 110b are changed in their state in the same manner as the signals transmitted in the first signal synchronization generation circuit 111a.

Figure 4:
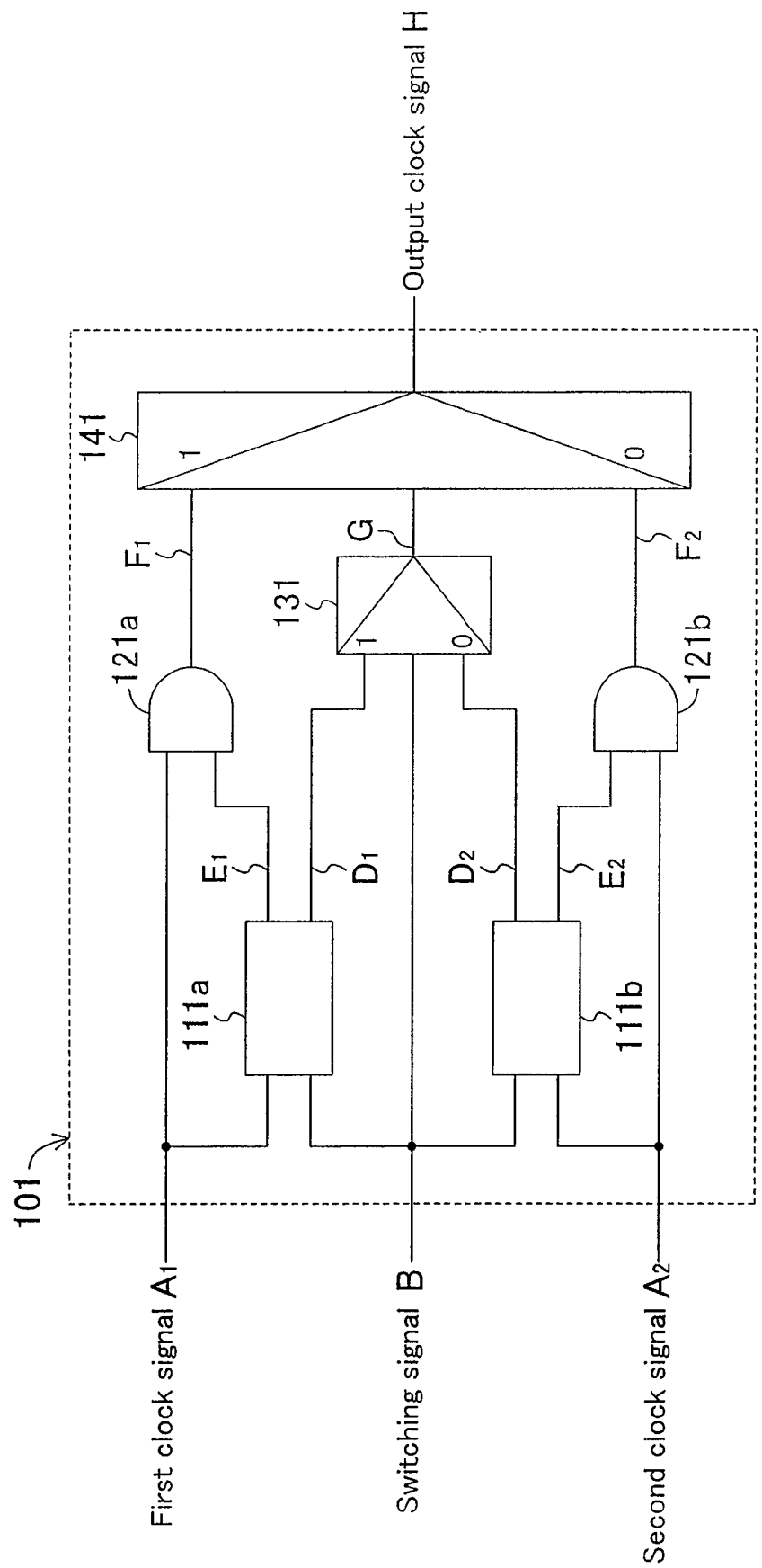
FIG. 4 is a view illustrating the structure of a clock signal switching circuit which realizes functions of the clock signal switching device illustrated in FIG. 1.

FIG. 4 is a view illustrating the structure of a clock signal switching circuit 101 which realizes the functions of the clock signal switching device 100 illustrated in FIG. 1.

As shown in FIG. 4, the clock signal switching circuit 101 is composed of a first signal synchronization generation circuit 111a illustrated in FIG. 2, a second signal synchronization generation circuit 111b having the same circuit structure as that shown in FIG. 2, a first AND circuit 121a, a second AND circuit 121b, a first multiplexer 131, and a second multiplexer 141.

When a first clock signal, and a first mask signal generated in the first signal synchronization generation circuit 111a are inputted into the first AND circuit 121a, the first AND circuit 121a creates a first masked clock signal, which is the logical product of the first mask signal and the first clock signal. On the other hand, when a second clock signal, and a second mask signal generated in the second signal synchronization generation circuit 111b are inputted into the second AND circuit 121b, the second AND circuit 121b produces a second masked clock signal, which is the logical product of the second mask signal and the second clock signal. When a switching signal, a first synchronized switching signal, and a second synchronized switching signal are inputted into the first multiplexer 131, the first multiplexer 131 selects either the first or second synchronized switching signal as a selected switching signal based on the inputted switching signal. More specifically, the first multiplexer 131 selects the first synchronized switching signal as the selected switching signal, when the switching signal is at a high level. When the switching signal is at a low level, on the other hand, the first multiplexer 131 selects the second synchronized switching signal as the selected switching signal. The second multiplexer 141, upon receiving the selected switching signal and the first and second masked clock signals, selects and outputs either the first or second masked clock signal as an output clock signal based on the selected switching signal. More specifically, the second multiplexer 141 selects the first masked clock signal, when the selected switching signal is at a high level. When the selected switching signal is at a low level, on the other hand, the second multiplexer 141 selects the second masked clock signal.

Next, the waveforms of the signals transmitted in the clock signal switching circuit 101 will be described with reference to a timing chart shown in FIG. 5.

Figure 5:
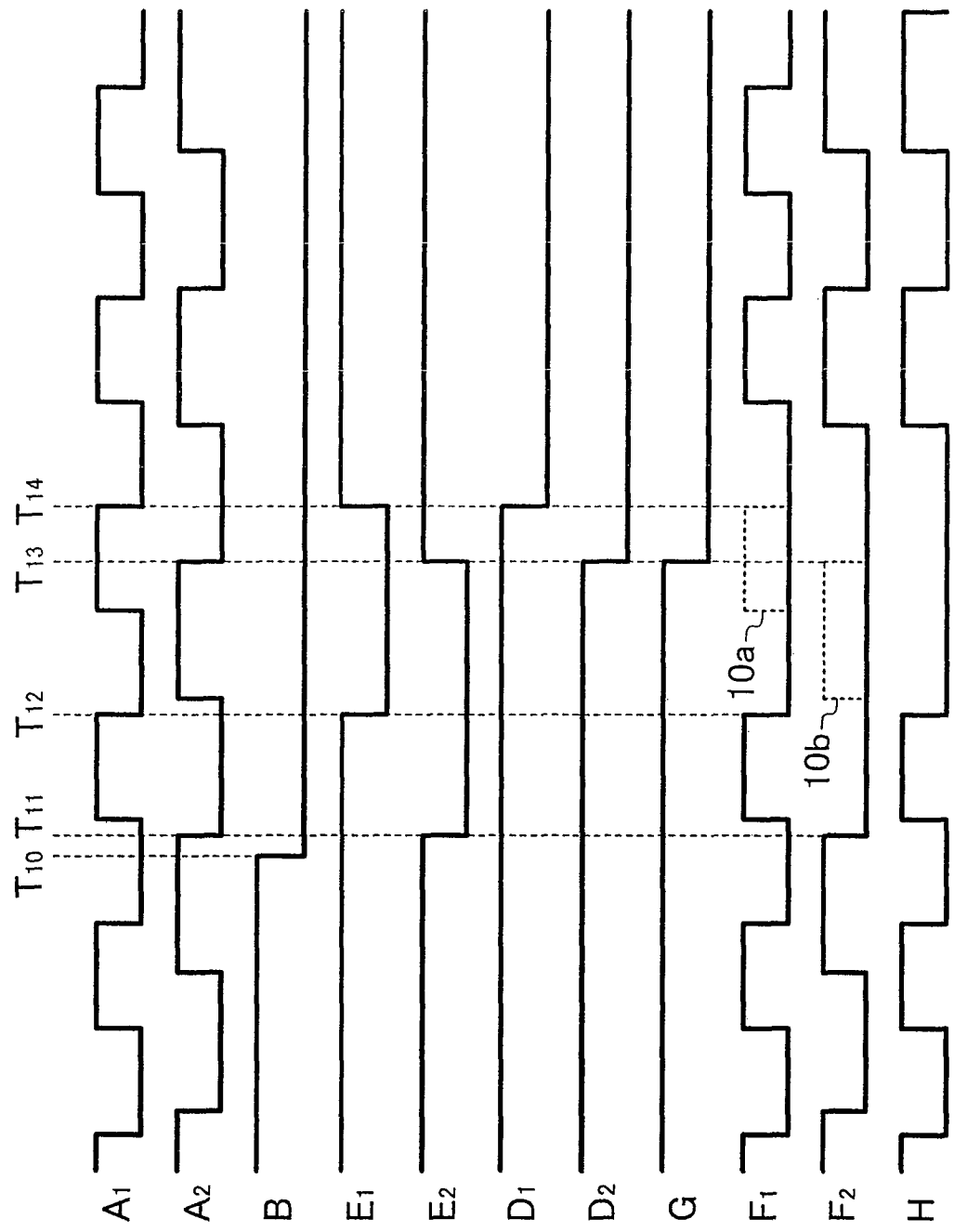
FIG. 5 is a timing chart of signals transmitted when a selected clock signal is switched from a first clock signal to a second clock signal in the clock signal switching circuit shown in FIG. 4.

FIG. 5 is a timing chart of the signals in a case where the output clock signal outputted from the clock signal switching circuit 101 is switched from the first clock signal to the second clock signal. Alphabetical letters $A_1$, $A_2$, B, $D_1$, $D_2$, $E_1$, $E_2$, $F_1$, $F_2$, G, and H shown in FIG. 5 correspond to those shown in FIG. 4.

As shown in FIG. 5, before the switching signal (B) changes from a high level to a low level at time $T_{10}$, the first synchronized switching signal ($D_1$) has been selected as the selected switching signal (G) in the first multiplexer 131, because the switching signal (B) has been at a high level. After the time $T_{10}$ when the switching signal (B) changes from a high level to a low level, the second synchronized switching signal ($D_2$) is selected as the selected switching signal (G) in the first multiplexer 131, because the switching signal (B) is at a low level. Consequently, at time $T_{13}$ when the second synchronized switching signal ($D_2$) changes from a high level to a low level, the selected switching signal (G) also changes from a high level to a low level. In other words, the selected switching signal (G) has the same waveform as that of the second synchronized switching signal ($D_2$). This means that the second synchronized switching signal ($D_2$) has been selected as the selected switching signal in the first multiplexer 131 shown in FIG. 4.

Furthermore, as has been explained with reference to FIG. 3, after the switching signal (B) changes from a high level to a low level at the time $T_{10}$, the first mask signal ($E_1$) changes from a high level to a low level at the first negative edge (the time $T_{12}$) of the first clock signal ($A_1$) that occurs after the switching signal (B) has changed, and the first mask signal ($E_1$) changes from a low level to a high level at the second negative edge (the time $T_{14}$) of the first clock signal ($A_1$). Likewise, the second mask signal ($E_2$) changes from a high level to a low level at the first negative edge (the time $T_{11}$) of the second clock signal ($A_2$) that occurs after the switching signal (B) has changed from a high level to a low level, and the second mask signal ($E_2$) changes from a low level to a high level at the second negative edge (the time $T_{13}$) of the second clock signal ($A_2$).

Since the first masked clock signal ($F_1$) is the logical product of the first clock signal ($A_1$) and the first mask signal ($E_1$), the first masked clock signal ($F_1$) is at a low level during the period of time (from the time $T_{12}$ to the time $T_{14}$) in which the first mask signal ($E_1$) is at a low level. Therefore, except for that period of time (from the time $T_{12}$ to the time $T_{14}$) in which the first mask signal ($E_1$) is at a low level, the waveform of the first masked clock signal ($F_1$) is the same as that of the first clock signal ($A_1$). That is to say, the first masked clock signal ($F_1$) has a waveform that is equal to the waveform of the first clock signal ($A_1$) from which a waveform 10a is removed. Similarly, since the second masked clock signal ($F_2$) is the logical product of the second clock signal ($A_2$) and the second mask signal ($E_2$), the second masked clock signal ($F_2$) is at a low level during the period of time (from the time $T_1$ to the time $T_{13}$) in which the second mask signal ($E_2$) is at a low level Therefore, except for that period of time (from the time $T_{11}$ to the time $T_{13}$) in which the second mask signal ($E_2$) is at a low level, the waveform of the second masked clock signal ($F_2$) is the same as that of the second clock signal ($A_2$). That is to say, the second masked clock signal ($F_2$) has a waveform that is equal to the waveform of the second clock signal ($A_2$) from which a waveform 10b is removed.

Furthermore, in the second multiplexer 141 illustrated in FIG. 4, before the time $T_{13}$ when the selected switching signal (G) changes from a high level to a low level, the first masked clock signal ($F_1$) is selected as the output clock signal (H). After the time $T_{13}$, on the other hand, the second masked clock signal ($F_2$) is selected as the output clock signal (H). The output clock signal (H) outputted from the second multiplexer 141 is at a low level during the period of time from the negative edge (the time $T_{12}$) of the first mask signal ($E_1$) that masks the first clock signal ($A_1$), which the signal to be replaced, to the positive edge (the time $T_{13}$) of the second mask signal ($E_2$) that masks the second clock signal ($A_2$), which is the signal to next be selected.

Figure 6:
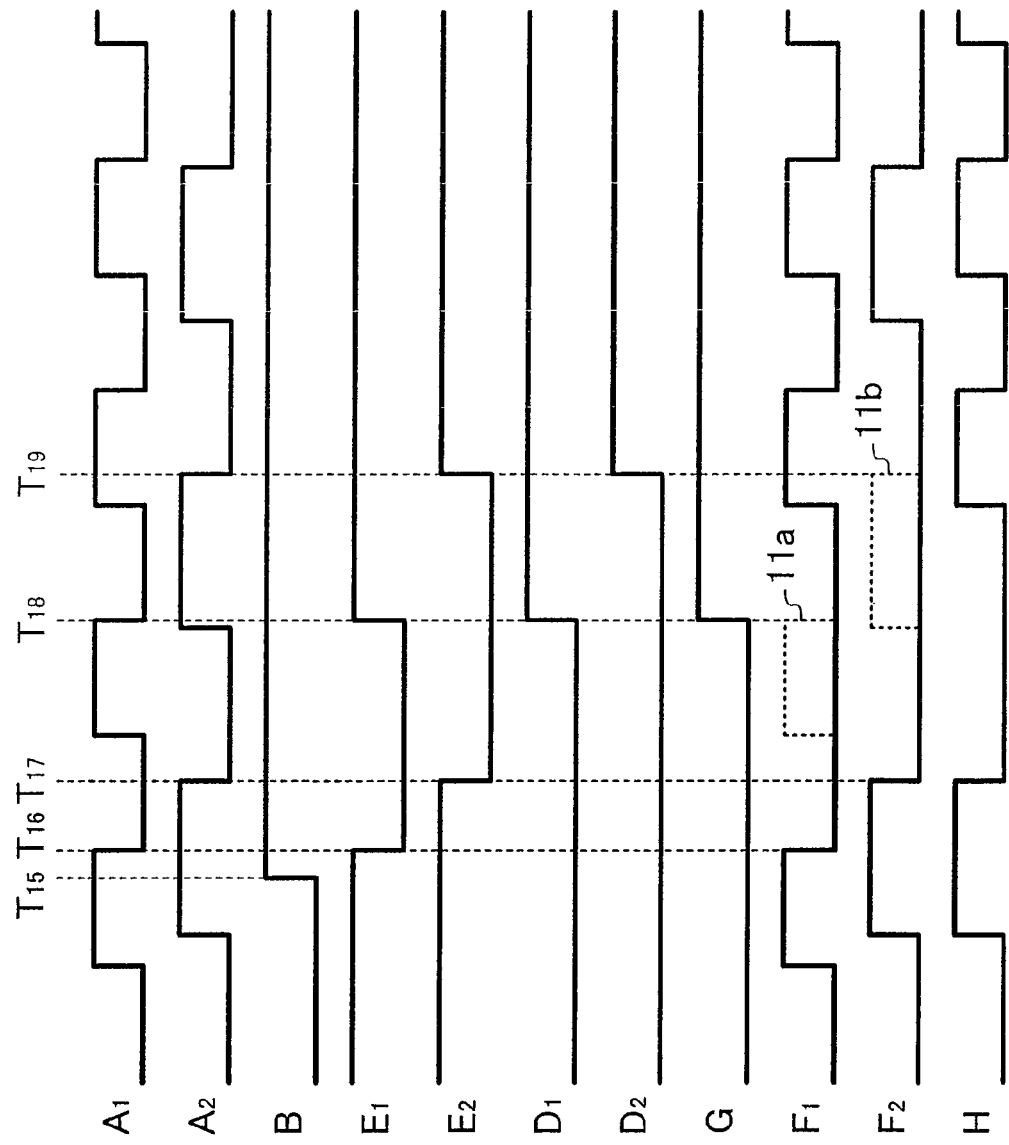
FIG. 6 is a timing chart of signals transmitted when the selected clock signal is switched from the second clock signal to the first clock signal in the clock signal switching circuit shown in FIG. 4.

FIG. 6 is a timing chart of the signals in a case where the output clock signal outputted from the clock signal switching circuit 101 is switched from the second clock signal to the first clock signal. Alphabetical letters $A_1, A_2, B, D_1, D_2, E_1, E_2, F_1, F_2, G$, and H shown in FIG. 6 correspond to the respective points shown in FIG. 4.

As shown in FIG. 6, before the switching signal (B) changes from a low level to a high level at time $T_{15}$, the second synchronized switching signal ($D_2$) has been selected as the selected switching signal (G) in the first multiplexer 131, because the switching signal (B) has been at a low level. On the other hand, after the time $T_{15}$ when the switching signal (B) changes from a low level to a high level, the first synchronized switching signal ($D_1$) is selected as the selected switching signal (G) in the first multiplexer 131, because the switching signal (B) is at a high level. Thus, at the time $T_{18}$ when the first synchronized switching signal ($D_1$) changes from a low level to a high level, the selected switching signal (G) also changes from a low level to a high level. In other words, the selected switching signal (G) has the same waveform as that of the first synchronized switching signal ($D_1$). This means that the first synchronized switching signal ($D_1$) has been selected in the first multiplexer 131 shown in FIG. 4.

Furthermore, as has been explained with reference to FIG. 5, after the switching signal (B) changes from a low level to a high level at the time $T_{15}$, the first mask signal ($E_1$) changes from a high level to a low level at the first negative edge (the time $T_{16}$) of the first clock signal ($A_1$) that occurs after the switching signal (B) has changed, and the first mask signal ($E_1$) changes from a low level to a high level at the second negative edge (the time $T_{18}$) of the first clock signal ($A_1$). Likewise, the second mask signal ($E_2$) changes from a high level to a low level at the first negative edge (the time $T_{17}$) of the second clock signal ($A_2$) that occurs after the switching signal (B) has changed from a low level to a high level, and the second mask signal ($E_2$) changes from a low level to a high level at the second negative edge (the time $T_{19}$) of the second clock signal ($A_2$).

Since the first masked clock signal $F_1$ is the logical product of the first clock signal ($A_1$) and the first mask signal ($E_1$), the first masked clock signal ($F_1$) is at a low level during the period of time (from the time $T_{16}$ to the time $T_{18}$) in which the first mask signal ($E_1$) is at a low level. Therefore, except for that period of time (from the time $T_{16}$ to the time $T_{18}$) in which the first mask signal ($E_1$) is at a low level, the waveform of the first masked clock signal ($F_1$) is the same as that of the first clock signal ($A_1$). That is to say, the first masked clock signal ($F_1$) has a waveform that is equal to the waveform of the first clock signal ($A_1$) from which a waveform 11a is removed. Similarly, since the second masked clock signal ($F_2$) is the logical product of the second clock signal ($A_2$) and the second mask signal ($E_2$), the second masked clock signal ($F_2$) is at a low level during the period of time (from the time $T_{17}$ to the time $T_{19}$) in which the second mask signal ($E_2$) is at a low level. Therefore, except for that period of time (from the time $T_{17}$ to the time $T_{19}$) in which the second mask signal ($E_2$) is at a low level, the waveform of the second masked clock signal ($F_2$) is the same as that of the second clock signal ($A_2$). That is to say, the second masked clock signal ($F_2$) has a waveform that is equal to the waveform of the second clock signal ($A_2$) from which a waveform 11b is removed.

Furthermore, in the second multiplexer 141 illustrated in FIG. 4, before the time $T_{18}$ when the selected switching signal (G) changes from a low level to a high level, the second masked clock signal ($F_2$) is selected as the output clock signal (H). After the time $T_{18}$, on the other hand, the first masked clock signal ($F_1$) is selected as the output clock signal (H). The output clock signal (H) outputted from the second multiplexer 141 is at a low level during the period of time from the negative edge (the time $T_{17}$) of the second mask signal ($E_2$) that masks the second clock signal ($A_2$), which the signal to be replaced, to the positive edge (the time $T_{18}$) of the first mask signal ($E_1$) that masks the first clock signal ($A_1$), which is the signal to next be selected.

Described in the foregoing is a case where the functions of the clock signal switching device 100 shown in FIG. 1 are specifically realized using only the hardware (i.e., the clock signal switching circuit 101) illustrated in FIG. 4. Nevertheless, those functions illustrated in FIG. 4 can be realized by software, for example.

Hereinafter, it will be described how to switch clock signals using software.

Figure 7:
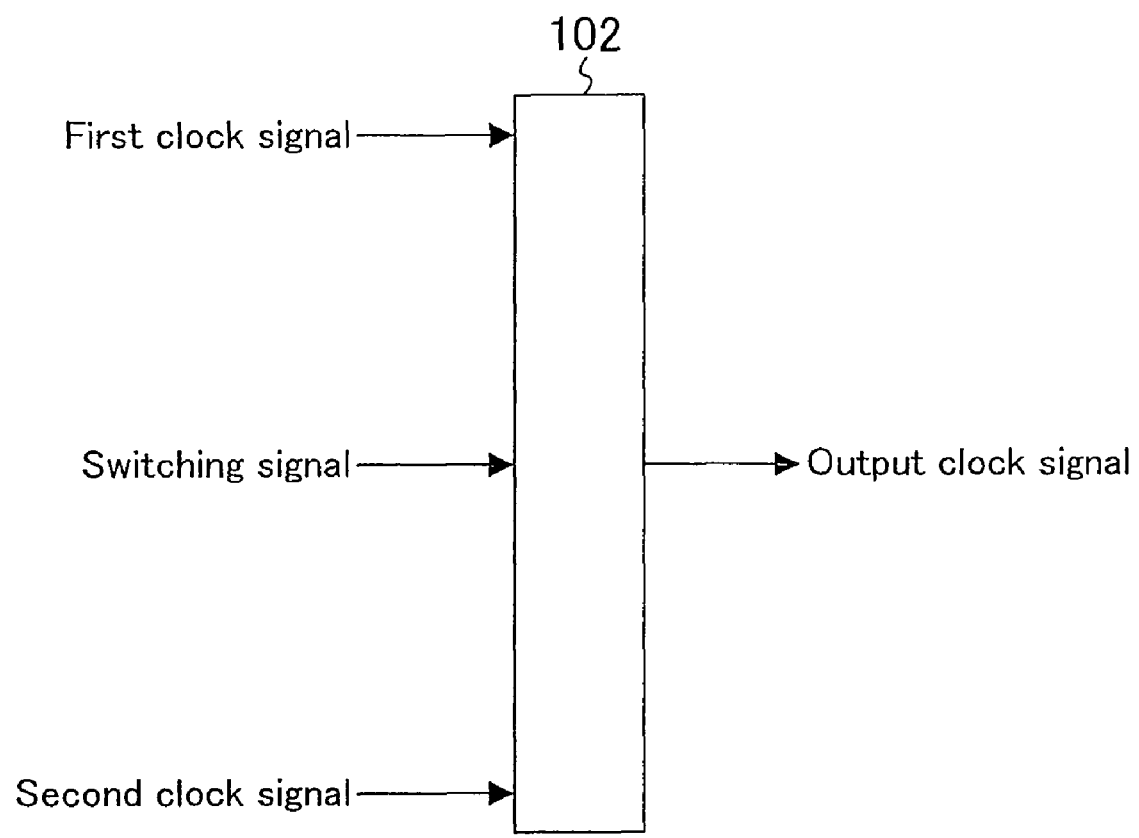
FIG. 7 is a view illustrating hardware that performs clock signal switching in clock signal switching methods in accordance with the first and fifth embodiments of the present invention.

FIG. 7 is a schematic view illustrating a clock signal switching program for realizing the clock signal switching method of the first embodiment by software.

As shown in FIG. 7, when a switching signal, a first clock signal, and a second clock signal are inputted into a clock signal switching program 102, the clock signal switching program 102 outputs either the first or second clock signal as an output clock signal based on the inputted switching signal. The specific structure of the clock signal switching program 102 is the same as that of the clock signal switching device shown in FIG. 1, for example.

More specifically, the clock signal switching program 102 has subprograms that correspond to the first signal synchronization generation means 110a, the second signal synchronization generation means 110b, the first clock signal mask means 120a, the second clock signal mask means 120b, the synchronized switching signal selection means 130, and the masked clock signal selection means 140, respectively, shown in FIG. 1.

Figure 8:
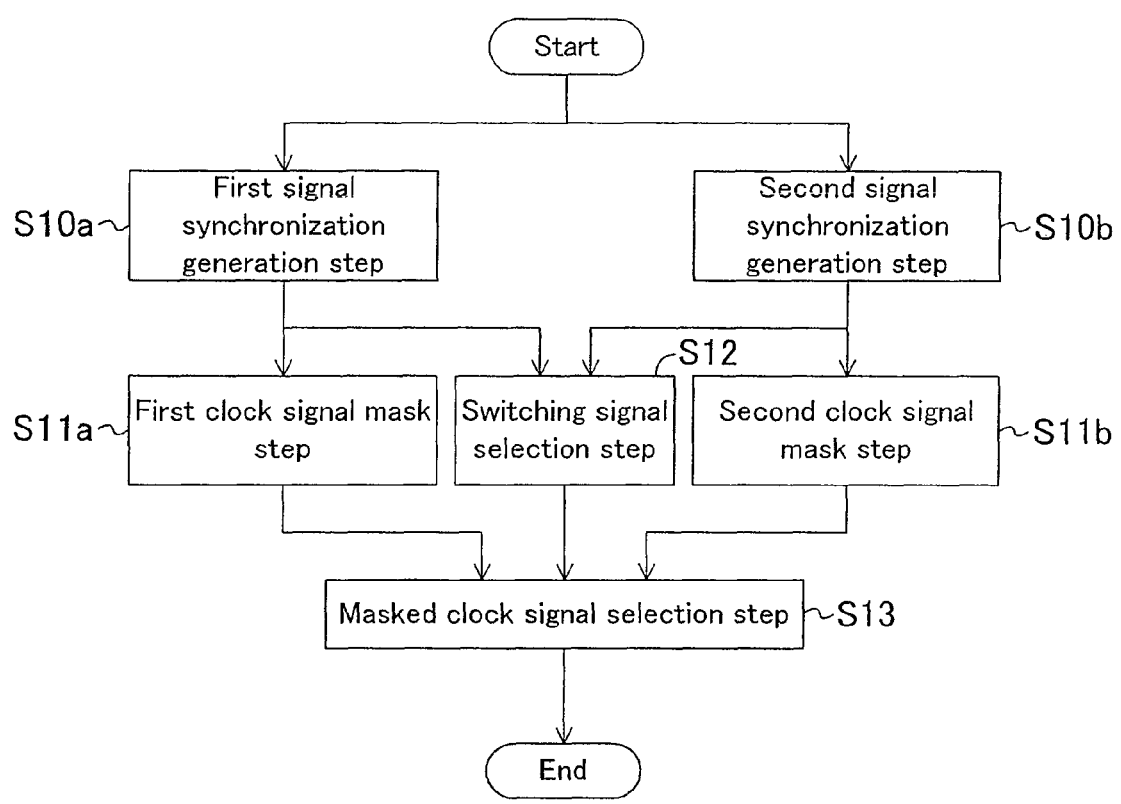
FIG. 8 indicates process steps in the clock signal switching method in accordance with the first embodiment of the present invention.

FIG. 8 indicates clock signal switching process steps performed by the clock signal switching program 102 of FIG. 7.

As shown in FIG. 8, first, in a first signal synchronization generation step S10a, which is performed by a subprogram that corresponds to the first signal synchronization generation means 110a, a first mask signal and a first synchronized switching signal, which are each synchronous to the first clock signal, are generated based on the inputted first clock signal and switching signal. More specifically, generated is the first mask signal that is at a low level only during the period of time from the first negative edge of the first clock signal to the second negative edge thereof that occur after the switching signal changes from a low level to a high level or from a high level to a low level. Furthermore, the first synchronized switching signal created is synchronized to the second negative edge of the first clock signal that occurs after the switching signal changes from a low level to a high level or from a high level to a low level. Likewise, in a second signal synchronization generation step S10*b*, which is performed by a subprogram that corresponds to the second signal synchronization generation means 110*b*, a second mask signal and a second synchronized switching signal, which are each synchronous to the second clock signal, are generated based on the inputted second clock signal and switching signal.

Next, in a first clock signal mask step S11*a*, which is performed by a subprogram that corresponds to the first clock signal mask means 120*a*, a first masked clock signal is produced by masking the first clock signal with the first mask signal generated in the first signal synchronization generation step S10*a*. More specifically, the first masked clock signal is generated by setting the first clock signal at a low level during the period of time in which the first mask signal is at a low level. In this manner, the first masked clock signal is generated by masking the first clock signal with the first mask signal. In a second clock signal mask step S11*b*, which is performed by a subprogram that corresponds to the second clock signal mask means 120*b*, the same process is carried out.

Subsequently, in a switching signal selection step S12, which is performed by a subprogram that corresponds to the switching signal selection means 130, either the first synchronized switching signal generated in the first signal synchronization generation step S10*a* or the second synchronized switching signal produced in the second signal synchronization generation step S10*b* is selected as a selected switching signal based on the inputted switching signal.

Then, in a masked clock signal selection step S13, which is performed by a subprogram that corresponds to the masked clock signal selection means 140, either the first masked clock signal created in the first clock signal mask step S11*a* or the second masked clock signal generated in the second clock signal mask step S11*b* is selected and outputted as an output clock signal based on the selected switching signal selected in the switching signal selection step S12.

As described above, in the clock signal switching device of the first embodiment, the first signal synchronization generation means 110*a* generates the first mask signal that is synchronous with the first clock signal. Therefore, the first clock signal mask means 120*a* can mask the first clock signal with the first mask signal, whereby the first masked clock signal can be generated by setting the first clock signal at a low level during the period of time, e.g., from the first negative edge of the first clock signal to the second negative edge thereof that occur after the switching signal changes. On the other hand, the second signal synchronization generation means 110*b* can also generate the second mask signal that is synchronous to the second clock signal. Therefore, the second masked clock signal can be generated by setting the second clock signal at a low level during the period of time from the first negative edge of the second clock signal to the second negative edge thereof that occur after the switching signal changes. This means that part of the clock signals in which a hazard or duty ratio breakdown might occur can be removed (masked) before the masked clock signal selection means 140 selects one of the clock signals. This thus prevents beforehand occurrence of a hazard or duty ratio breakdown caused by the clock signal switching.

Moreover, in the first embodiment, from the first synchronized switching signal synchronous to the positive edge of the first mask signal and the second synchronized switching signal synchronous to the positive edge of the second mask signal, one corresponding to the clock signal to next be selected can be selected by the synchronized switching signal selection means. Therefore, it is possible to generate the output clock signal that is masked only during the period of time, e.g., from the negative edge of the mask signal masking the clock signal to be replaced, to the positive edge of the mask signal masking the clock signal to next be selected. In other words, since the clock signal to be replaced and the clock signal to next be selected can be masked accurately, it is possible to remove respective part of the first and second clock signals, in which a hazard or duty ratio breakdown might occur, before the clock signal switching is performed. Therefore, any hazard or duty ratio breakdown occurring due to the clock signal switching can be prevented in advance.

In the first embodiment, the fact that the first and second clock signals are synchronous and in phase with each other does not affect the hazard or duty ratio breakdown prevention. Therefore, the output clock signal can be switched between clock signals that are asynchronous and out of phase with each other, without producing any hazard and duty ratio breakdown.

In addition, in the first embodiment, if the clock signal to next be selected has been inputted at the time of the clock signal switching, the clock signal switching can be performed regardless of the status of the clock signal to be replaced. Thus, it is possible to avoid a problem with some conventional devices in that the clock signal switching may fail depending upon the status of the to-be-replaced clock signal.

Moreover, in the clock signal switching method of the first embodiment, the same waveforms as those of the signals generated by the clock signal switching circuit 101 can also be created by software. This eliminates the need for particularly incorporating a circuit for clock signal switching, which results in a reduction in the circuit size. The inventive clock signal switching method is particularly effective in systems that have already incorporated, for example, a microcomputer such as an external timing control circuit to realize functions other than a clock signal switching circuit. In this case, those systems can perform clock signal switching by using the existing microcomputer without incorporating a new microcomputer, thereby achieving a further reduction in the circuit size.

It should be noted that in the clock signal switching device of the first embodiment, an exemplary circuit structure that realizes the functions of the clock signal switching device 100 is the clock signal switching circuit 101, but those functions may be realized by other circuit structures.

Modified Example of the First Embodiment

Hereinafter, a clock signal switching device in accordance with a modified example of the first embodiment of the present invention will be described with reference to the accompanying drawings.

Figure 9:
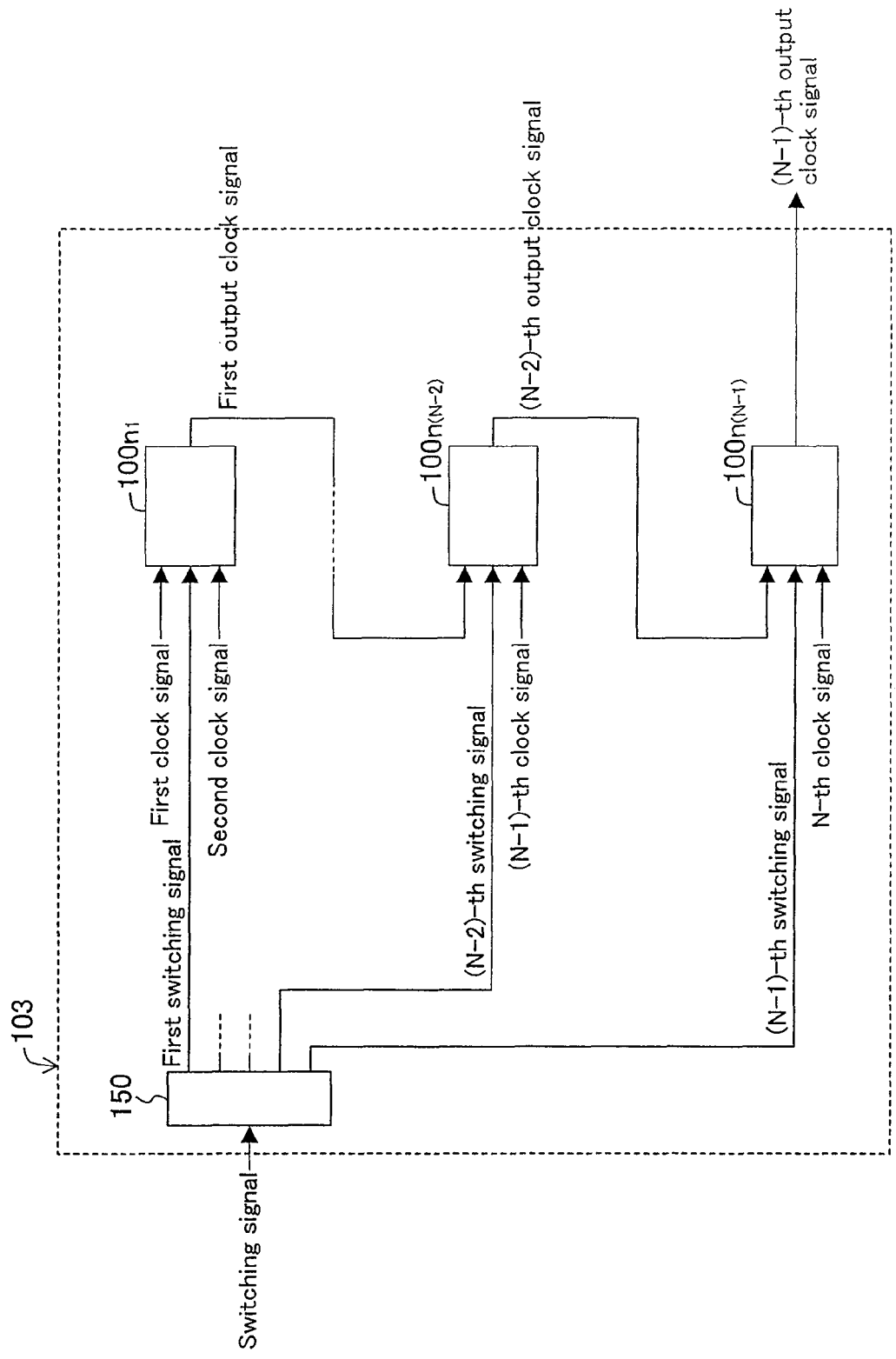
FIG. 9 is a view illustrating the structure of a clock signal switching device in accordance with a modified example of the first embodiment of the present invention.

FIG. 9 is a view illustrating the structure of the clock signal switching device in accordance with the modified example of the first embodiment.

As shown in FIG. 9, the clock signal switching device 103 of this modified example is characterized in that any one of N inputted clock signals (wherein N is an integer equal to or greater than two) can be selected as an output clock signal.

More specifically, the clock signal switching device 103 is composed of a switching signal decode means 150 and first through (N−1)-th clock signal selection means $100n_1$ through $100n_{(N-1)}$. The switching signal decode means 150 decodes an inputted switching signal to output switching signals (first through (N−1)-th switching signals) that correspond to the respective first through (N−1)-th clock signal selection means $100n_1$ through $100n_{(N-1)}$. Each clock signal selection means, e.g., the first clock signal selection means $100n_1$, selects either inputted first or second clock signal based on the inputted first switching signal (decoded signal), and then outputs the selected clock signal as a first output clock signal. The second clock signal selection means $100n_2$ (not shown) selects as a second output clock signal either the first output clock signal outputted from the first clock signal selection means $100n_1$ or a third clock signal, based on the inputted second switching signal.

Next, the specific structure of each clock signal selection means will be described with reference to FIG. 10.

Figure 10:
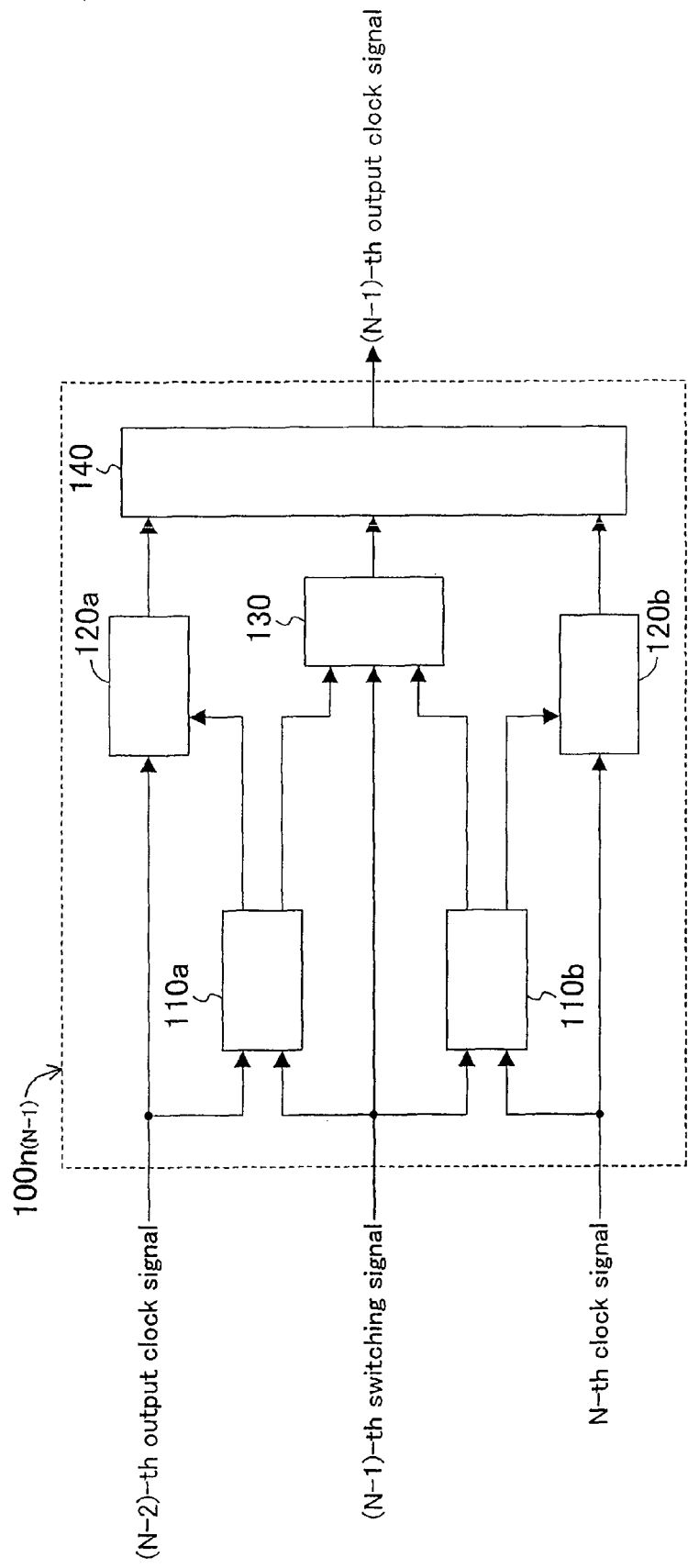
FIG. 10 is a view illustrating the structure of an N-th clock signal selection means included in the clock signal switching device shown in FIG. 9.

FIG. 10 is a view illustrating the structure of the (N−1)-th clock signal selection means $100n_{(N-1)}$ of the first through (N−1)-th clock signal selection means $100n_1$ through $100n_{(N-1)}$ shown in FIG. 9, wherein the number of the first through (N−1)-th clock signal selection means $100n_1$ through $100n_{(N-1)}$ provided is (N−1). In FIG. 10, the same members as those of the clock signal switching device 100 of FIG. 1 are identified by the same reference numerals.

As shown in FIG. 10, the (N−1)-th clock signal selection means $100n_{(N-1)}$ has, for example, the same structure as that of the clock signal switching device 100 of FIG. 1. More specifically, the (N−1)-th clock signal selection means $100n_{(N-1)}$ is composed of a first signal synchronization generation means 110a, a second signal synchronization generation means 110b, a first clock signal mask means 120a, a second clock signal mask means 120b, a synchronized switching signal selection means 130, and a masked clock signal selection means 140. However, inputted into the (N−1)-th clock signal selection means $100n_{(N-1)}$ are an (N−2)-th output clock signal outputted from the (N−2)-th clock signal selection means $100n_{(N-2)}$, an (N−1)-th switching signal decoded by the switching signal decode means 150, and an N-th clock signal. Like the clock signal switching device 100 of the first embodiment described with reference to FIG. 1, the (N−1)-th clock signal selection means $100n_{(N-1)}$ selects either the (N−2)-th output clock signal or the N-th clock signal based on the inputted (N−1)-th switching signal, and also outputs the selected clock signal as an (N−1)-th output clock signal.

Next, it will be described how a clock signal selection means having the same structure as that of the (N−1)-th clock signal selection means $100n_{(N-1)}$ of FIG. 10 operates.

Switchover from the First Clock Signal to the Second Clock Signal

EXAMPLE 1

Prior to describing operation performed in switchover from the first clock signal to the second clock signal, the state in which the first clock signal is being outputted as the output clock signal will be discussed. The fact that the first clock signal is being selected as the output clock signal means that the first clock signal is the (N−1)-th output clock signal that is finally outputted from the (N−1)-th clock signal selection means $100n_{(N-1)}$. That is to say, the first clock signal has always been selected in all of the first through (N−1)-th clock signal selection means $100n_1$ through $100n_{(N-1)}$. To obtain this state, the flowing conditions have to be satisfied; the first clock signal selection means $100n_1$ selects the first clock signal, while the other clock signal selection means select the output clock signal of their respective previous clock signal selection means.

Those conditions can be satisfied, if all of the switching signals inputted into the respective clock signal selection means are set to a high level. For instance, if the first switching signal, which is always at a high level, is inputted into the first clock signal selection means $100n_1$, the first mask signal and the first synchronized switching signal both outputted from the first signal synchronization generation means 110a also have a waveform that is always at a high level, like the first switching signal does. Therefore, the first masked clock signal, which is generated as a result of masking of the first clock signal with the first mask signal performed by the first clock signal mask means 120a, has the same waveform as that of the first clock signal. In addition, the always-high-level first switching signal makes the synchronized switching signal selection means 130 select the first synchronized switching signal. Consequently, the first synchronized switching signal is always at a high level. The masked clock signal selection means 140 thus always selects the first masked clock signal (the first clock signal.) Accordingly, if the inputted first switching signal is always at a high level, the first clock signal is outputted as it is as the first output clock signal. As a whole, if all of the first through (N−1)-th switching signals are always at a high level, the finally outputted (N−1)-th output clock signal is the same as the first output clock signal.

Subsequently, operation performed in switchover from the first clock signal to the second clock signal will be described. To perform such switching operation, the first switching signal inputted into the first clock signal selection means $100n_1$ is changed from a high level to a low level. Then, the first output clock signal outputted from the first clock signal selection means $100n_1$ is switched from the first clock signal to the second clock signal. Furthermore, if the second through (N−1)-th switching signals inputted into the respective second through (N−1)-th clock signal selection means $100n_2$ through $100n_{(N-1)}$ are each kept constant at a high level, the second output clock signal outputted from the first clock signal selection means $100n_1$ is finally outputted as the (N−1)-th output clock signal from the (N−1)-th clock signal selection means $100n_{(N-1)}$. In this manner, the clock signal outputted from the clock signal switching device 103 can be switched from the first clock signal to the second clock signal.

Switchover from the First Clock Signal to the N-th Clock Signal

EXAMPLE 2

As has been already explained, since the first clock signal has been selected before the switching operation, the first through (N−1)-th switching signals inputted into the respective first through (N−1)-th clock signal selection means $100n_1$ through $100n_{(N-1)}$ are always kept at a high level.

Then, to replace the first clock signal with the N-th clock signal, the (N−1)-th switching signal inputted into the (N−1)-th clock signal selection means $100n_{(N-1)}$ is changed from a high level to a low level.

Switchover from the N-th Clock Signal to the First Clock Signal

EXAMPLE 3

In this case, the N-th clock signal has been selected before the switching operation, such that the (N−1)-th switching signal is kept at a low level. However, each of the first to (N−2)-th switching signals inputted into the respective first through (N−2)-th clock signal selection means $100n_1$ through $100n_{(N-2)}$ may be at a high level or a low level. More specifically, what is required is that the N-th clock signal is selected by the (N−1)-th clock signal selection means $100n_{(N-1)}$, so the (N−2)-th output clock signal inputted into the (N−1)-th clock signal selection means $100n_{(N-1)}$ may be a clock signal either at a high or low level.

Next, to replace the N-th clock signal with the first clock signal, the first through (N−1)-th switching signals inputted into the respective first through (N−1)-th clock signal selection means $100n_1$ through $100n_{(N-1)}$ are all set at a high level. In other words, among the first through (N−1)-th switching signals, those signals that have already been at a high level are kept at that level, and those signals that have been at a low level are changed to a high level.

As described above, in order to perform switching from a p-th clock signal to a q-th clock signal (wherein $1<p<q\leq N$), the p-th through (q−2)-th switching signals and the q-th through (N−1)-th switching signals are maintained as they are at a high level, while the (q−1)-th switching signal is changed from a high level to a low level. However, the first through (p−2)-th switching signals, and the (p−1)-th through (p−2)-th switching signals after the switching operation may be either at a high level or a low level. On the other hand, in order to perform switching from the q-th clock signal to the p-th clock signal, the (p−1)-th switching signal is set to a low level (the (p−1)-th switching signal may have already been at a low level at the time of the switching), and the p-th through (q−1)-th switching signals are set at a high level (the p-th through (q−1)-th switching signals may have already been at a high level at the time of the switching), while the q-th through (N−1)-th switching signals are kept at a high level. Nevertheless, the first through (p−2)-th switching signals, and the (p−1)-th through (p−2)-th switching signals before the switching operation may be either at a high level or a low level. In the case where the p=1, the process already mentioned is carried out.

As described above, in the modified example of the first embodiment, two or more structures, each of which is the same as the (N−1)-th clock signal selection means $100n_{(N-1)}$ illustrated in FIG. 10, that is, two or more clock signal switching devices 100 of the first embodiment illustrated in FIG. 1, are provided. Thus, even if three or more clock signals have been inputted, switching from one to another among those clock signals can be performed. Moreover, each of the clock signal selection means $100n_1$ through $100n_{(N-1)}$ forming the clock signal switching device 103 is the same as the clock signal switching device 100 of the first embodiment. Therefore, even in cases of switching from one to another among three or more clock signals, the effects obtainable in the first embodiment can be reliably attained in each clock signal selection means.

It should be noted that in the modified example of the first embodiment, a circuit structure that realizes the functions of each clock signal selection means included in the clock signal switching device 103 may be the clock signal switching circuit 101 illustrated in FIG. 4, for example.

Second Embodiment

Hereinafter, a data bus switching device in accordance with a second embodiment of the present invention will be described with reference to the accompanying drawings.

Figure 11:
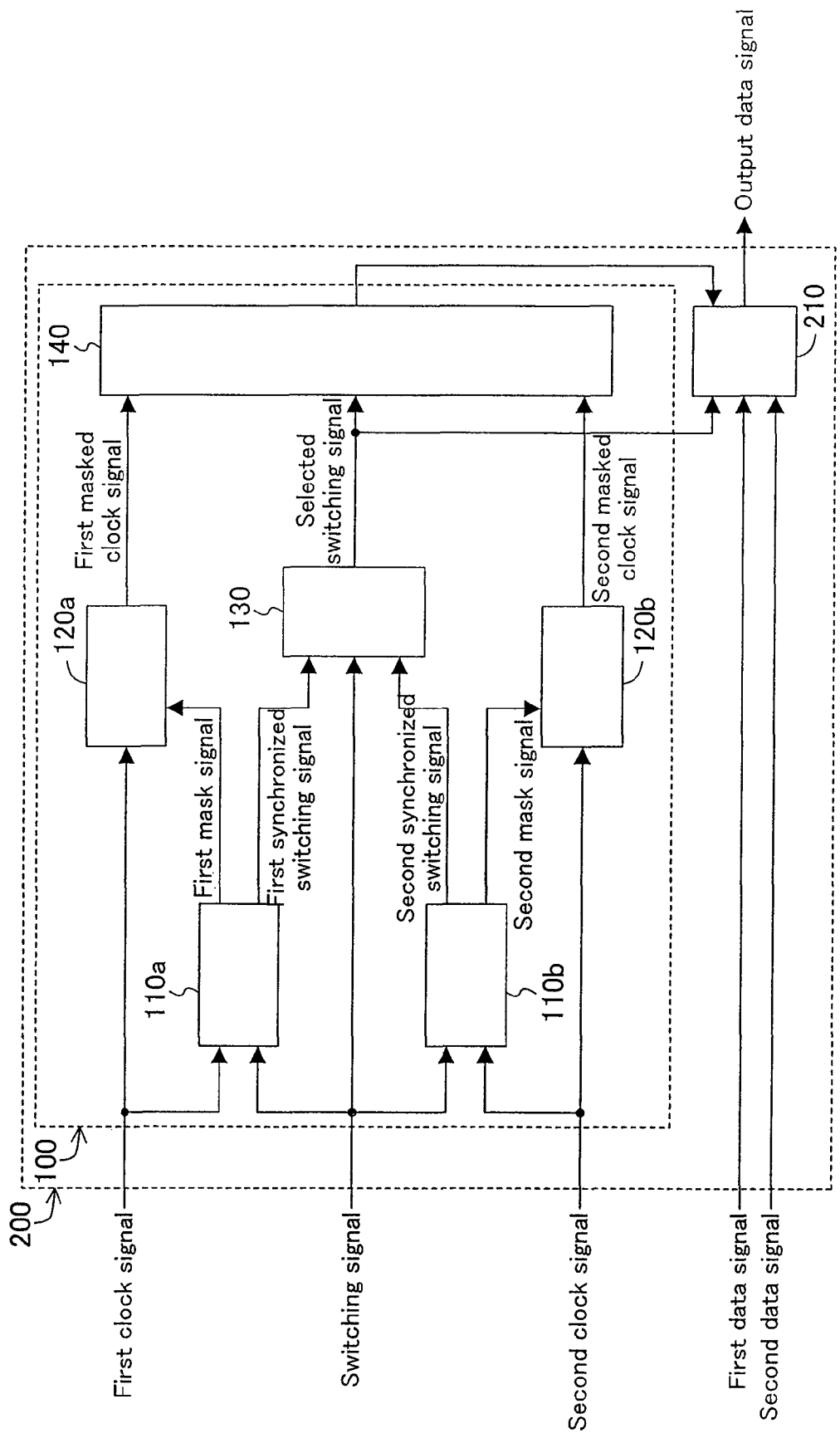
FIG. 11 is a view illustrating the structure of a data bus switching device in accordance with a second embodiment of the present invention.

FIG. 11 is a view illustrating the structure of the data bus switching device of the second embodiment. In FIG. 11, the same members as those of the clock signal switching device 100 of FIG. 1 are identified by the same reference numerals.

As shown in FIG. 11, the data bus switching device 200 of the second embodiment is composed of a clock signal switching device 100 of the first embodiment shown in FIG. 1 and a data signal selection means 210.

When a first clock signal, a second clock signal, and a switching signal are inputted into the clock signal switching device 100, the clock signal switching device 100 selects either the first or second clock signal based on the inputted switching signal, and also outputs the selected clock signal as an output clock signal. Upon receiving the output clock signal (a first masked clock signal or a second masked clock signal) outputted from a masked clock signal selection means 140, a first data signal synchronous with the first clock signal, a second data signal synchronous with the second clock signal, and a selected switching signal outputted from a synchronized switching signal selection means 130, the data signal selection means 210 selects either the first or second data signal as a selected data signal based on the inputted selected switching signal, and also outputs the selected data signal synchronously with the output clock signal. In this process step, if a first synchronized switching signal has been selected as the selected switching signal by the synchronized switching signal selection means 130, the data signal selection means 210 selects the first data signal. On the other hand, if a second synchronized switching signal has been selected as the selected switching signal, the data signal selection means 210 selects the second data signal.

Figure 12:
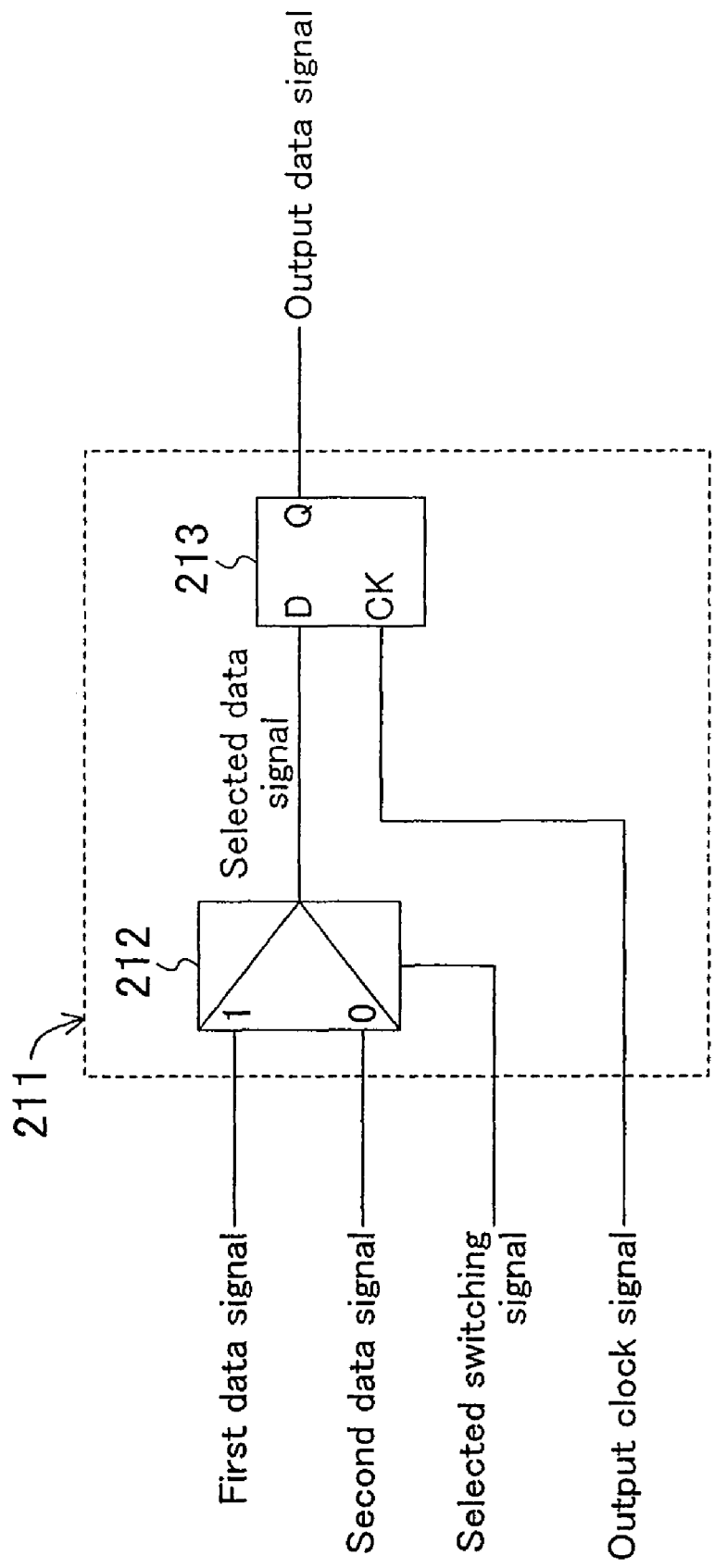
FIG. 12 is a view illustrating the structure of a data signal selection circuit which realizes functions of a data signal selection means forming the data bus switching device shown in FIG. 11.

FIG. 12 is a view illustrating the structure of a data signal selection circuit 211 which realizes the functions of the data signal selection means 210 shown in FIG. 11.

As shown in FIG. 12, the data signal selection circuit 211 is composed of a third multiplexer 212 and a third flip flop 213. When a first data signal, a second data signal, and a selected switching signal are inputted into the third multiplexer 212, the third multiplexer 212 selects the first data signal when the inputted selected switching signal is at a high level, while the third multiplexer 212 selects the second data signal when the inputted selected switching signal is at a low level. When the data signal (the selected data signal) outputted from the third multiplexer 212 and an output clock signal are inputted to the third flip flop 213, the third flip flop 213 outputs as an output data signal the selected data signal that is synchronous with the inputted output clock signal.

Figure 13:
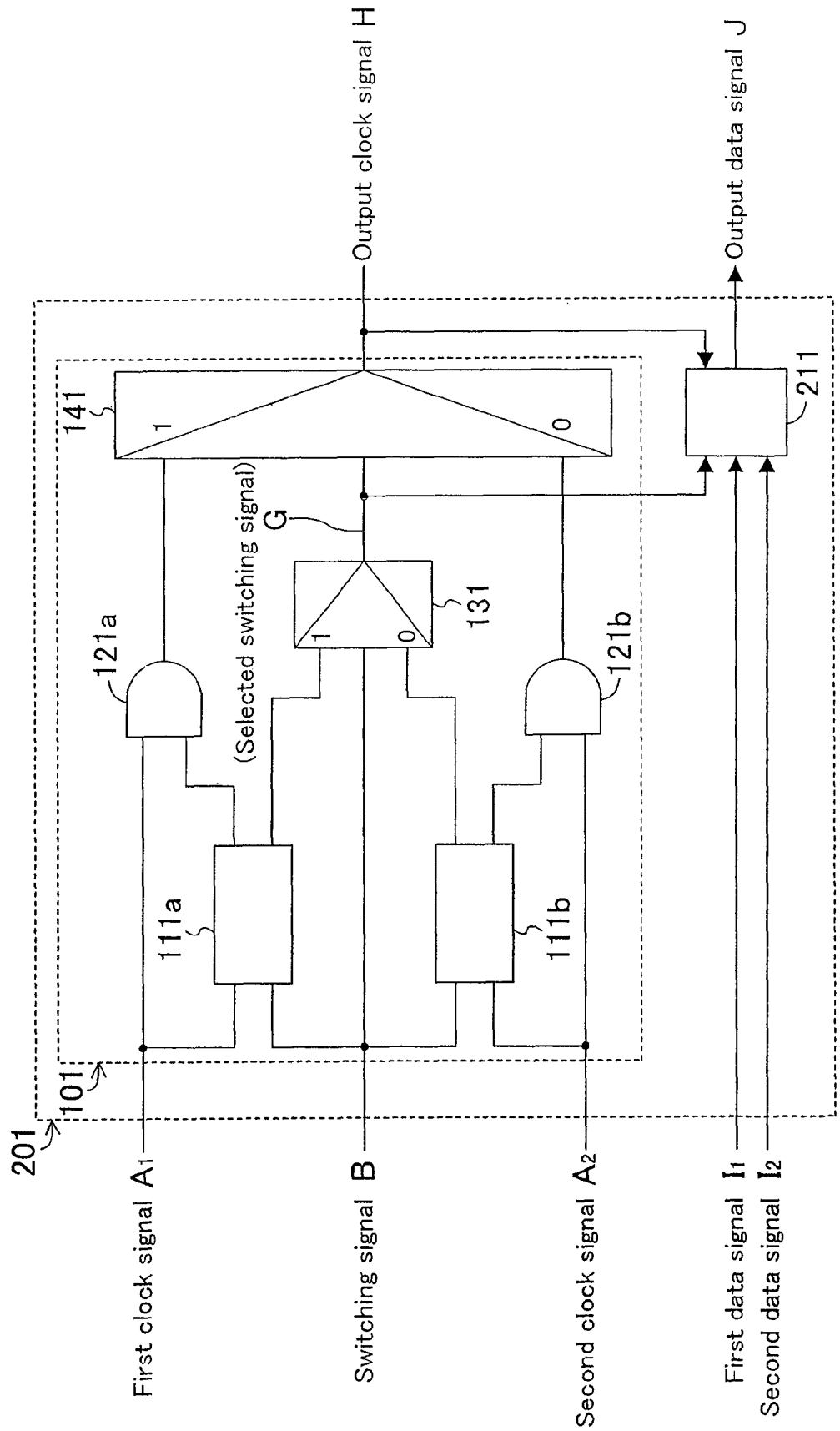
FIG. 13 is a view illustrating the structure of a data bus switching circuit that realizes functions of the data bus switching device shown FIG. 11.

FIG. 13 is a view illustrating the structure of a data bus switching circuit 201 that realizes the functions of the data bus switching device 200 of FIG. 11. In FIG. 13, the same members as those of the clock signal switching circuit 101 of FIG. 4 are identified by the same reference numerals.

As shown in FIG. 13, the data bus switching circuit 201 is composed of a clock signal switching circuit 101 of FIG. 4 and a data signal selection circuit 211 of FIG. 12. The clock signal switching circuit 101 has the same structure as the clock signal switching circuit 101 of FIG. 4.

Next, signals transmitted in the data bus switching circuit 201 will be described.

Figure 14:
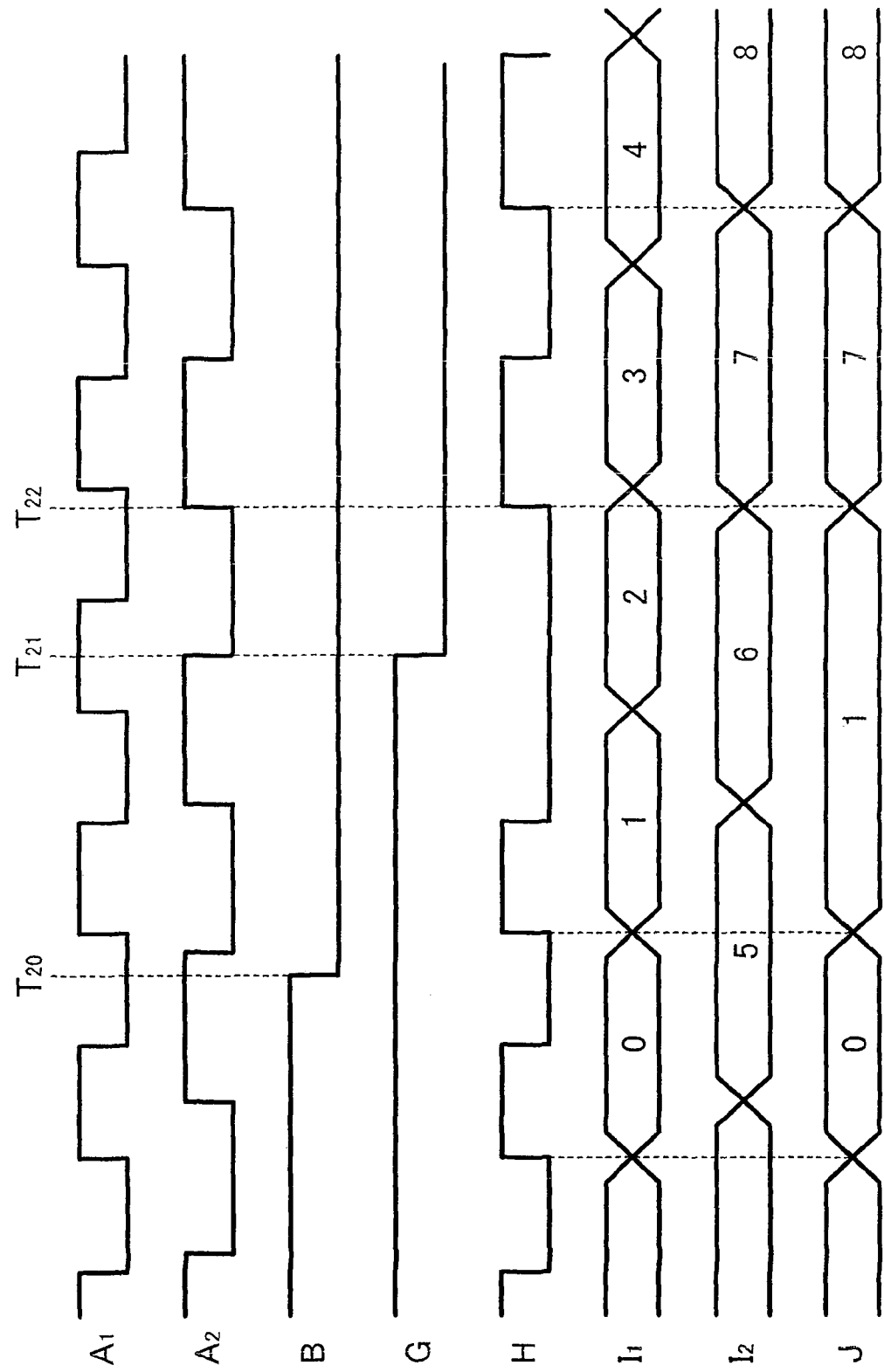
FIG. 14 is a timing chart of signals that are transmitted in the data bus switching circuit shown in FIG. 13.

FIG. 14 is a timing chart of signals that pass through points $A_1$, $A_2$, B, G, H, 11, 12, and J shown in FIG. 13. The timing chart of FIG. 14 is obtained when switching from a first clock signal to a second clock signal is performed. The points $A_1$, $A_2$, B, G, and H shown in FIG. 14 correspond to the respective points shown in FIGS. 5 and 6.

As shown in FIG. 14, when a switching signal (B) inputted into the data bus switching circuit 201 changes from a high level to a low level at time $T_{20}$, a selected switching signal (G) changes from a high level to a low level at the second negative edge (at time $T_{21}$) of a second clock signal ($A_2$) following the time $T_{20}$. An output clock signal H switched at the time $T_{21}$ based on the selected switching signal (G) has a masked waveform (that is, a waveform set to a low level) during the period of time from the first negative edge of a first clock signal ($A_1$), which is the signal to be replaced, following the time $T_{20}$, to the second negative edge of the second clock signal ($A_2$), which is the signal to next be selected, following the time $T_{20}$.

On the other hand, during the period of time in which the selected switching signal G is at a high level, that is, before the time $T_{21}$, a first data signal ($I_1$) is selected as a selected data signal in the third multiplexer 212 in the data signal selection circuit 211. During the period of time in which the selected switching signal (G) is at a low level, that is, after the time $T_{21}$, a second data signal ($I_2$) is selected as the selected data signal in the third multiplexer 212. In other words, the data signal selected in the third multiplexer 212 is switched from the first data signal ($I_1$) to the second data signal ($I_2$) at the time $T_2$, at which the selected switching signal G is changed from a high level to a low level. If the first data signal ($I_1$) is replaced with the second data signal ($I_2$) at the time $T_{21}$, a selected data signal (J), which is the second data signal ($I_2$) latched by the third flip flop 213, is outputted as an output data signal (J) at the first positive edge (at time $T_{22}$) of the second clock signal ($A_2$) following the time $T_{21}$.

Described in the foregoing is a case in which the data bus switching device 200 of FIG. 11 is specifically realized by the hardware (the data bus switching circuit 201) of FIG. 13 alone, but the functions shown in FIG. 11 can be realized by software, for example.

Hereinafter, it will be described how to switch data signals using software.

Figure 15:
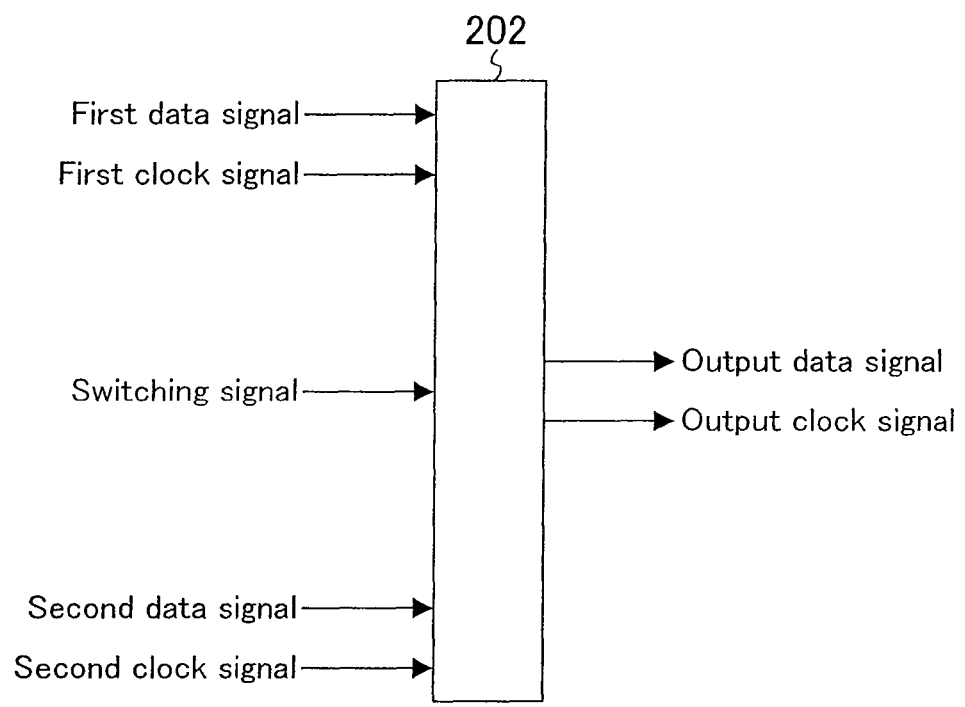
FIG. 15 is a view illustrating hardware that performs data bus switching in a data bus switching method in accordance with the second embodiment of the present invention.

FIG. 15 is a schematic view illustrating a data bus switching program for realizing the data bus switching method of the second embodiment by software.

As shown in FIG. 15, when a first clock signal, a second clock signal, a first data signal, a second data signal, and a switching signal are inputted into a data bus switching program 202, the data bus switching program 202 selects either the first data signal or the second data signal as an selected data signal based on the inputted switching signal, and also outputs the selected data signal as an output data signal synchronously with a corresponding one of the clock signals. The specific structure of the data bus switching program 202 is the same as that of the data bus switching device shown in FIG. 11, for example.

More specifically, the data bus switching program 202 has subprograms that correspond to the clock signal switching device 100 and the data signal selection means 210, respectively.

Figure 16:
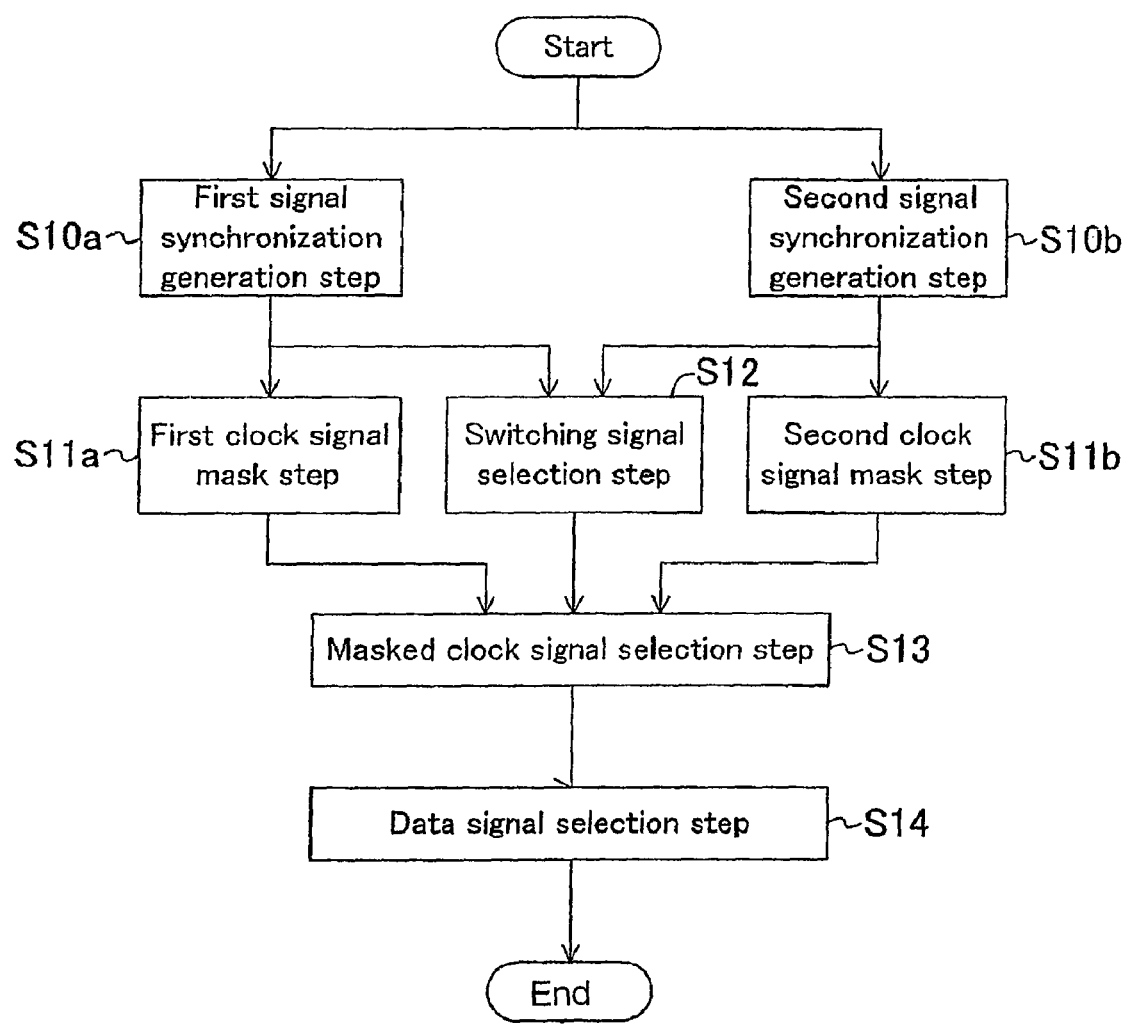
FIG. 16 indicates process steps in the data bus switching method in accordance with the second embodiment of the present invention.

FIG. 16 indicates data bus switching process steps performed by the data bus switching program 202 of FIG. 11. In FIG. 16, the same process steps as the clock signal switching process steps shown in FIG. 8 are identified by the same reference numerals.

As shown in FIG. 16, in a masked clock signal selection step S13, which is performed by a subprogram that corresponds to the masked clock signal selection means 140, and in the steps before the clock signal selection step S13, either an inputted first clock signal or an inputted second clock signal is selected as an output clock signal.

Next, in a data signal selection step S14, which is performed by a subprogram that corresponds to the data signal selection means 210, either a first data signal or a second data signal, which is synchronous to the output clock signal, is selected as a selected data signal based on a selected switching signal selected in a switching signal selection step S12, and the selected data signal is outputted as an output data signal synchronously with the output clock signal selected in the clock signal selection step S13.

In the above-described data bus switching device of the second embodiment, the following effects can be obtained in addition to the effects attainable in the first embodiment.

In this embodiment, the data signal selected by the data signal selection means 210 can be synchronized to the output clock signal obtained in the same manner as in the first embodiment. Therefore, e.g., operational malfunctions occurring due for example to a hazard caused by switching the data signals can be prevented.

Furthermore, in the data bus switching method of the second embodiment, the same waveforms as those of the signals generated in the data bus switching device 200 can also be produced by software. This eliminates the need for particularly incorporating a circuit for data bus switching, which results in a reduction in the circuit size. The inventive data bus switching method is particularly effective in systems which have already incorporated for example a microcomputer such as an external timing control circuit to realize functions other than a data bus switching circuit. In this case, those systems can perform data bus switching by using the existing microcomputer without incorporating a new microcomputer, thereby achieving a further reduction in the circuit size.

In the second embodiment, the first clock signal and the first data signal have been assigned to different data buses before they are inputted into the data bus switching device 200. However, after inputted to the data bus switching device 200, the first clock signal and the first data signal may be assigned to different data buses. This also applies to data buses for the second clock signal and the second data signal.

Modified Example of the Second Embodiment

Hereinafter, a data bus switching device in accordance with a modified example of the second embodiment of the present invention will be described with reference to the accompanying drawings.

Figure 17:
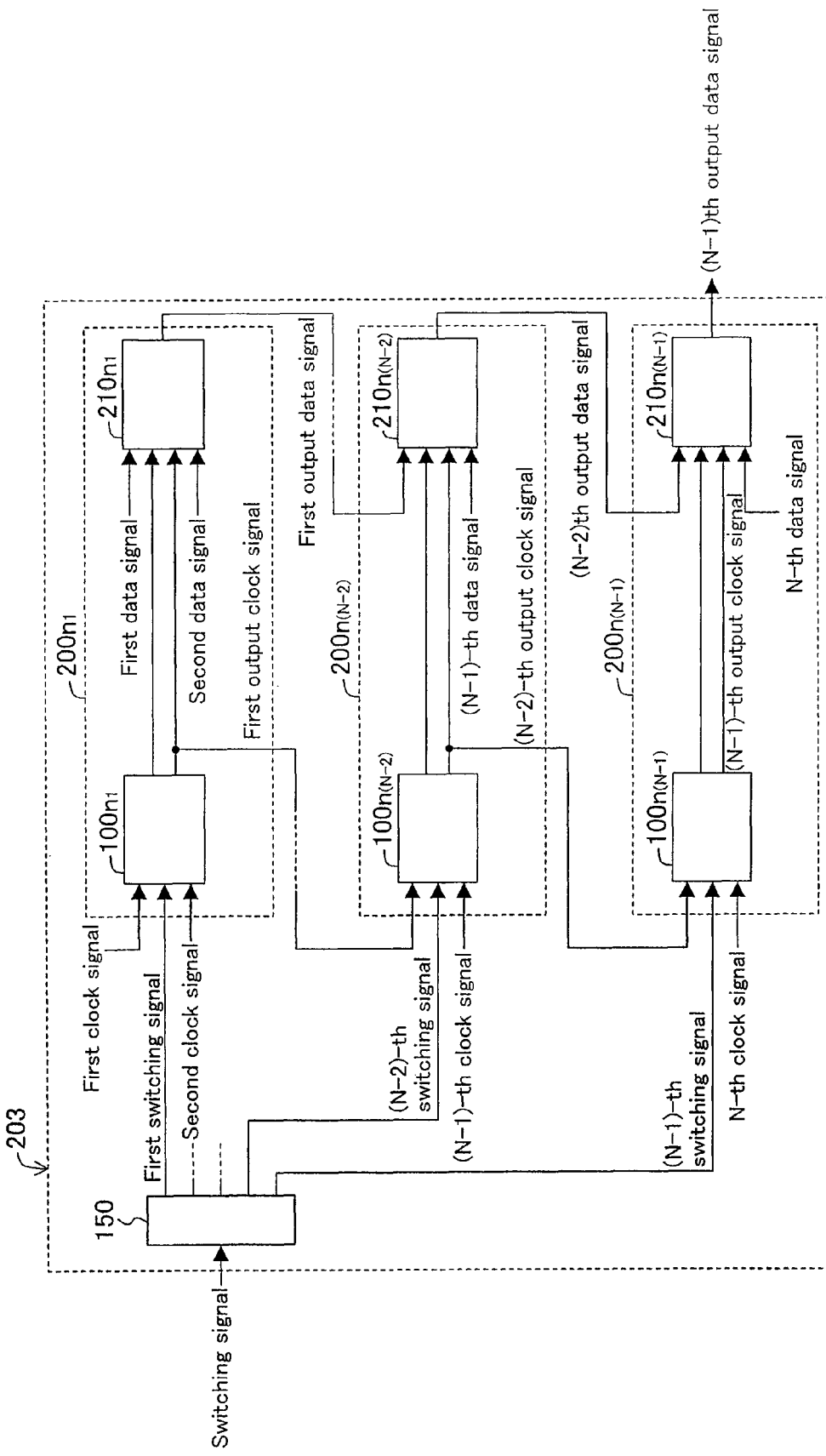
FIG. 17 is a view illustrating the structure of a data bus switching device in accordance with a modified example of the second embodiment of the present invention.

FIG. 17 is a view illustrating the structure of the data bus switching device in accordance with the modified example of the second embodiment.

As shown in FIG. 17, the data bus switching device 203 of this modified example is characterized in that any one of N data signals (wherein N is an integer equal to or greater than two) inputted via N data buses can be selected. In FIG. 17, the same members as those of the clock signal switching device 103 of the modified example of the first embodiment illustrated in FIG. 9 are identified by the same reference numerals.

More specifically, the data bus switching device 203 is composed of a switching signal decode means 150 and first through (N−1)-th data bus selection means $200n_1$ through $200n_{(N-1)}$. Each data bus selection means, e.g., the i-th data bus selection means $200n_i$, is composed of an i-th clock signal selection means $100n_i$ and an i-th data signal selection means $200n_i$. The switching signal decode means 150 and first through (N−1)-th clock signal selection means $100n_1$ through $100n_{(N-1)}$ function in such a manner and have such a structure as explained in the modified example of the first embodiment.

Subsequently, a description will be made of the structure of the (N−1)-th data bus selection means $200n_{(N-1)}$ composed of for example the (N−1)-th clock signal selection means $100n_{(N-1)}$ and the (N−1)-th data signal selection means $210n_{(N-1)}$.

Figure 18:
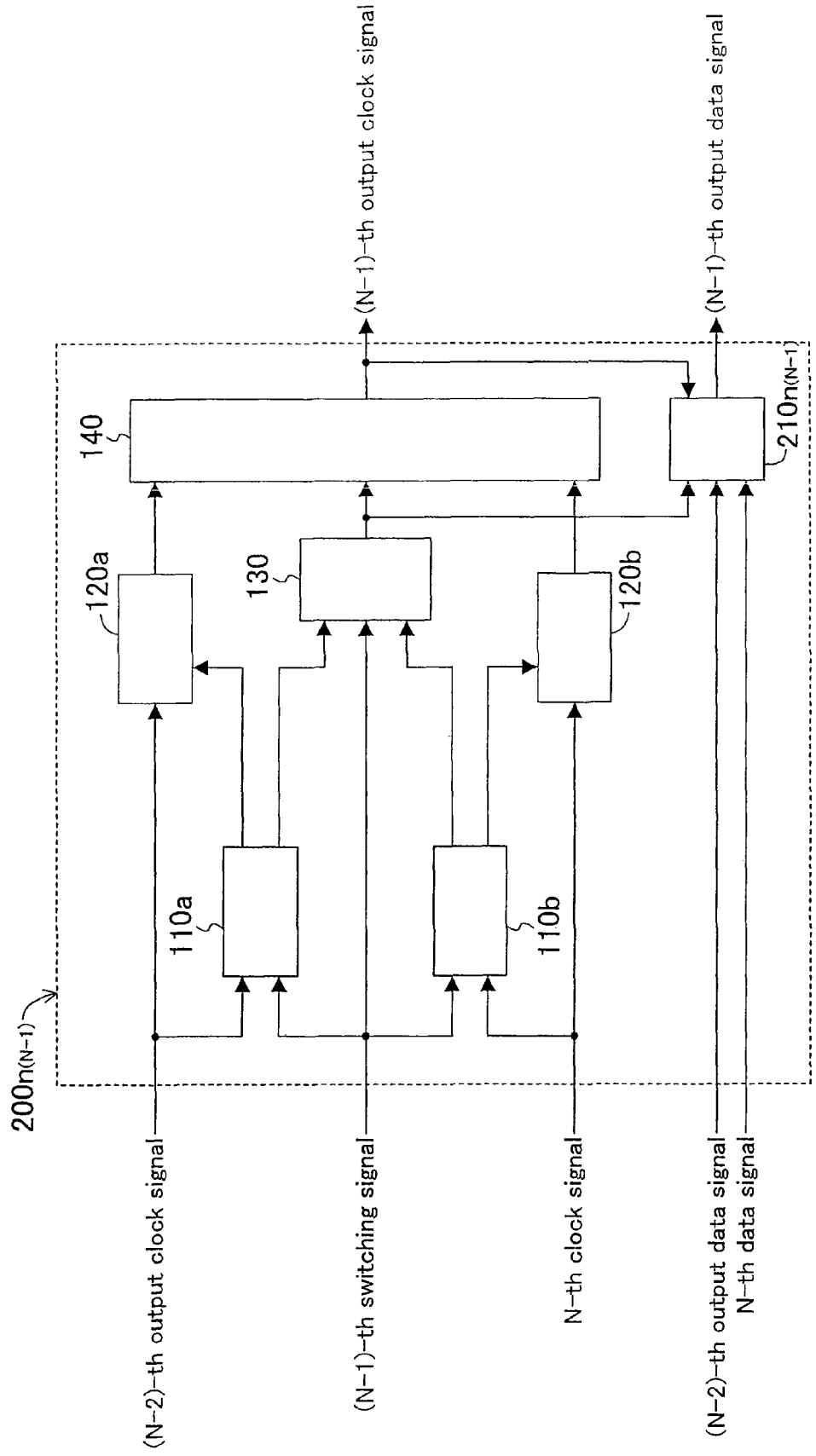
FIG. 18 is a view illustrating the structure of an N-th data bus selection means illustrated in FIG. 17.

FIG. 18 is a view illustrating the structure of the (N−1)-th data bus selection means $200n_{(N-1)}$ illustrated in FIG. 17. In FIG. 18, the same members as those of the data bus switching device 200 of the second embodiment shown in FIG. 11 are identified by the same reference numerals.

As shown in FIG. 18, the (N−1)-th data bus selection means $200n_{(N-1)}$ has the same structure as the data bus switching device 200 of FIG. 11. More specifically, the (N−1)-th data bus selection means $200n_{(N-1)}$ is composed of a first signal synchronization generation means 110a, a second signal synchronization generation means 110b, a first clock signal mask means 120a, a second clock signal mask means 120b, a synchronized switching signal selection means 130, a masked clock signal selection means 140, and the data signal selection means $210n_{(N-1)}$. However, inputted into the (N−1)-th data bus selection means $200n_{(N-1)}$ are: an (N−2)-th output clock signal and an (N−2)-th output data signal both outputted from the (N−2)-th data bus selection means $200n_{(N-2)}$; an (N−1)-th switching signal (decoded signal) decoded by the switching signal decode means 150; an N-th clock signal; and an N-th data signal.

Next, it will be described how the above-described structure operates to perform switching from one to another among the N inputted data signals. The first through (N−1)-th clock signal selection means $100n_1$ through $100n_{(N-1)}$ operate as described in the modified example of the first embodiment. Thus, it will be described, in particular, how the first through (N−1)-th data bus selection means $200n_1$ through $200n_{(N-1)}$ operate.

In cases of switching from a p-th data signal to a q-th data signal (wherein 1<p<q≦N), the p-th through (p−2)-th switching signals and the q-th through (N−1)-th switching signals are maintained as they are at a high level, while the (q−1)-th switching signal is changed from a high level to a low level. However, the first through (p−2)-th switching signals, and the (p−1)-th through (p−2)-th switching signals after the switching operation may be either at a high level or a low level. In a case where p=1, the (q−1)-th switching signal is changed from a high level to a low level, while the second through (q−2)-th switching signals and the q-th through (N−1)-th switching signals are maintained as they are at a high level.

On the other hand, in a case of switching from the q-th data signal to the p-th data signal, the (p−1)-th switching signal is set to a low level (the (p−1)-th switching signal may have already been at a low level at the time of the switching), and the p-th through (q−1)-th switching signals are set to a high level (the p-th through (q−1)-th switching signals may have already been at a high level at the time of the switching), while the q-th through (N−1)-th switching signals are kept at a high level. Nevertheless, the first through (p−2)-th switching signals, and the (p−1)-th through (p−2)-th switching signals before the switching may be either at a high level or a low level. In the case where p=1, the first switching signal is set to a high level (the first switching signal may have already been at a high level at the time of the switching), and the second through (q−1)-th switching signals are set at a high level, while the q-th through (N−1)-th switching signals are maintained at a high level.

As described above, in the modified example of the second embodiment, two or more structures, each of which is the same as the (N−1)-th data bus selection means $200n_{(N-1)}$ of FIG. 18, that is, two or more data bus switching devices 200 of the second embodiment of FIG. 11, are provided. Thus, even if different data signals have been inputted via three or more data buses, switching from one to another among those data signals can be performed. Moreover, each of the data bus selection means $200n_1$ through $200n_{(N-1)}$ forming the data bus switching device 203 is the same as the data bus switching device 200 of the second embodiment. Therefore, even in cases of switching among three or more data signals, the effects obtainable in the second embodiment can be reliably achieved in each data bus selection means.

It should be noted that in the modified example of the second embodiment, the i-th (wherein 1≦i≦N) clock signal and the i-th data signal, for example, have been assigned to different data buses, before they are inputted into the data bus switching device 203. However, after inputted to the data bus switching device 203, the i-th clock signal and the i-th data signal may be assigned to different data buses.

In the modified example of the second embodiment, a circuit structure that realizes the functions of each data bus selection means included in the data bus switching device 203 may be the data bus switching circuit 201 illustrated in FIG. 13, for example.

Third Embodiment

Hereinafter, a data receiving device in accordance with a third embodiment of the present invention will be described with reference to the accompanying drawings.

Figure 19:
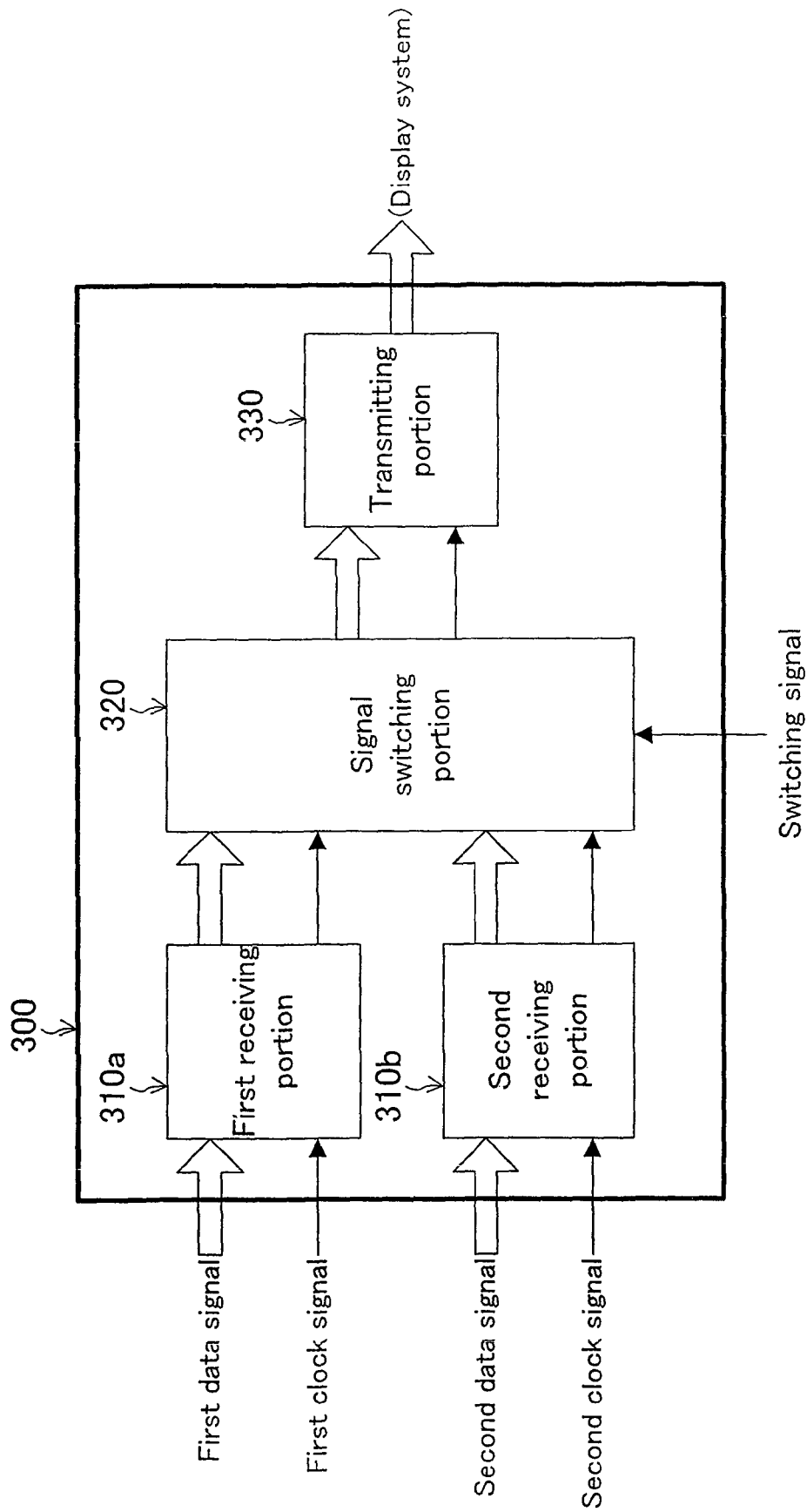
FIG. 19 is a view illustrating the structure of a data receiving device in accordance with a third embodiment of the present invention.

FIG. 19 is a view illustrating the structure of a data receiving device in accordance with the third embodiment.

Figure 20:
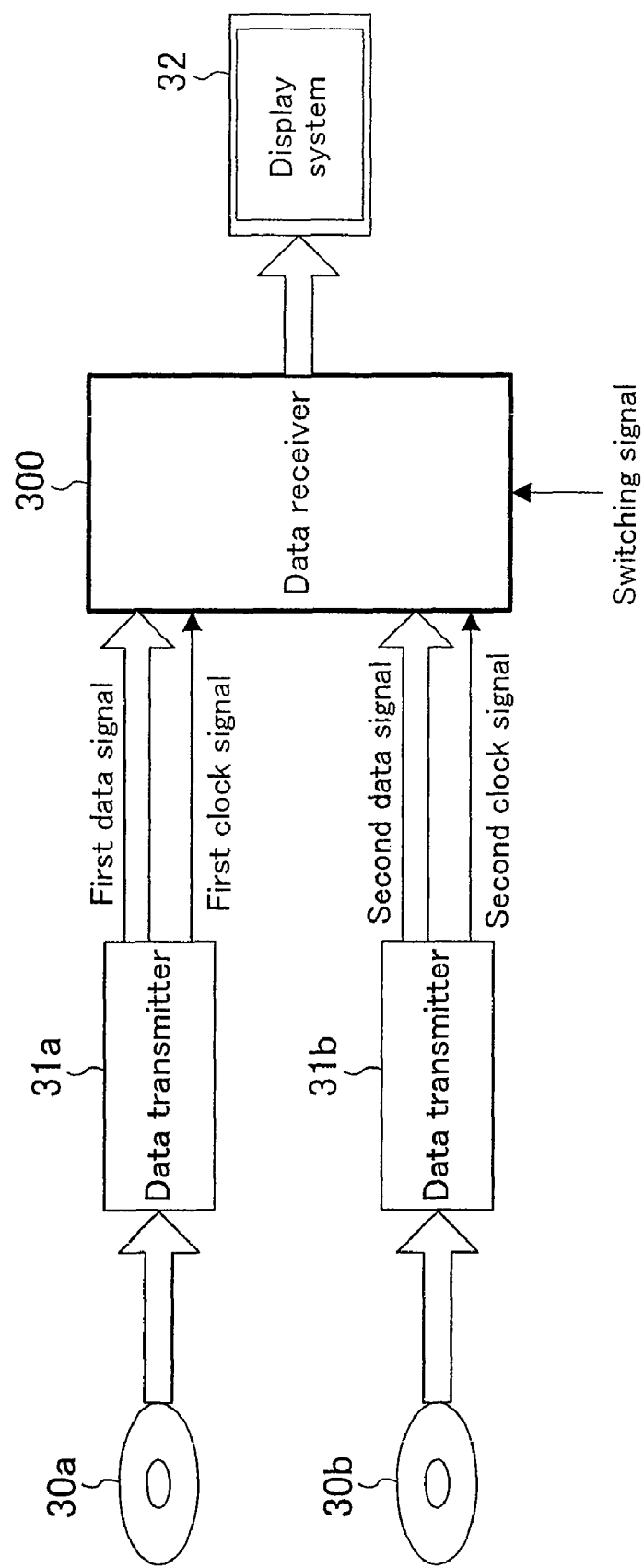
FIG. 20 is a view illustrating the entire structure obtained when the data receiving device of FIG. 19 is connected to peripheral devices.

FIG. 20 illustrates an example in which the data receiving device of FIG. 19 is connected to peripheral devices.

As shown in FIG. 19, the data receiving device 300 of the third embodiment is composed of a first receiving means 310a, a second receiving means 310b, a signal switching means 320, and a transmitting means 330.

After receipt of a first clock signal and a first data signal transmitted from an external device, the first receiving means 310a converts the first data signal into a format processable in, e.g., a display system that is connected to the transmitting means 330, and then outputs the converted first data signal and the clock signal to the signal switching means 320. The first data signal, which is synchronous to the first clock signal, is composed of for example an audio data signal and a video data signal. The first receiving means 310a performs other functions such as playback of the first clock signal. Likewise, upon receipt of a second clock signal and a second data signal transmitted from an external device, the second receiving means 310b also converts the second data signal into a format processable in the display system connected to the transmitting means 330, and then outputs the converted second data signal to the signal switching means 320. The second data signal, which is synchronous to the second clock signal, is composed of for example an audio data signal and a video data signal. The second receiving means 310b also performs other functions such as playback of the second clock signal. The signal switching means 320 selects either the first data signal or the second data signal as a selected data signal based on an inputted switching signal, and also outputs the selected data signal as an output data signal to the transmitting means 330. The transmitting means 330 decodes the encoded data signal selected by the signal switching means 320, and also performs, e.g., separation of the audio data signal and the video data signal before outputting the separated audio data signal and video data signal to the display system.

A characteristic of this embodiment in the above structure is that the signal switching means 320 is composed of a data bus switching device 200 of the second embodiment shown in FIG. 11.

Therefore, in the third embodiment, it is possible to select either the first clock signal received by the first receiving means 310a or the second clock signal received by the second receiving means 310b, as an output clock signal to be outputted from the transmitting means 330, and it is also possible to select either the first or second data signal that corresponds to the clock signal that has been selected as the output clock signal. In this process, since the signal switching means 320 is formed of the data bus switching device 200 of FIG. 11, the effects obtainable in the second embodiment can be reliably attained even in a digital transmission system in which the data signals and the clock signals are transmitted separately.

The data signal selected in the data receiving device 300 can be displayed on the display system 32 without producing any operational malfunction, even in cases in which, for example, as shown in FIG. 20, the first data signal and first clock signal recorded in a first record medium 30*a* are received separately, and the second data signal and second clock signal recorded in a second record medium 30*b* are also received separately. Thus, even if the data receiving device 300 of this embodiment is employed in digital transmission systems such as DVI and HDMI, in which clock signals and data signals are transmitted separately, switching among the plurality of digital signals can be performed without producing any operational malfunction.

In addition, in the third embodiment, the fact that the first and second clock signals are synchronous and in phase with each other does not affect prevention of a hazard or duty ratio breakdown. Therefore, the output clock signal can be switched among clock signals that are asynchronous and out of phase with each other without causing any hazard and any duty ratio breakdown even in digital transmission systems such as DVI and HDMI.

In the third embodiment, two types of data signals and two types of clock signals are received, but three or more types of data signals and three or more types of clock signals may be received. In that case, three or more receiving means may be provided, and a data bus switching device 203 of the modified example of the second embodiment may be used as the signal switching means 320.

Furthermore, in the third embodiment, the data bus switching device of the second embodiment is provided as the signal switching means 320, but data bus switching devices that will be described in fourth, fifth, and sixth embodiments and in the modified examples thereof may be provided instead.

Fourth Embodiment

Hereinafter, a clock signal switching device in accordance with a fourth embodiment of the present invention will be described with reference to the accompanying drawings.

Figure 21:
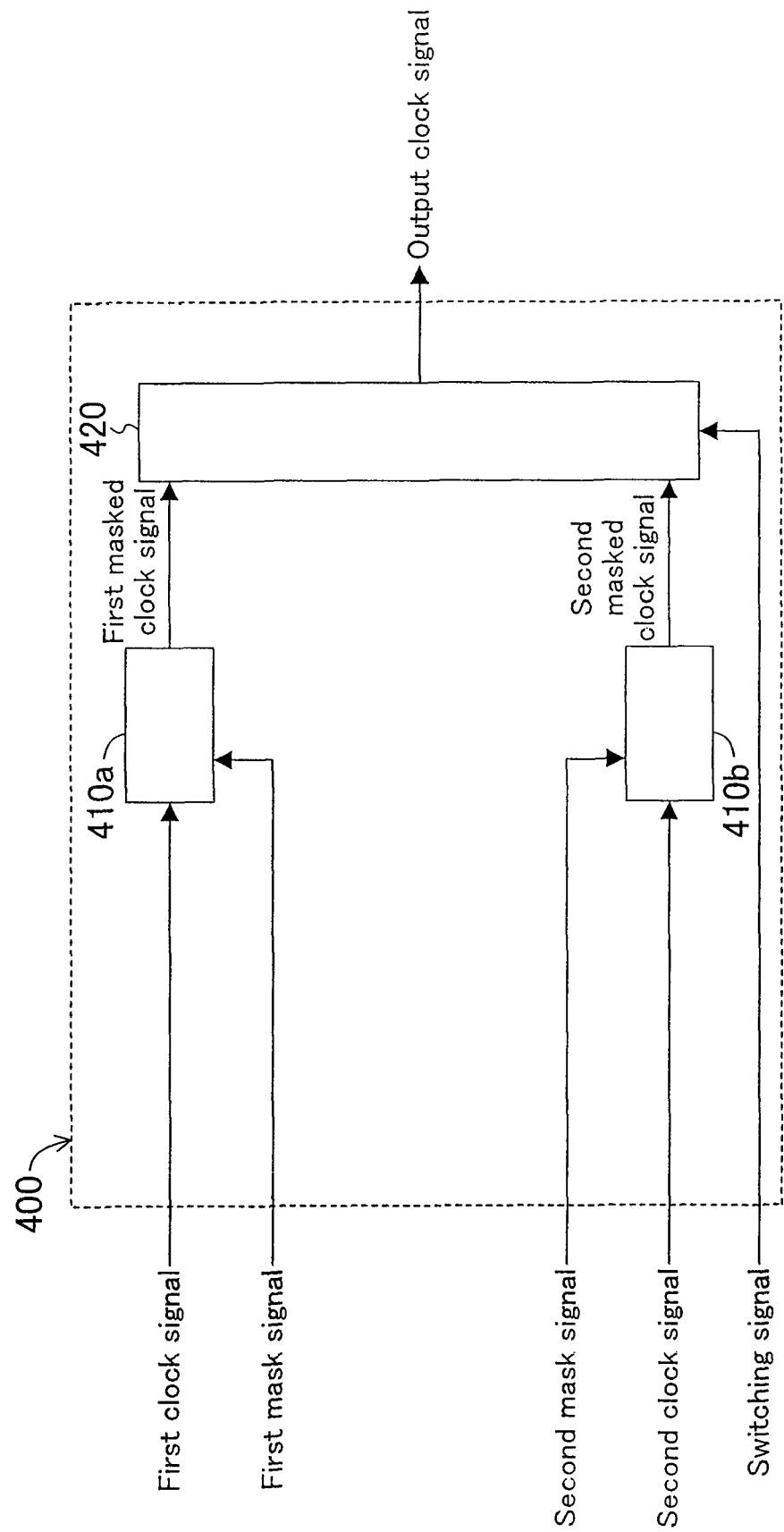
FIG. 21 is a view illustrating the structure of a clock signal switching device in accordance with a fourth embodiment of the present invention.

FIG. 21 is a view illustrating the structure of a clock signal switching device in accordance with the fourth embodiment.

As shown in FIG. 21, the clock signal switching device 400 of the fourth embodiment is composed of a first clock signal mask means 410*a*, a second clock signal mask means 410*b*, and a masked clock signal selection means 420.

The first clock signal mask means 410*a* masks an inputted first clock signal with an inputted first mask signal, thereby generating a first masked clock signal. The second clock signal mask means 410*b*, on the other hand, masks an inputted second clock signal with an inputted second mask signal, thereby generating a second masked clock signal. The masked clock signal selection means 420 selects either the first or second masked clock signal as a selected clock signal based on an inputted switching signal, and also outputs the selected masked clock signal as an output clock signal.

Next, a circuit structure that realizes the functions of the above described clock signal switching device 400 will be described.

Figure 22:
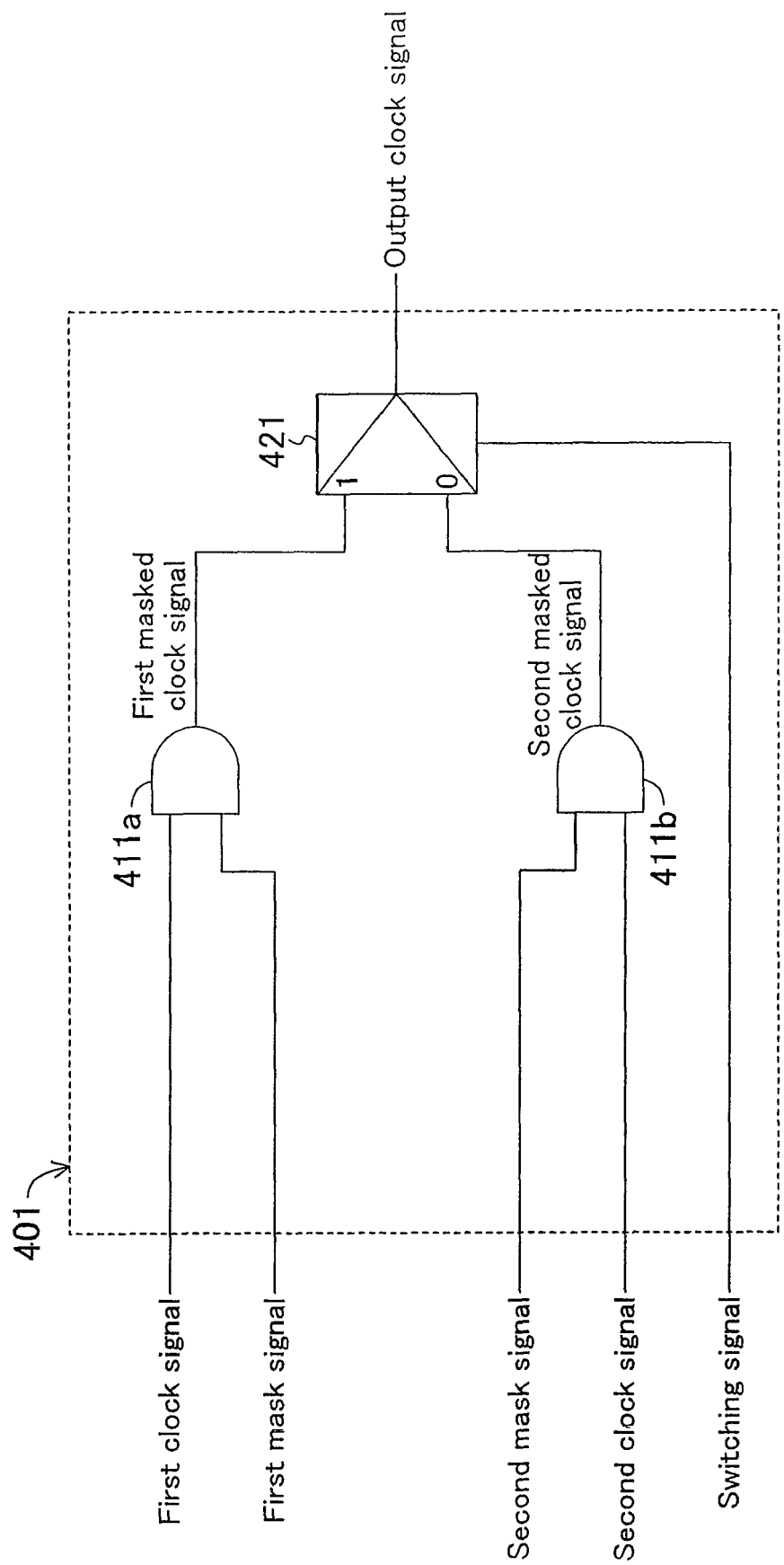
FIG. 22 is a view illustrating the structure of a clock signal switching circuit that realizes functions of the clock signal switching device illustrated in FIG. 21.

FIG. 22 is a view illustrating the structure of a clock signal switching circuit 401 which realizes the functions of the clock signal switching device 400 illustrated in FIG. 21.

As shown in FIG. 22, the clock signal switching circuit 401 is composed of a third AND circuit 411*a*, a fourth AND circuit 411*b*, and a fourth multiplexer 421.

When a first clock signal and a first mask signal are inputted into the third AND circuit 411*a*, the third AND circuit 411*a* produces a first masked clock signal, which is the logical product of the first clock signal and the first mask signal. On the other hand, when a second clock signal and a second mask signal are inputted into the fourth AND circuit 411*b*, the fourth AND circuit 411*b* generates a second masked clock signal, which is the logical product of the second clock signal and the second mask signal. When the first masked clock signal outputted from the third AND circuit 411*a*, the second masked clock signal outputted from the fourth AND circuit 411*b*, and a switching signal are inputted into the fourth multiplexer 421, the fourth multiplexer 421 selects either the first or second masked clock signal as a selected clock signal based on the inputted switching signal, and also outputs the selected masked clock signal as an output clock signal. More specifically, the fourth multiplexer 421 selects the first masked clock signal as the selected clock signal, when the switching signal is at a high level. When the switching signal is at a low level, on the other hand, the fourth multiplexer 421 selects the second masked clock signal as the selected clock signal.

The timing of the operation of the first and second masked clock signals and of the switching signal is controlled by (an) external device(s).

Hereinafter, a description will be made of a case in which the mask signal and the switching signal inputted into the clock signal switching circuit 401 are controlled by an external microcomputer.

Figure 23:
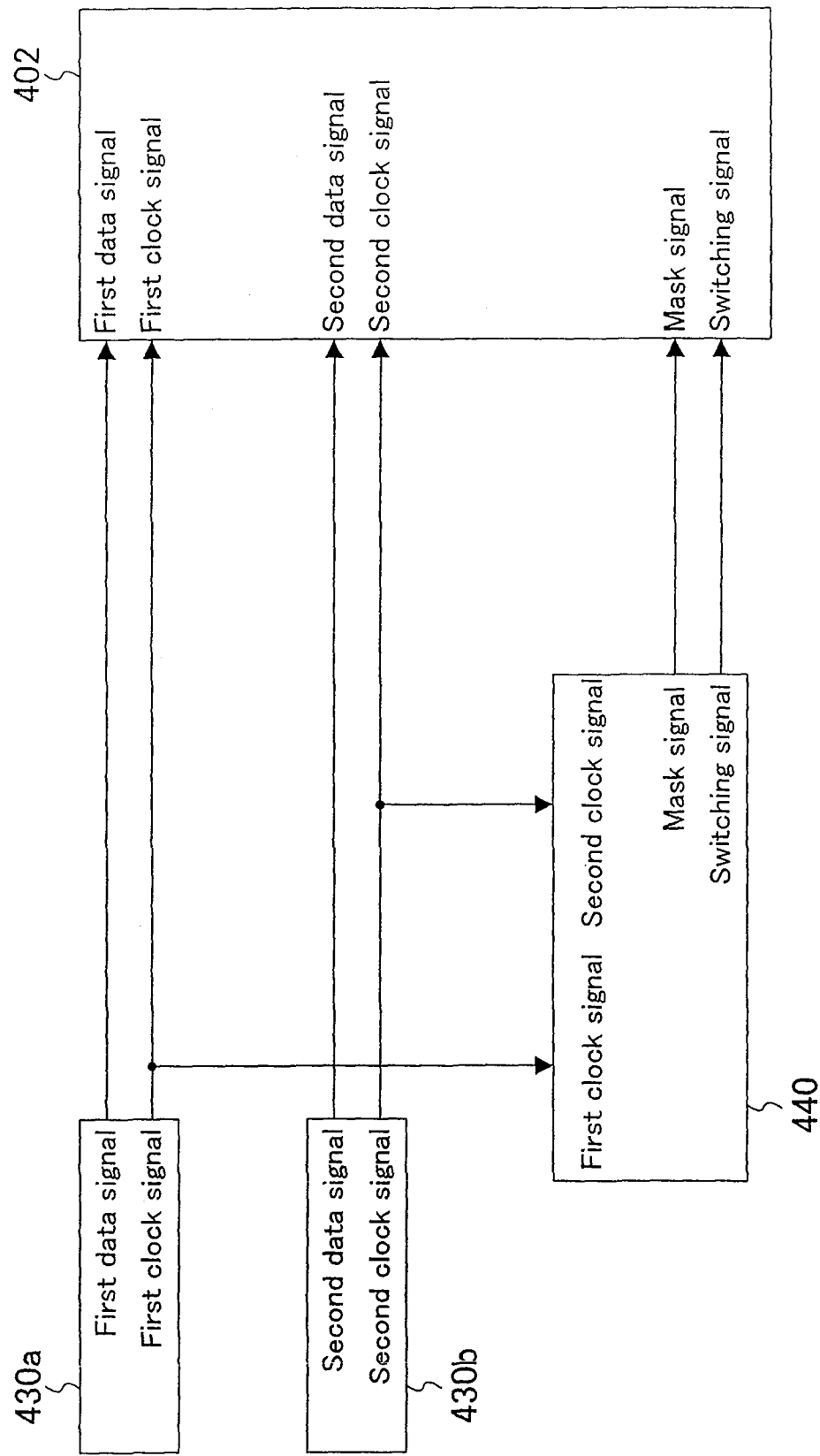
FIG. 23 is a view illustrating the entire structure obtained when switching and mask signals inputted to the clock signal switching device of FIG. 21 are controlled by an external microcomputer.

FIG. 23 is a view illustrating the entire structure including a microcomputer in a case where signals inputted into the clock signal switching circuit 401 of FIG. 22 are controlled by the microcomputer.

As shown in FIG. 23, the entire structure for the case where clock signals and a switching signal are controlled by a microcomputer is composed of a sync device 402, a first source device 430*a*, a second source device 430*b*, and a microcomputer 440.

The first source device 430*a* outputs a first data signal and a first clock signal. The second source device 430*b*, on the other hand, outputs a second data signal and a second clock signal. The microcomputer 440 controls switching between the data signals and between the clock signals. More specifically, the microcomputer 440 generates a switching signal for respective switching between the data signals and between the clock signals, and also produces first and second mask signals based on the generated switching signal, thereby controlling the timing at which the switching between the data signals and between the clock signals is performed. The switching of those signals is performed at the timing shown in FIG. 3, for example. The sync device 402 is a circuit that includes the clock signal switching circuit 401. More specifically, the sync device 402 masks the inputted clock signals with the above-mentioned mask signals, and also selects either the first clock signal masked with the first mask signal or the second clock signal masked with the second mask signal based on the switching signal.

As described above, in the fourth embodiment, before the switching between the first and second clock signals is performed, the first clock signal mask means 410*a* masks the first clock signal with the first mask signal, while the second clock signal mask means 410*b* masks the second clock signal with the second mask signal. This prevents beforehand, e.g., a hazard from occurring when the switching between the first and second clock signals is performed. In particular, as shown in FIG. 23, if the first and second mask signals and the switching signal inputted into the clock signal switching device 400 are controlled by the microcomputer, more significant effects can be achieved.

In addition, in the fourth embodiment, the fact that the first and second clock signals are synchronous and in phase with each other does not affect the prevention of a hazard or duty ratio breakdown. Therefore, the output clock signal can be switched between clock signals that are asynchronous and out of phase with each other, while any hazard and any duty ratio breakdown are suppressed.

Furthermore, in the fourth embodiment, if the clock signal to next be selected has been inputted at the time of the clock signal switching, the clock signal switching can be performed regardless of the status of the clock signal to be replaced. Thus, it is possible to avoid a problem with some conventional devices in that the clock signal switching may fail depending upon the status of the to-be-replaced clock signal.

In the fourth embodiment, a clock signal switching method for realizing the functions of the clock signal switching device 400 by software is composed of a first clock signal mask step that corresponds to the first clock signal mask means 410a, a second clock signal mask step that corresponds to the second clock signal mask means 410b, and a masked clock signal selection step that corresponds to the masked clock signal selection means 420. In the first clock signal mask step, an inputted first clock signal is masked with a first mask signal, thereby producing a first masked clock signal. In the second clock signal mask step, an inputted second clock signal is masked with a second mask signal, thereby producing a second masked clock signal. In the masked clock signal selection step, either the first or second masked clock signal is selected as a selected clock signal based on an inputted switching signal, and then outputted as an output clock signal.

In the fourth embodiment, if, e.g., (N−1) clock signal switching devices 400 of FIG. 21 are provided, any one of N clock signals can be selected as the selected clock signal, and outputted as the output clock signal, as in the clock signal switching device 103 of FIG. 9.

Figure 24:
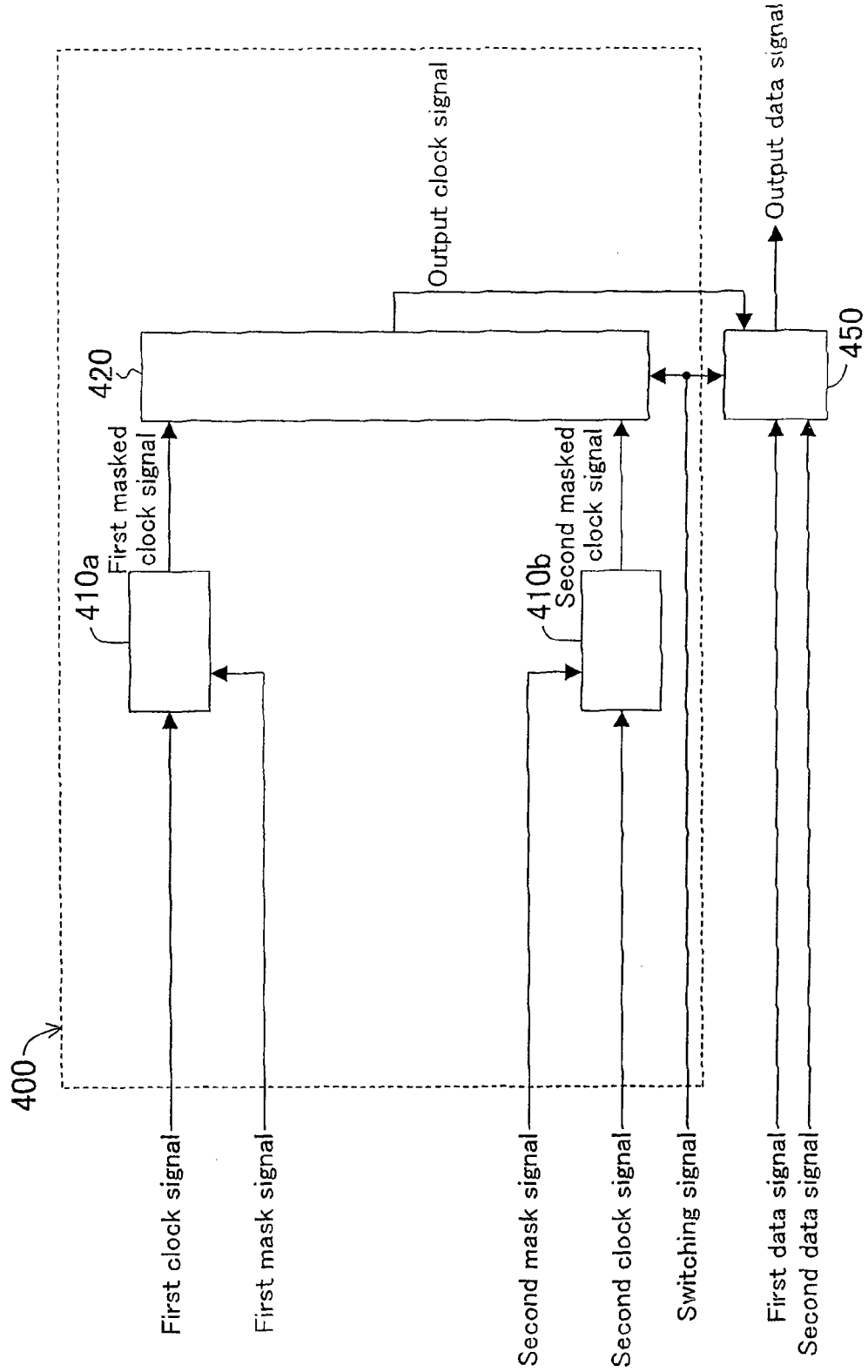
FIG. 24 is a view illustrating a structure in which a data signal selection means is added to the clock signal switching device of FIG. 21.

Also, if a data signal selection means is provided in addition to the clock signal switching device of the fourth embodiment, data signal switching can be simultaneously performed as described in the second embodiment. Such a structure is illustrated in FIG. 24. In FIG. 24, the same members as those of the clock signal switching device 400 of the fourth embodiment shown FIG. 21 are identified by the same reference numerals. A data signal selection means, which is designated by the reference numeral 450, is the same as the data signal selection means 210 of FIG. 11.

First Modified Example of the Fourth Embodiment

Hereinafter, a clock signal switching device in accordance with a first modified example of the fourth embodiment of the present invention will be described with reference to the accompanying drawings.

Figure 25:
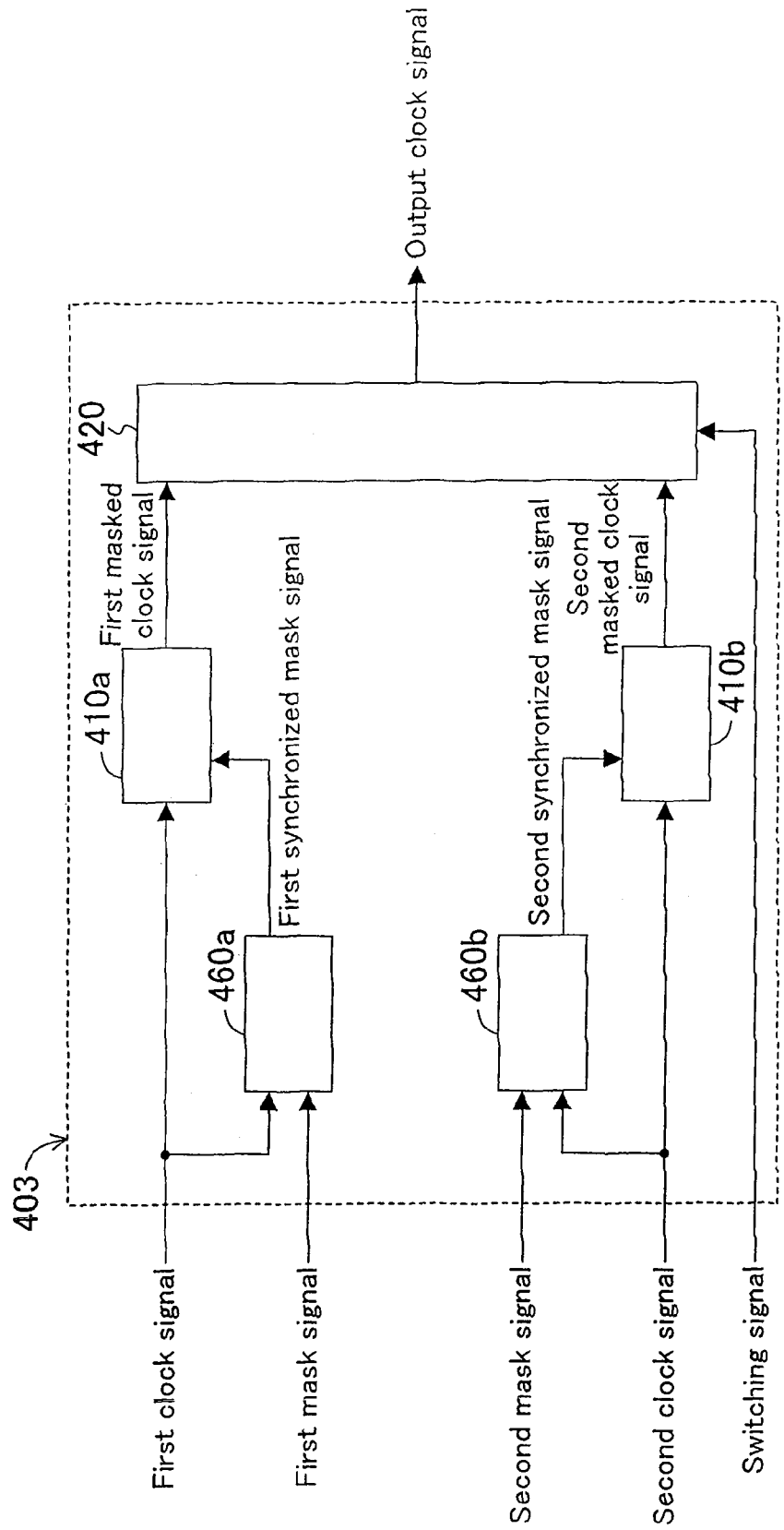
FIG. 25 is a view illustrating the structure of a clock signal switching device in accordance with a first modified example of the fourth embodiment of the present invention.

FIG. 25 is a view illustrating the structure of a clock signal switching device 403 in accordance with the first modified example of the fourth embodiment. In FIG. 25, the same members as those of the clock signal switching device 400 of the fourth embodiment shown FIG. 21 are identified by the same reference numerals.

As shown in FIG. 25, the clock signal switching device 403 of the first modified example of the fourth embodiment is characterized in that a first mask signal synchronization generation means 460a for synchronizing a first mask signal to a first clock signal, and a second mask signal synchronization generation means 460b for synchronizing a second mask signal to a second clock signal are provided in addition to the structure of a clock signal switching device 400 of FIG. 21.

Thus, a first clock signal mask means 410a masks the first clock signal with the first mask signal that is synchronous with the first clock signal. A second clock signal mask means 410b, on the other hand, masks the second clock signal with the second mask signal that is synchronous with the second clock signal.

Next, a circuit structure realizing the above functions will be described with reference to FIG. 26.

Figure 26:
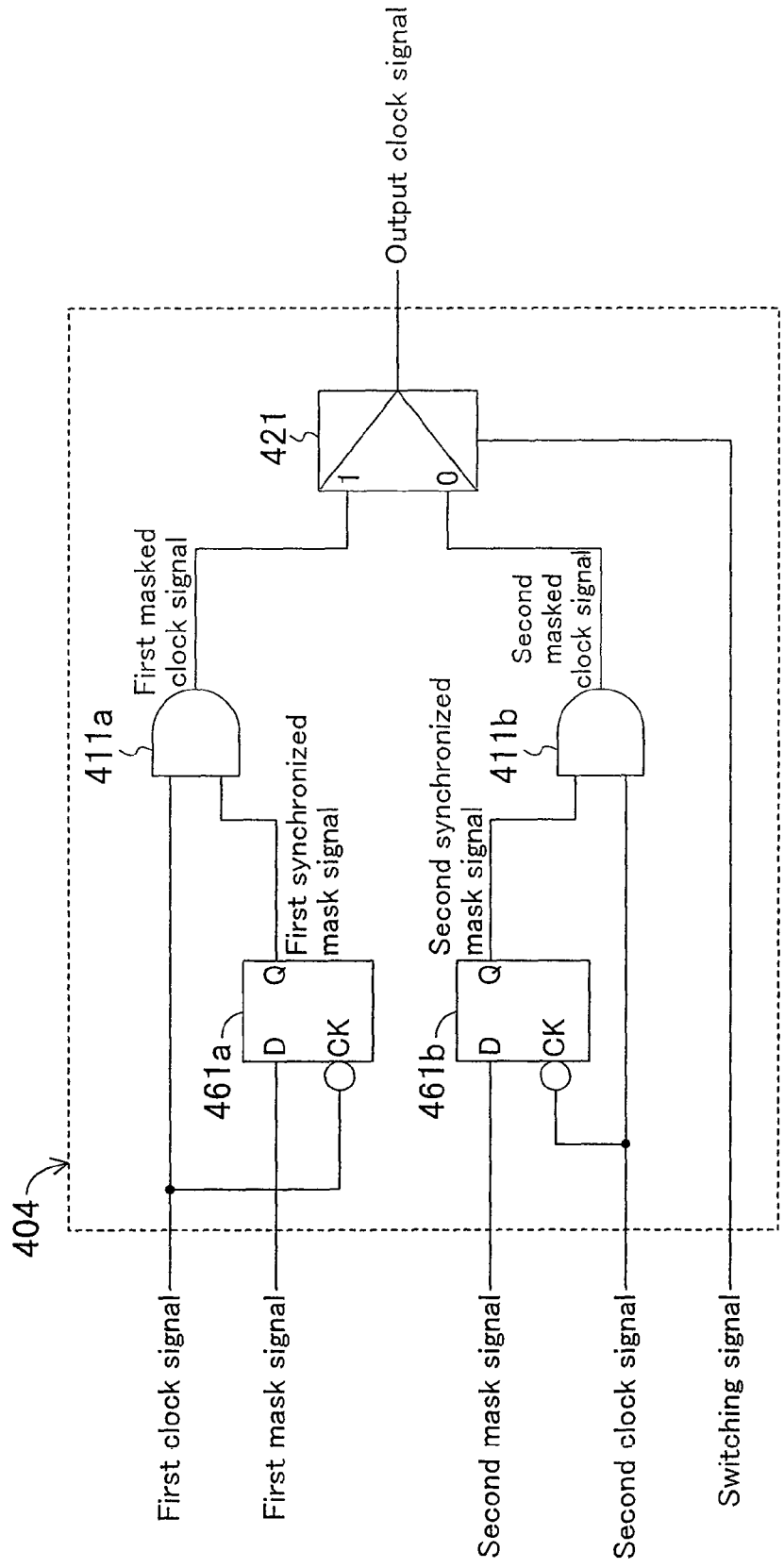
FIG. 26 is a view illustrating the structure of a clock signal switching circuit that realizes functions of the clock signal switching device illustrated in FIG. 25.

FIG. 26 is a view illustrating the structure of a clock signal switching circuit 404 that realizes the functions of the clock signal switching device 403 illustrated in FIG. 25. In FIG. 26, the same members as those of the clock signal switching circuit 401 of FIG. 22 are identified by the same reference numerals.

As shown in FIG. 26, in the clock signal switching circuit 404, a fifth flip flop 461a and a sixth flip flop 461b are provided in addition to the structure of the clock signal switching circuit 401 of FIG. 22.

When a first clock signal and a first mask signal are inputted into the fifth flip flop 461a, the fifth flip flop 461a synchronizes the inputted first mask signal to a negative edge of the first clock signal. A third AND circuit 411a therefore creates a first masked clock signal, which is the logical product of the first mask signal that is synchronous with the first clock signal and the first clock signal. On the other hand, when a second clock signal and a second mask signal are inputted into the sixth flip flop 461b, the sixth flip flop 461b also synchronizes the inputted second mask signal to a negative edge of the second clock signal. Thus, a fourth AND circuit 411b generates a second masked clock signal, which is the logical product of the second mask signal that is synchronous with the second clock signal and the second clock signal.

In the first modified example of the fourth embodiment, the first mask signal synchronization generation means 460a for synchronizing the inputted first mask signal to the first clock signal, and the second mask signal synchronization generation means 460b for synchronizing the inputted second mask signal to the second clock signal are provided, which allows the first and second clock signals to be accurately masked. As a result, the effects obtainable in the fourth embodiment can be reliably attained.

It should be noted that a switching signal inputted into the clock signal switching device of the first modified example of the fourth embodiment is preferably synchronized with a positive edge of the mask signal that masks the clock signal that is next to be selected to replace the currently selected clock signal.

Also, in the first modified example of the fourth embodiment, the first and second mask signals are inputted as the mask signals, but a single mask signal may be inputted. In that case, the first mask signal synchronization generation means 460a may synchronize the inputted single mask signal to the first clock signal to generate the first masked clock signal, while the second mask signal synchronization generation means 460b may synchronize the inputted single mask signal to the second clock signal to generate the second masked clock signal.

Moreover, in the first modified example of the fourth embodiment, if, e.g., (N−1) clock signal switching devices 403 shown in FIG. 25 are provided, any one of N clock signals may be selected as the selected clock signal and outputted as the output clock signal as in the clock signal switching device 103 of FIG. 9.

Figure 27:
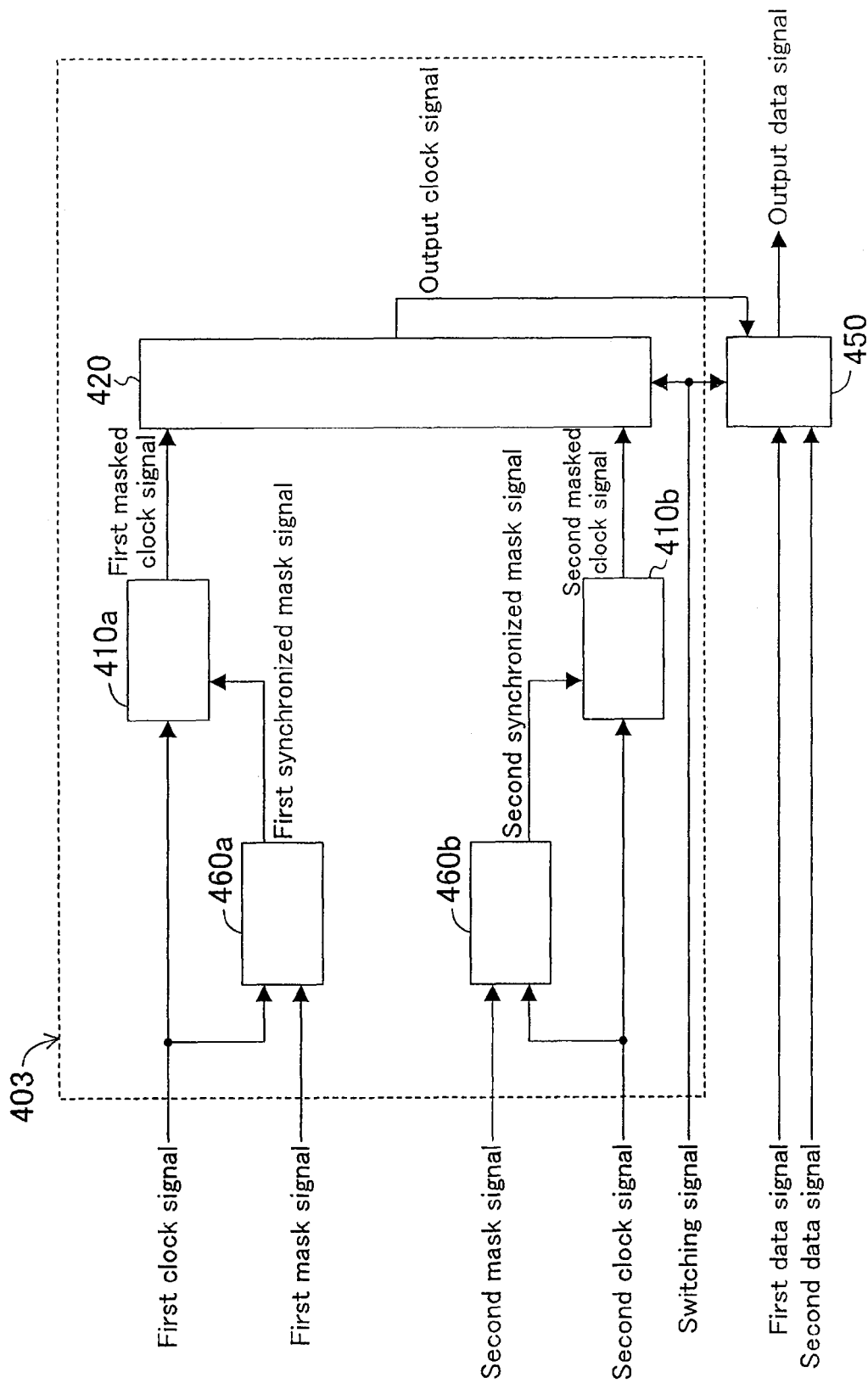
FIG. 27 is a view illustrating a structure in which a data signal selection means is added to the clock signal switching device of FIG. 25.

Furthermore, if a data signal selection means is provided in addition to the data bus switching device of the first modified example of the fourth embodiment, data signal switching can also be performed simultaneously, as described in the second embodiment. Such a structure is illustrated in FIG. 27. In FIG. 27, the same members as those of the clock signal switching device 403 of the first modified example of the fourth embodiment shown in FIG. 25 are identified by the same reference numerals.

Second Modified Example of the Fourth Embodiment

Hereinafter, a clock signal switching device in accordance with a second modified example of the fourth embodiment of the present invention will be described with reference to the accompanying drawings.

Figure 28:
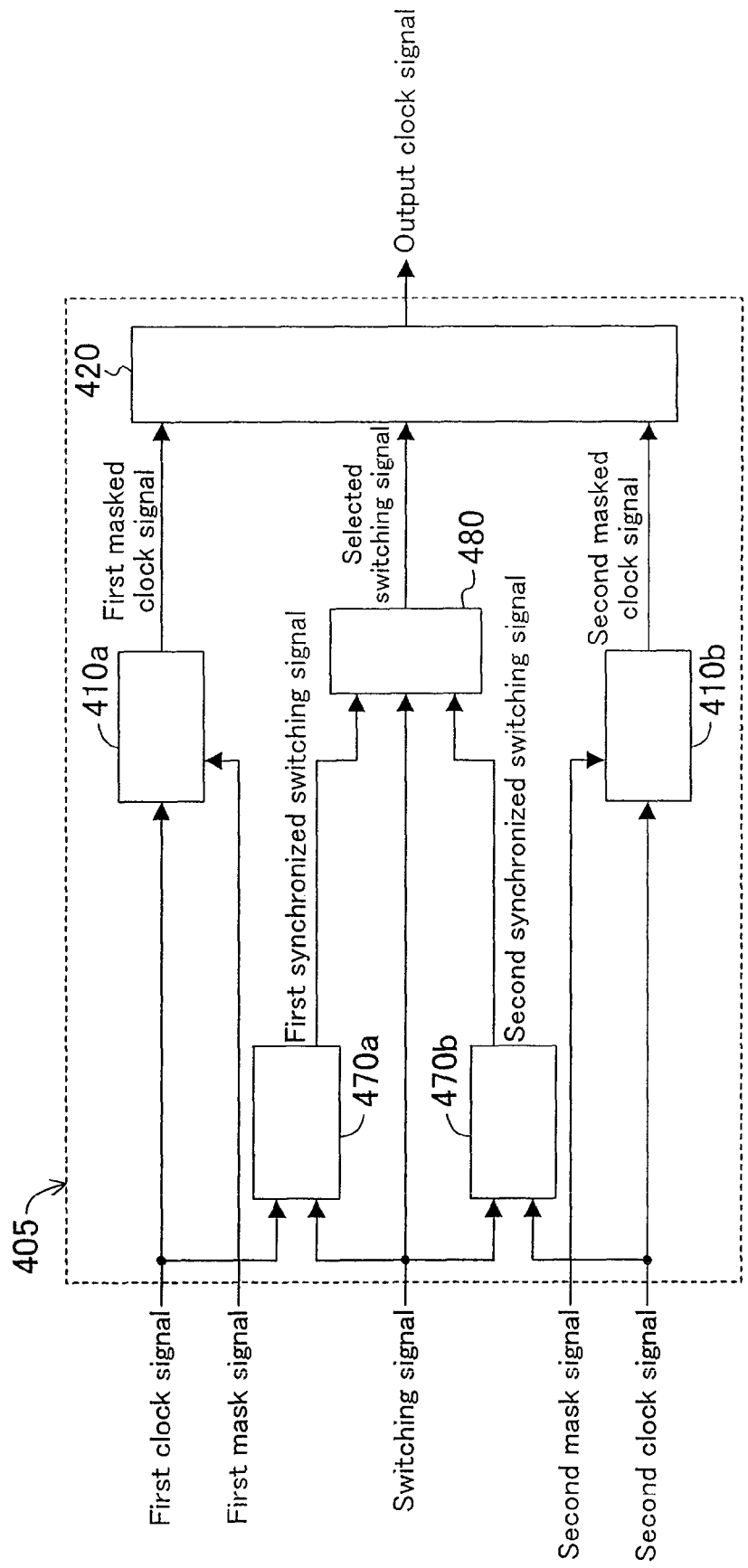
FIG. 28 is a view illustrating the structure of a clock signal switching device in so accordance with a second modified example of the fourth embodiment of the present invention.

FIG. 28 is a view illustrating the structure of a clock signal switching device 405 in accordance with the second modified example of the fourth embodiment. In FIG. 28, the same members as those of the clock signal switching device 400 of the fourth embodiment shown FIG. 21 are identified by the same reference numerals.

As shown in FIG. 28, the clock signal switching device 405 of the second modified example of the fourth embodiment is characterized in that a first switching signal synchronization generation means 470a, a second switching signal synchronization generation means 470b, and a synchronized switching signal selection means 480 are provided in addition to the structure of a clock signal switching device 400 illustrated in FIG. 21.

The first switching signal synchronization generation means 470a generates a first synchronized switching signal, which is synchronous with a first clock signal, based on the inputted first clock signal and an inputted switching signal. Likewise, the second switching signal synchronization generation means 470b generates a second synchronized switching signal, which is synchronous with a second clock signal, based on the inputted second clock signal and switching signal. The synchronized switching signal selection means 480 selects either the first or second synchronized switching signal as a selected switching signal based on the inputted switching signal. Therefore, a masked clock signal selection means 420 selects either a first masked clock signal or a second masked clock signal as an output clock signal based on the selected switching signal, which is either the first or second synchronized switching signal selected by the synchronized switching signal selection means 480.

Next, a circuit structure realizing the above functions will be described with reference to FIG. 29.

Figure 29:
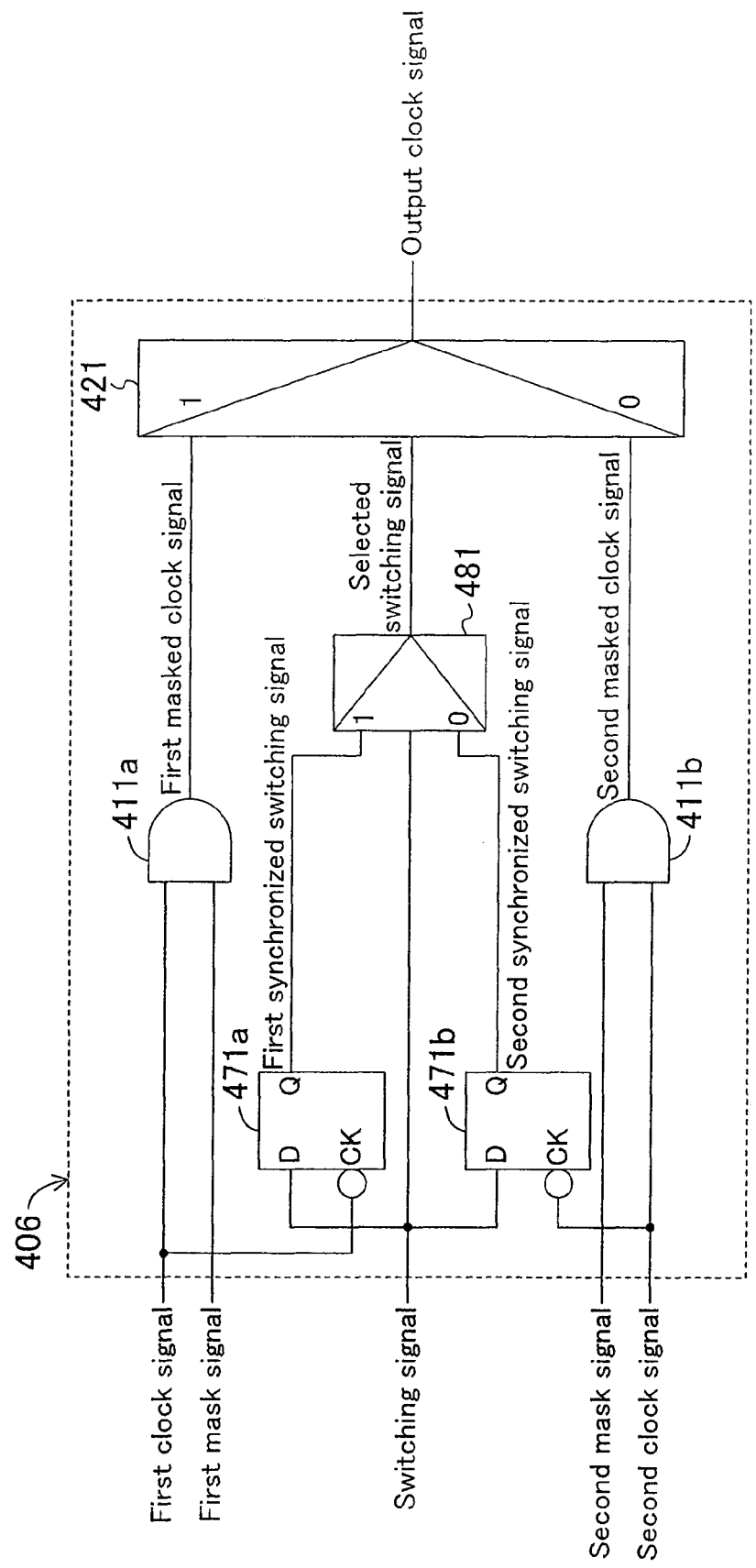
FIG. 29 is a view illustrating the structure of a clock signal switching circuit realizing functions of the clock signal switching device illustrated in FIG. 27.

FIG. 29 is a view illustrating the structure of a clock signal switching circuit 406 realizing the functions of the clock signal switching device 405 illustrated in FIG. 28. In FIG. 29, the same members as those of the clock signal switching circuit 401 of FIG. 22 are identified by the same reference numerals.

As shown in FIG. 29, in the clock signal switching circuit 406, a seventh flip flop 471a, an eighth flip flop 471b, and a fifth multiplexer 481 are provided in addition to the structure of a clock signal switching circuit 401 of FIG. 22.

When a first clock signal and a switching signal are inputted into the seventh flip flop 471a, the seventh flip flop 471a generates a first synchronized switching signal, which is synchronous with the first clock signal. On the other hand, when a second clock signal and the switching signal are inputted into the eighth flip flop 471b, the eighth flip flop 471b produces a second synchronized switching signal, which is synchronous with the second clock signal. When the first and second synchronized switching signals and the switching signal are inputted into the fifth multiplexer 481, the fifth multiplexer 481 selects either the first or second synchronized switching signal as a selected switching signal based on the switching signal. More specifically, when the switching signal is at a high level, the fifth multiplexer 481 selects the first synchronized switching signal as the selected switching signal. On the other hand, when the switching signal is at a low level, the fifth multiplexer 481 selects the second synchronized switching signal as the selected switching signal. Therefore, the fourth multiplexer 421 selects either a first masked clock signal or a second masked clock signal as a selected clock signal based on the selected switching signal selected in the fifth multiplexer 481.

In the second modified example of the fourth embodiment, the first switching signal synchronization generation means 470a synchronizes the switching signal to the first clock signal, while the second switching signal synchronization generation means 470b synchronizes the switching signal to the second clock signal. This allows the masked clock signal selection means 420 to select either the first or second masked clock signal based on the switching signal that is synchronous with the first or second clock signal. Accordingly, switching can be performed in accordance with the timing of the first or second clock signal. As a result, the effects obtainable in the fourth embodiment can be reliably attained.

It should be noted that first and second mask signals inputted into the clock signal switching device of the second modified example of the fourth embodiment are preferably synchronized with the first and second clock signals, respectively.

Also, in the second modified example of the fourth embodiment, if, e.g., (N−1) clock signal switching devices 405 shown in FIG. 28 are provided, any one of N clock signals can be selected as the output clock signal, as in the clock signal switching device 103 of FIG. 9.

Figure 30:
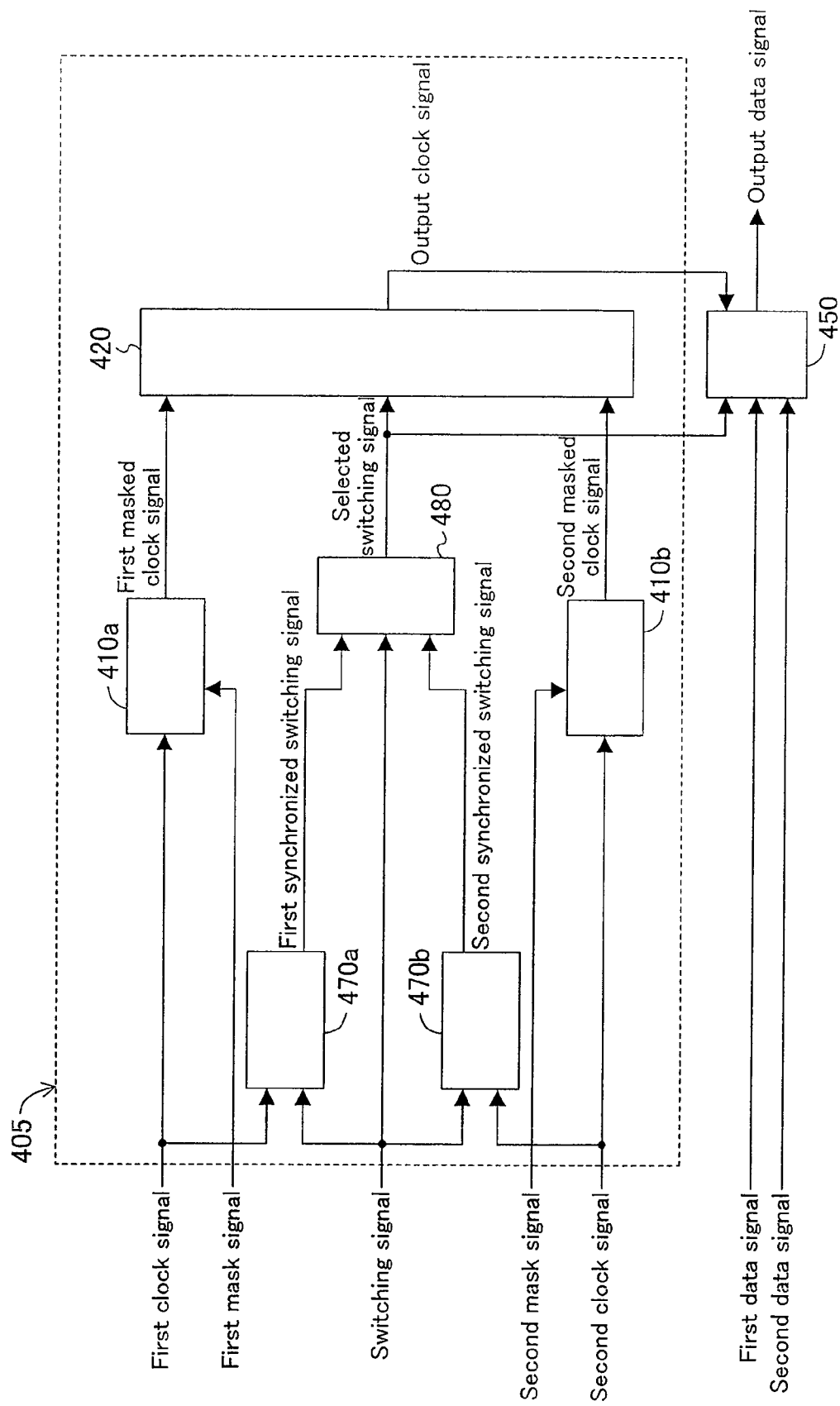
FIG. 30 is a view illustrating a structure in which a data signal selection means is added to the clock signal switching device of FIG. 28.

Furthermore, if a data signal selection means is provided in addition to the clock signal switching device of the second modified example of the fourth embodiment, data signal switching can be simultaneously performed, as described in the second embodiment. Such a structure is illustrated in FIG. 30. In FIG. 30, the same members as those of the clock signal switching device 405 of the second modified example of the fourth embodiment shown in FIG. 28 are identified by the same reference numerals.

Fifth Embodiment

Hereinafter, a clock signal switching device in accordance with a fifth embodiment of the present invention will be described with reference to the accompanying drawings.

Figure 31:
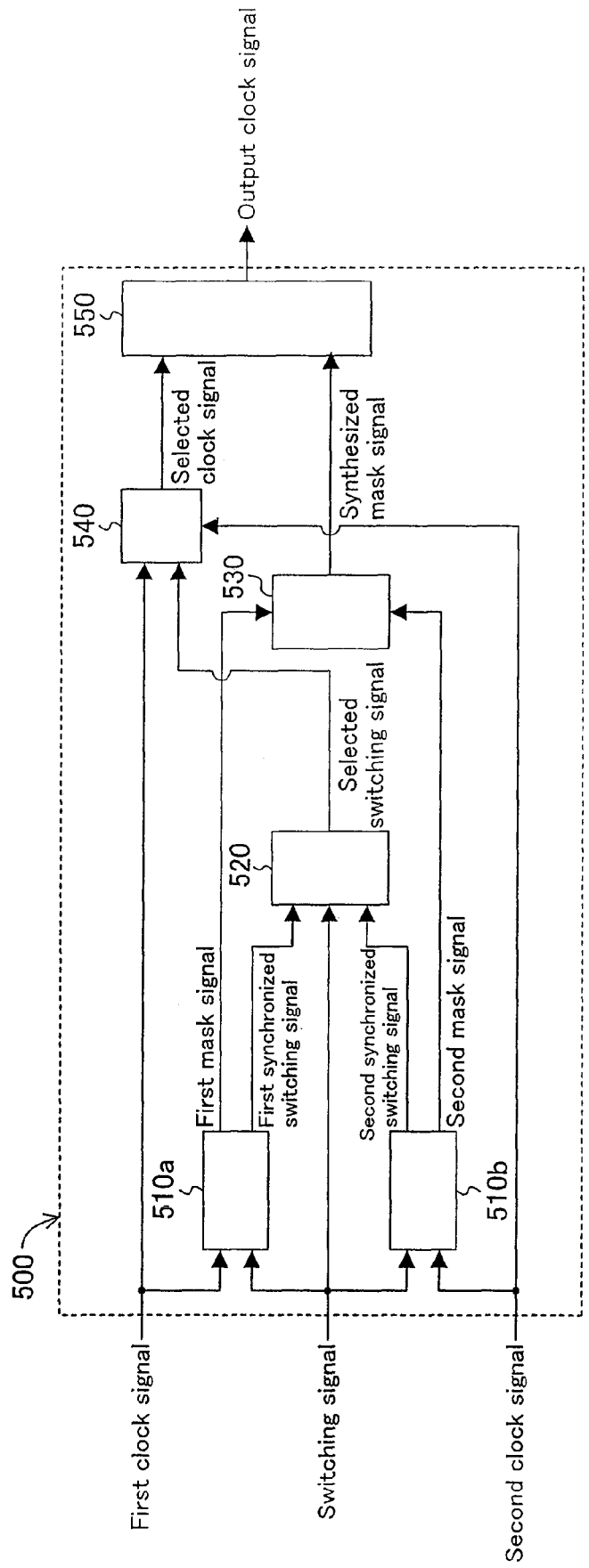
FIG. 31 is a view illustrating the structure of a clock signal switching device in accordance with a fifth embodiment of the present invention.

FIG. 31 is a view illustrating the structure of a clock signal switching device in accordance with the fifth embodiment.

As shown in FIG. 31, the clock signal switching device 500 of the this embodiment is composed of a first signal synchronization generation means 510a, a second signal synchronization generation means 510b, a synchronized switching signal selection means 520, a mask signal synthesis means 530, a clock signal selection means 540, and a clock signal mask means 550.

When a first clock signal, a second clock signal, and a switching signal are inputted into the clock signal switching device 500, the clock signal switching device 500 outputs either the first or second clock signal as an output clock signal based on the inputted switching signal.

More specifically, the first signal synchronization generation means 510a generates a first mask signal and a first synchronized switching signal based on the inputted first clock signal and switching signal. The first mask signal and the first synchronized switching signal are each synchronous with the first clock signal. The second signal synchronization generation means 510b, on the other hand, generates a second mask signal and a second synchronized switching signal based on the inputted second clock signal and switching signal. The second mask signal and the second synchronized switching signal are each synchronous with the second clock signal. The synchronized switching signal selection means 520 selects as a selected switching signal, based on the inputted switching signal, one of the first and second synchronized switching signals generated by the first and second signal synchronization generation means 510a and 510b, respectively. The mask signal synthesis means 530 generates a synthesized mask signal which has a masking portion where a masking portion of the first mask signal generated by the first signal synchronization generation means 510a and a masking portion of the second mask signal generated by the second signal synchronization generation means 510b overlap each other. The clock signal selection means 540 selects either the first or second clock signal as a selected clock signal based on the selected switching signal. The clock signal mask means 550 masks the selected clock signal with the synthesized mask signal generated by the mask signal synthesis means 530, and also finally outputs as an output clock signal the selected clock signal masked with the synthesized mask signal.

Next, a circuit structure realizing the above functions will be described with reference to FIG. 32.

Figure 32:
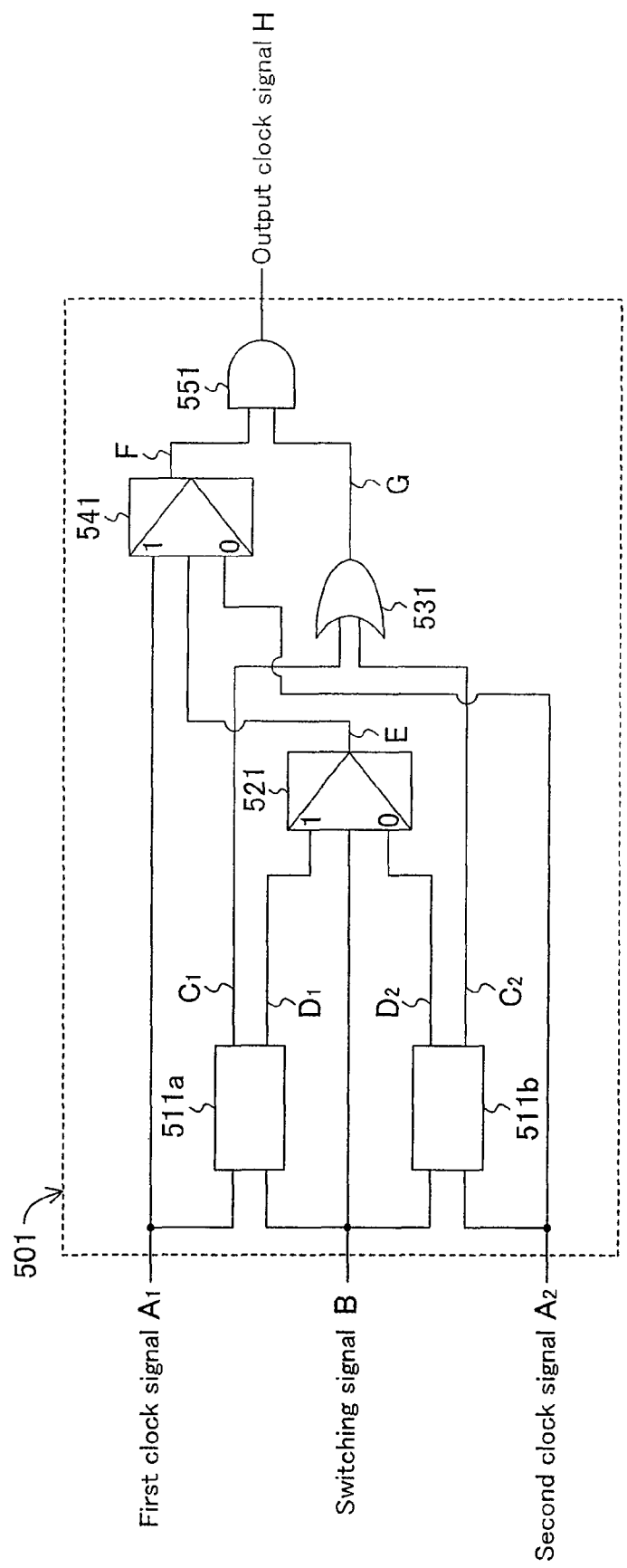
FIG. 32 is a view illustrating the structure of a clock signal switching circuit that realizes functions of the clock signal switching device illustrated in FIG. 31.

FIG. 32 is a view illustrating the structure of a clock signal switching circuit 501 that realizes the functions of the clock signal switching device 500 illustrated in FIG. 31.

As shown in FIG. 32, the clock signal switching circuit 501 is composed of a first signal synchronization generation circuit 511a, a second signal synchronization generation circuit 511b, a sixth multiplexer 521, an OR circuit 531, a seventh multiplexer 541, and a fifth AND circuit 551.

The first and second signal synchronization generation circuits 511a and 511b function in the same manner and have the same structure as the first signal synchronization generation circuit 111a of FIG. 2. When a switching signal, a first synchronized switching signal generated in the first signal synchronization generation circuit 511a, and a second synchronized switching signal generated in the second signal synchronization generation circuit 511b are inputted into the sixth multiplexer 521, the sixth multiplexer 521 selects either the first or second synchronized switching signal as a selected switching signal based on the inputted switching signal. When a first mask signal generated in the first signal synchronization generation circuit 511a and a second mask signal generated in the second signal synchronization generation circuit 511b are inputted into the OR circuit 531, the OR circuit 531 produces a synthesized mask signal, which is the logical sum of the first and second mask signals. When the selected switching signal selected in the sixth multiplexer 521 and the first and second clock signals are inputted into the seventh multiplexer 541, the seventh multiplexer 541 selects either the first or second clock signal as a selected clock signal based on the selected switching signal. When the synthesized mask signal generated in the OR circuit 531 and the selected clock signal are inputted into the fifth AND circuit 551, the fifth AND circuit 551 generates and outputs an output clock signal, which is the logical product of the selected clock signal and the synthesized mask signal.

Next, the waveforms of the signals transmitted in the clock signal switching circuit 501 are described with reference to a timing chart shown in FIG. 33.

Figure 33:
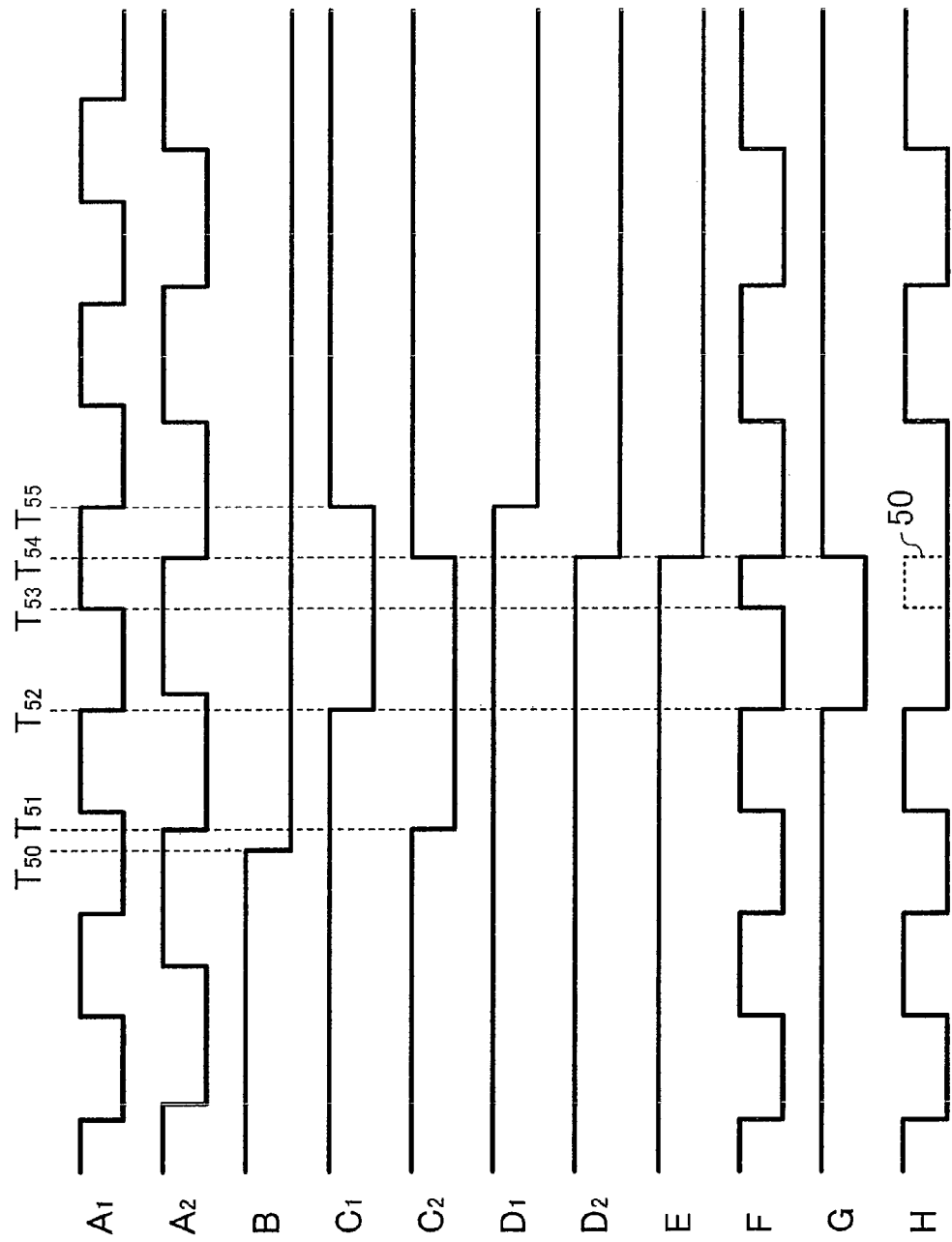
FIG. 33 is a timing chart of signals transmitted in the clock signal switching circuit of FIG. 32.

FIG. 33 is a timing chart of the signals in a case where switching from the first clock signal to the second clock signal is performed. Points $A_1$, $A_2$, B, $C_1$, $C_2$, $D_1$, $D_2$, E, F, G, and H shown in FIG. 33 correspond to the respective points shown in FIG. 32.

As shown in FIG. 33, when the switching signal (B) changes from a high level to a low level at time $T_{50}$, the first synchronized switching signal ($D_1$), the second synchronized switching signal ($D_2$), and the selected switching signal (E) change as described with reference to FIG. 5.

In the OR circuit 531 of FIG. 32, the synthesized mask signal (G) is generated. The synthesized mask signal (G) is the logical sum of the first mask signal ($C_1$), which is at a low level from time $T_{52}$ to time $T_{55}$, and the second mask signal ($C_2$), which is at a low level from time $T_5$, to time $T_{54}$. The synthesized mask signal (G) is thus at a low level from the time $T_{52}$ to the time $T_{54}$. That is to say, the synthesized mask signal (G) is at a low level during the period of time from the first negative edge (the time $T_{52}$) of the first clock signal ($A_1$), which is the clock signal to be replaced, to the second negative edge (the time $T_{54}$) of the second clock signal ($A_2$), which is the clock signal to next be selected, that occur after the switching signal (B) is changed from a high level to a low level.

When the selected switching signal (E) changes from a high level to a low level at the time $T_{54}$, the selected clock signal (F) outputted from the seventh multiplexer 541 is switched from the first clock signal ($A_1$) to the second clock signal ($A_2$).

Moreover, in the fifth AND circuit 551 shown in FIG. 32, the output clock signal (H), which is the logical product of the selected clock signal (F) and the synthesized mask signal (G), is generated, such that the generated output clock signal (H) is the selected clock signal (F) that is at a low level during the period of time from the time $T_{52}$ to the time $T_{54}$, in which the synthesized mask signal (G) is at a low level. Therefore, except for the period of time in which the synthesized mask signal (G) is at a low level, the waveform of the selected clock signal (F) is the same as that of the output clock signal (H). That is to say, the output clock signal (H) finally outputted from the clock signal switching circuit 501 has a waveform that is equal to the waveform of the selected clock signal (F) from which a waveform (a hazard) 50 is removed.

Described in the foregoing is a case in which the functions of the clock signal switching device 500 of FIG. 31 are specifically realized by the hardware (the clock signal switching circuit 501) of FIG. 32 alone, but those functions can be realized by software, for example.

Hereinafter, it will be described how to switch clock signals using software.

FIG. 7 is also a schematic view illustrating a clock signal switching program 102 for realizing the clock signal switching method of the fifth embodiment by software.

As shown in FIG. 7, when a first clock signal, a second clock signal, and a switching signal are inputted into the clock signal switching program 102, the clock signal switching program 102 selects either the first or second clock signal as a selected clock signal based on the inputted switching signal, and also outputs the selected clock signal as an output clock signal. The specific structure of the clock signal switching program 102 is the same as that of the clock signal switching device 500 of FIG. 31, for example.

More specifically, the clock signal switching program 102 has subprograms that correspond to the first signal synchronization generation means 510a, the second signal synchronization generation means 510b, the synchronized switching signal selection means 520, the mask signal synthesis means 530, the clock signal selection means 540, and the clock signal mask means 550, respectively.

Figure 34:
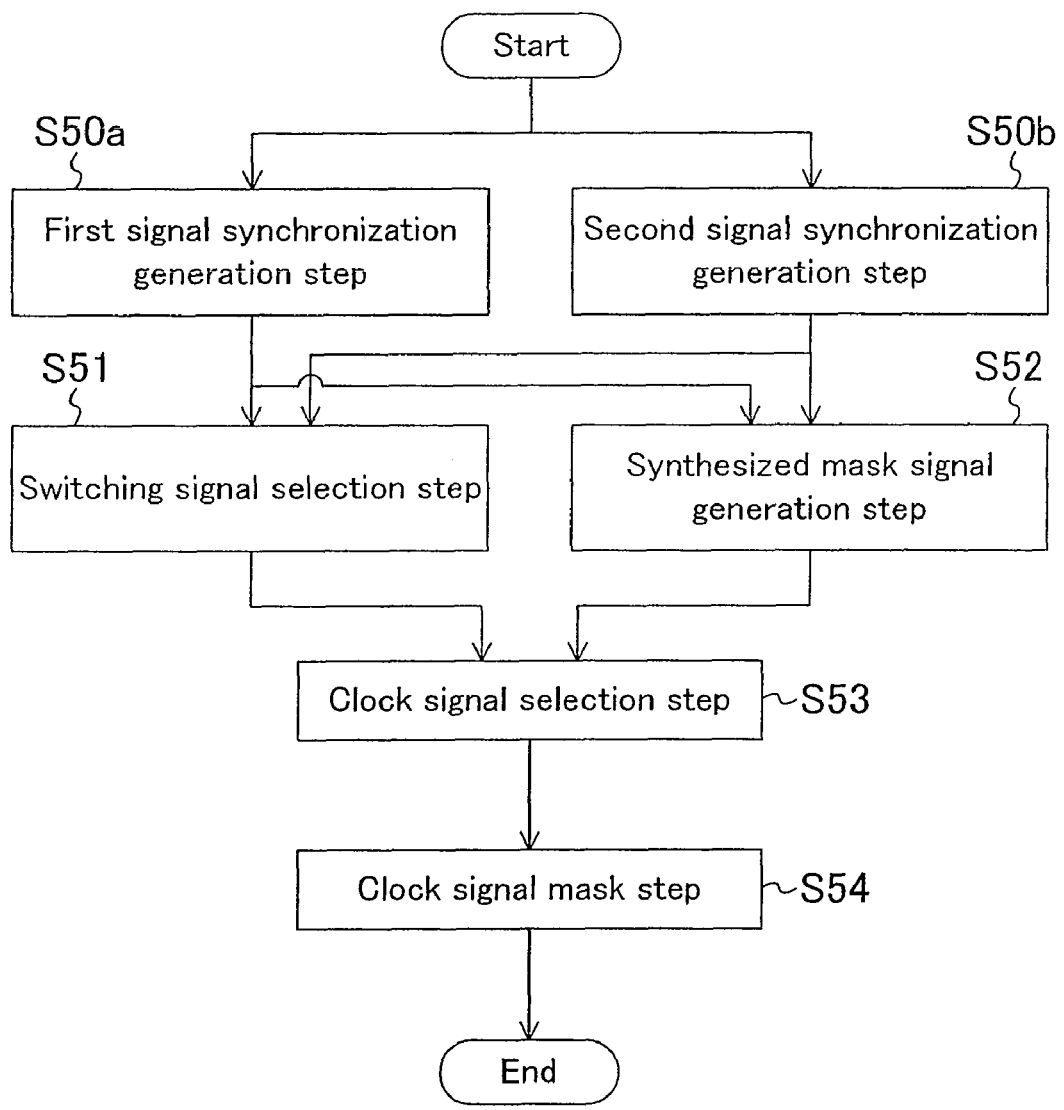
FIG. 34 indicates process steps of a clock signal switching method in accordance with a fifth embodiment of the present invention.

FIG. 34 indicates clock signal switching process steps performed by the clock signal switching program 102 of FIG. 7. A first signal synchronization generation step S50a, a second signal synchronization generation step S50b, and a switching signal selection step S51 are performed as described in the first embodiment.

As shown in FIG. 34, in a synthesized mask signal generation step S52, which is performed by a subprogram that corresponds to the mask signal synthesis means 530, a synthesized mask signal is generated, which has a masking portion where a masking portion of a first mask signal generated in the first signal synchronization generation step S50a and a masking portion of a second mask signal generated in the second signal synchronization generation step S50b overlap each other.

Next, in a clock signal selection step S53, which is performed by a subprogram that corresponds to the clock signal selection means 540, either a first clock signal or a second clock signal is selected as a selected clock signal based on either a first synchronized switching signal or a second synchronized switching signal selected as a selected switching signal in the switching signal selection step S51.

Then, in a clock signal mask step S54, which is performed by a subprogram that corresponds to the clock signal mask means 550, the selected clock signal selected in the clock signal selection step S53 is masked with the synthesized mask signal generated in the synthesized mask signal generation step S52, whereby an output clock signal is generated.

As described above, in the fifth embodiment, after either the first or second clock signal is selected as the selected clock signal by the clock signal selection means 540, the clock signal mask means 550 masks the selected clock signal with the synthesized mask signal. This makes it possible to remove a portion of the selected clock signal in which a hazard or duty ratio breakdown may have occurred, after the clock signal switching has been carried out. In other words, the selected clock signal is masked with the synthesized mask signal that masks the portion of the selected clock signal in which a hazard or duty ratio breakdown may occur, thereby allowing the produced hazard or duty ratio breakdown to be removed.

In addition, in the fifth embodiment, the fact that the first and second clock signals are synchronous and in phase with each other does not affect the prevention of a hazard or duty ratio breakdown. Therefore, the output clock signal can be switched between clock signals that are asynchronous and out of phase with each other without producing any hazard and any duty ratio breakdown.

Furthermore, in the fifth embodiment, the mask signal synthesis means 530 generates the synthesized mask signal, which is at a low level during the period of time from the first negative edge of the clock signal to be replaced, to the second negative edge of the clock signal to next be selected, which occur after the switching signal changes from a high level to a low level or from a low level to a high level, for example. In other words, it is possible to remove a portion of the selected clock signal which may contain a hazard or duty ratio breakdown, before the selected clock signal selected by the clock signal selection means 540 is outputted. Accordingly, harmful effects due to the hazard or the duty ratio breakdown that have occurred at the time of the clock signal switching can be reliably avoided.

Moreover, in the clock signal switching method of the fifth embodiment, the same waveforms as those of the signals generated in the clock signal switching circuit 501 can also be created by software. This eliminates the need for particularly incorporating a circuit for clock signal switching, which results in a reduction in the circuit size. The inventive clock signal switching method is particularly effective in systems which have already incorporated, for example, a microcomputer such as an external timing control circuit to realize functions other than a clock signal switching circuit. In that case, those systems can perform clock signal switching by using the existing microcomputer without incorporating a new microcomputer, thereby achieving a further reduction in the circuit size.

Furthermore, in the fifth embodiment, if the clock signal to next be selected has been inputted at the time of the clock signal switching, the clock signal switching can be performed regardless of the status of the clock signal to be replaced. Thus, it is possible to avoid a problem with some conventional devices in that the clock signal switching may fail depending upon the status of the to-be-replaced clock signal.

It should be noted that in the clock signal switching device of the fifth embodiment, an exemplary circuit structure that realizes the functions of the clock signal switching device 500 is the clock signal switching circuit 501, but those functions may be realized by other circuit structures.

Figure 35:
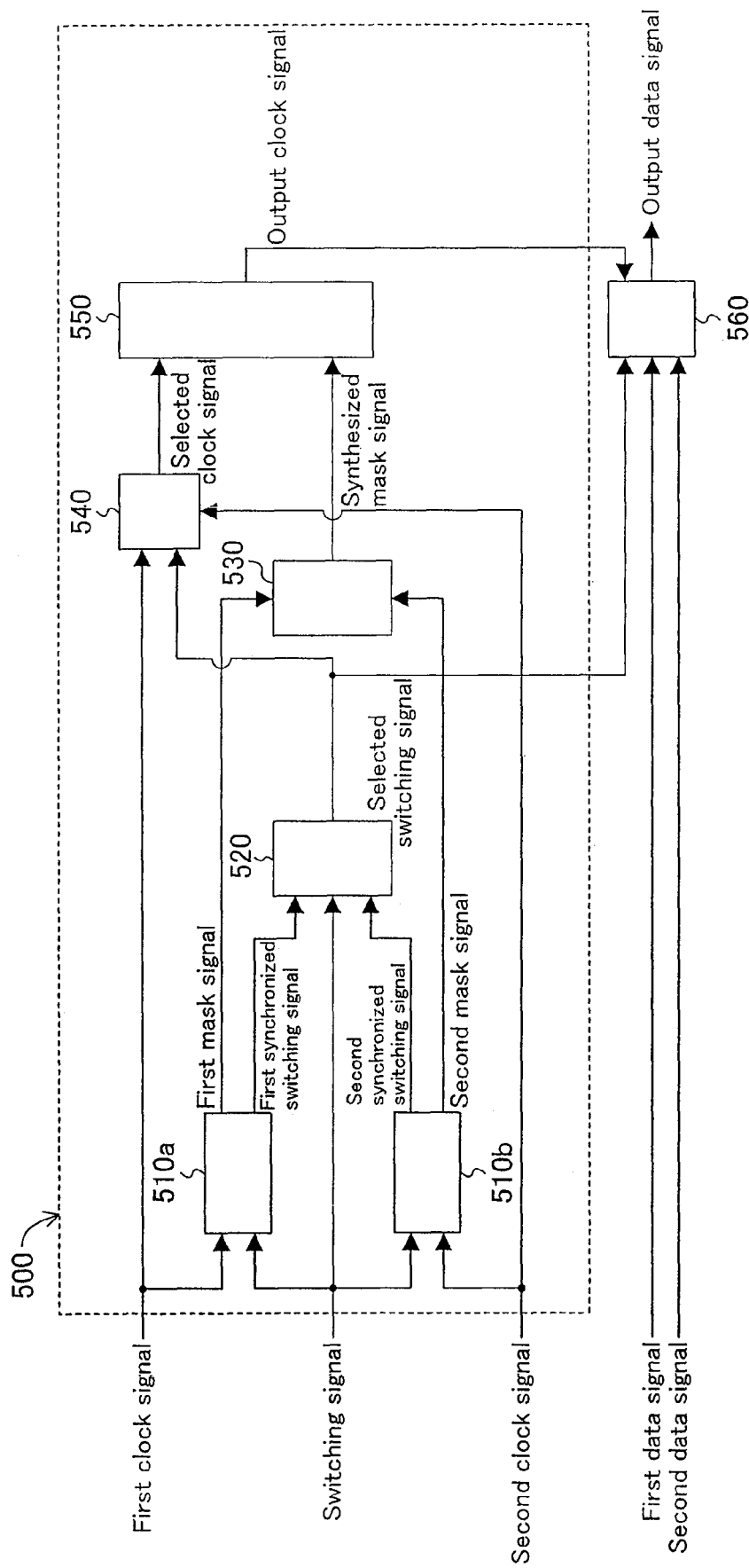
FIG. 35 is a view illustrating a structure in which a data signal selection means is added to the clock signal switching device of FIG. 31.

Also, if a data signal selection means is provided in addition to the structure of the clock signal switching device of the fifth embodiment, clock signal switching and data signal switching can be performed simultaneously. Such a structure is illustrated in FIG. 35. In FIG. 35, the same members as those of the clock signal switching device 500 of the fifth embodiment shown in FIG. 31 are identified by the same reference numerals. A data signal selection means 560 in FIG. 35 has the same functions as the data signal selection means 210 of the FIG. 11.

Figure 36:
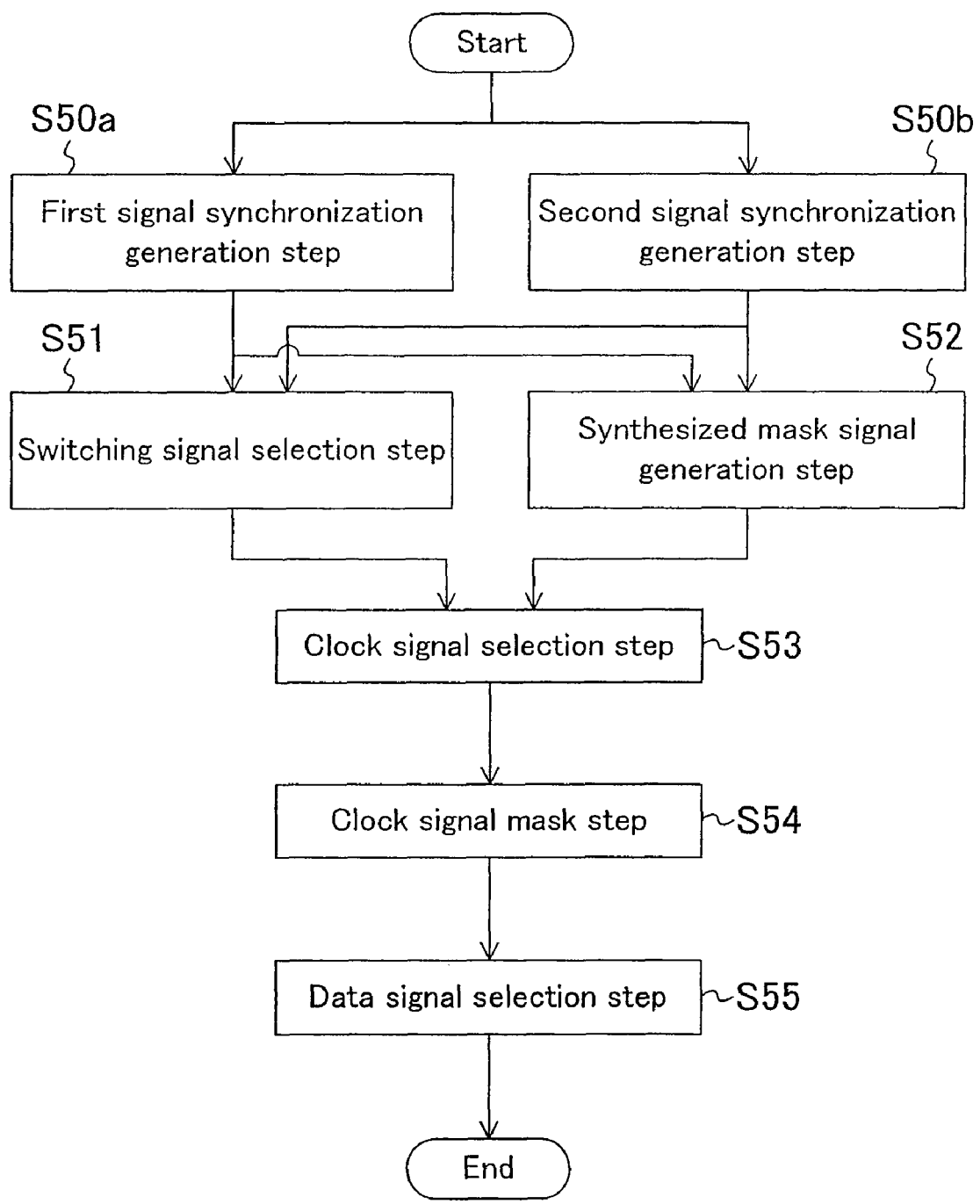
FIG. 36 indicates process steps of a data bus switching method in accordance with the fifth embodiment of the present invention.

In this case, as shown in FIG. 36, the method of simultaneously performing switching of the clock signals and of the data signals includes, in addition to the steps of FIG. 34, a data signal selection step S55 performed by a subprogram that corresponds to the data signal selection means 560. In the data signal selection step S55, either a first data signal that is in synchronization with a first clock signal or a second data signal that is in synchronization with a second clock signal is selected as a selected data signal based on a switching signal selected in the switching signal selection step S51, and the selected data signal is synchronized with an output clock signal before outputted as an output data signal.

Modified Example of the Fifth Embodiment

Hereinafter, a clock signal switching device in accordance with a modified example of the fifth embodiment of the present invention will be described with reference to the accompanying drawings.

Figure 37:
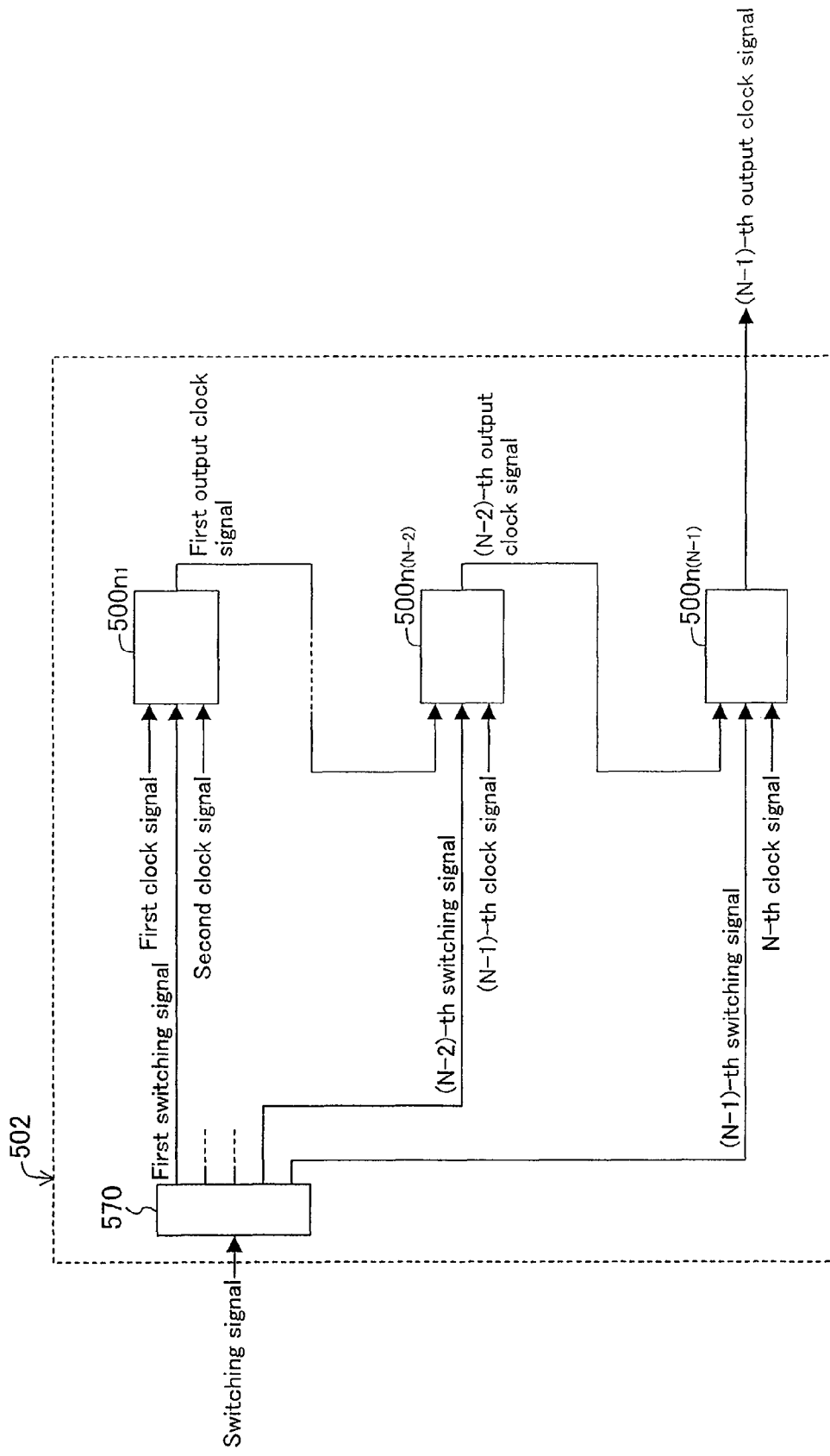
FIG. 37 is a view illustrating the structure of a clock signal switching device in accordance with a modified example of the fifth embodiment of the present invention.

FIG. 37 is a view illustrating the structure of the clock signal switching device in accordance with the modified example of the fifth embodiment.

As shown in FIG. 37, the clock signal switching device 502 of this modified example is characterized in that any one of N inputted clock signals (wherein N is an integer equal to or greater than two) can be selected as an output clock signal.

More specifically, the clock signal switching device 502 is composed of a switching signal decode means 570 and first through (N−1)-th clock signal selection means $500n_1$ through $500n_{(N-1)}$. The switching signal decode means 570 decodes an inputted switching signal to output switching signals (first through (N−1)-th switching signals) that correspond to the respective first through (N−1)-th clock signal selection means $500n_1$ through $500n_{(N-1)}$. Each clock signal selection means, e.g., the first clock signal selection means $500n_1$, selects either inputted first or second clock signal based on the inputted first switching signal (decoded signal), and also outputs the selected clock signal as a first output clock signal. The second clock signal selection means $500n_2$ (not shown) selects as a second output clock signal either the first output clock signal outputted from the first clock signal selection means $500n_1$ or an inputted third clock signal, based on the inputted second switching signal (decoded signal).

Next, the specific structure of each clock signal selection means will be described with reference to FIG. 38.

Figure 38:
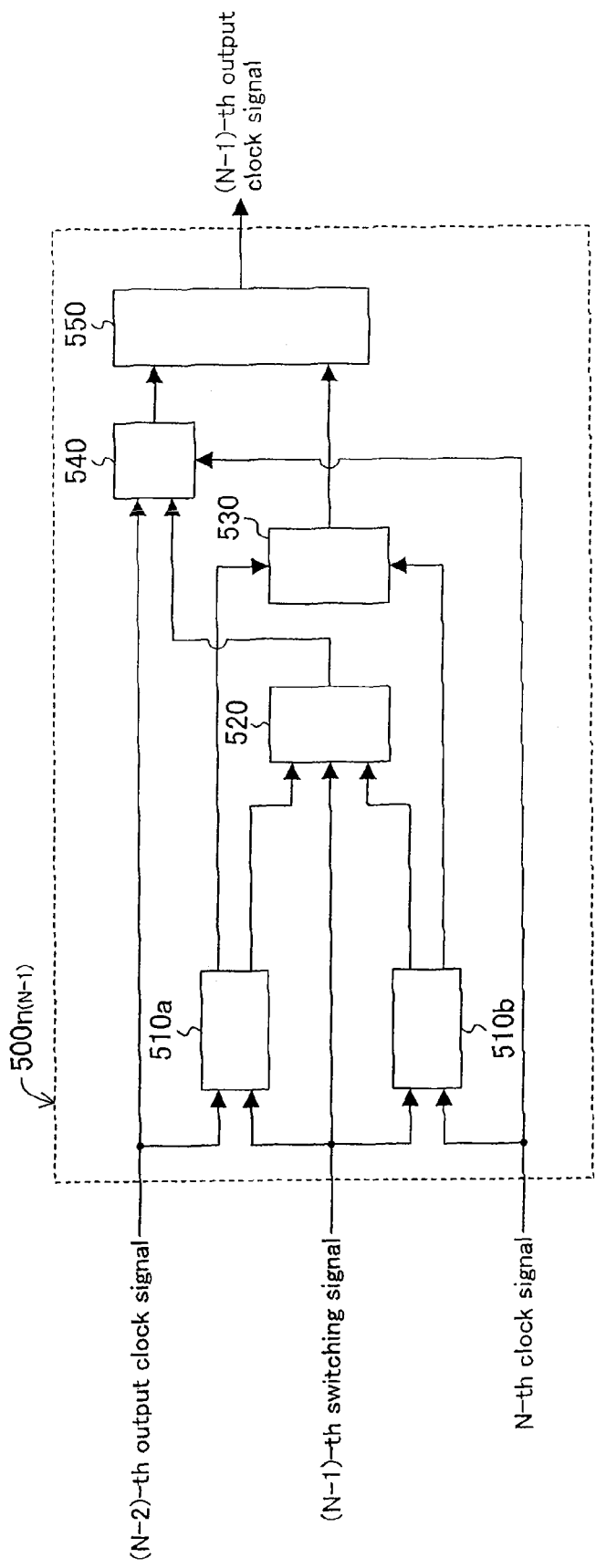
FIG. 38 is a view illustrating the structure of an (N–1)-th clock signal selection circuit that realizes functions of an (N–1)-th clock signal selection means in the clock signal switching device of FIG. 37.

FIG. 38 is a view illustrating the structure of, e.g., the (N−1)-th clock signal selection means $500n_{(N-1)}$ of the first through (N−1)-th clock signal selection means $500n_1$ through $500n_{(N-1)}$ shown in FIG. 37, in which the number of the first through (N−1)-th clock signal selection means $500n_1$ through $500n_{(N-1)}$ provided is (N−1). In FIG. 38, the same members as those of the clock signal switching device 500 of FIG. 31 are identified by the same reference numerals.

As shown in FIG. 38, the (N−1)-th clock signal selection means $500n_{(N-1)}$ has the same structure as the clock signal switching device 500 of FIG. 31. More specifically, the (N−1)-th clock signal selection means $500n_{(N-1)}$ is composed of a first signal synchronization generation means 510a, a second signal synchronization generation means 510b, a synchronized switching signal selection means 520, a mask signal synthesis means 530, a clock signal selection means 540, and a clock signal mask means 550. However, inputted into the (N−1)-th clock signal selection means $500n_{(N-1)}$ are an (N−2)-th output clock signal outputted from the (N−2)-th clock signal selection means $500n_{(N-2)}$, the (N−1)-th switching signal (decoded signal) decoded by the switching signal decode means 570, and an N-th clock signal. As in the fifth embodiment described with reference to FIG. 31, the (N−1)-th clock signal selection means $500n_{(N-1)}$ selects either the (N−2)-th output clock signal or the N-th clock signal as an (N−1)-th selected clock signal based on the (N−1)-th switching signal, and also outputs as an (N−1)-th output clock signal the (N−1)-th selected clock signal masked with an (N−1)-th synthesized mask signal.

Operation of each clock signal selection means of FIG. 37 may be considered to be the same as the operation explained in the description of the clock signal switching device 500 of FIG. 31.

As described above, in the modified example of the fifth embodiment, two or more (N−1)-th clock signal selection means $500n_{(N-1)}$ illustrated in FIG. 38, that is, two or more clock signal switching devices 500 of the fifth embodiment illustrated in FIG. 31, are provided. Thus, switching from one to another among three or more clock signals can be performed. Moreover, each of the clock signal selection means $500n_1$ through $500n_{(N-1)}$ forming the clock signal switching device 502 is the same as the clock signal switching device 500 of FIG. 31. Therefore, even in cases of switching among three or more clock signals, the effects obtainable in the fifth embodiment can be reliably attained.

It should be noted that in the modified example of the fifth embodiment, a circuit structure that realizes the functions of each clock signal selection means included in the clock signal switching device 502 may be the clock signal switching circuit 501 illustrated in FIG. 32, for example.

Moreover, as in the data bus switching device 203 of FIG. 17, if data signal selection means $210n_1$ through $210n_{(N-1)}$ are provided in addition to the structure of the data switching device of the modified example of the fifth embodiment, clock signal switching and data signal switching can be performed simultaneously.

Sixth Embodiment

Hereinafter, a clock signal switching device in accordance with a sixth embodiment of the present invention will be described with reference to the accompanying drawings.

Figure 39:
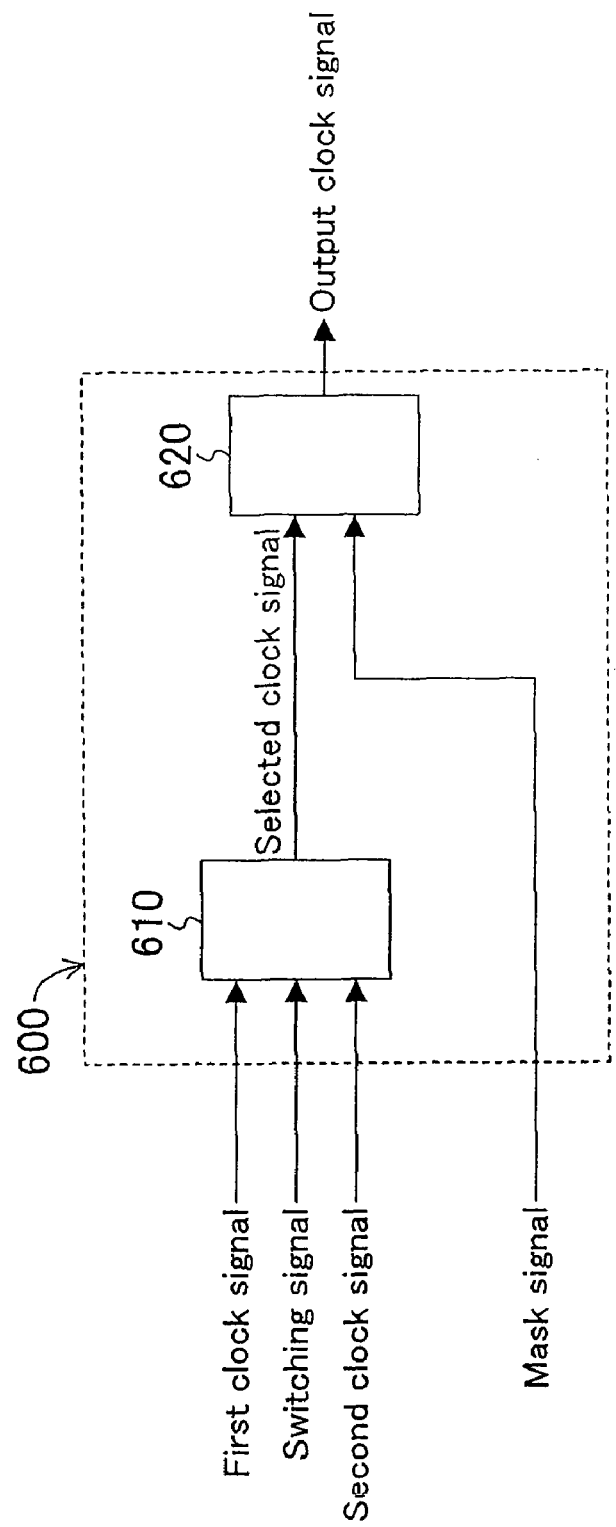
FIG. 39 is a view illustrating the structure of a clock signal switching device in accordance with a sixth embodiment of the present invention.

FIG. 39 is a view illustrating the structure of a clock signal switching device in accordance with the sixth embodiment.

As shown in FIG. 39, the clock signal switching device 600 of the sixth embodiment is composed of a signal selection means 610 and a clock signal mask means 620.

The signal selection means 610 selects either a first clock signal or a second clock signal as a selected clock signal based on an inputted switching signal. The clock signal mask means 620 masks the selected clock signal with an inputted mask signal, thereby generating and outputting an output clock signal. It is assumed that the mask signal and switching signal inputted into the clock signal switching device 600 are controlled by an external timing control circuit, for example.

Next, a circuit structure realizing the above functions will be described with reference to FIG. 40.

Figure 40:
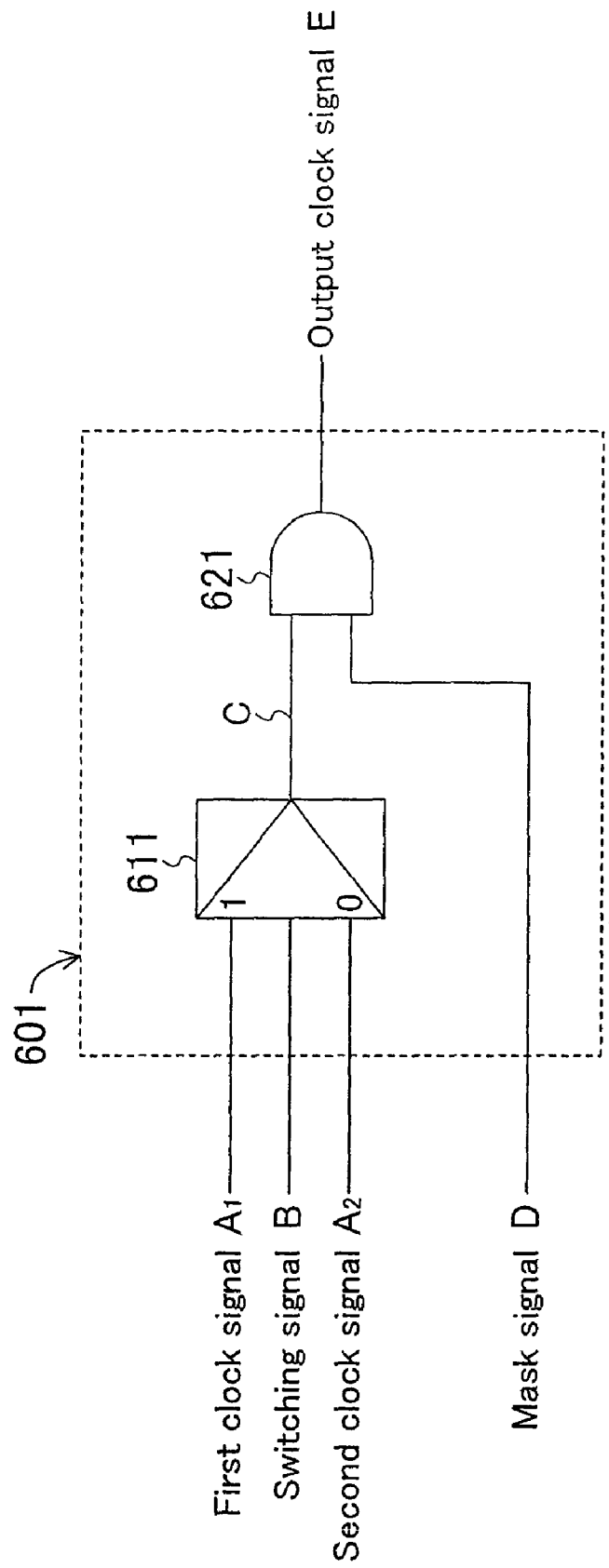
FIG. 40 is a view illustrating the structure of a clock signal switching circuit that realizes functions of the clock signal switching device illustrated in FIG. 39.

FIG. 40 is a view illustrating the structure of a clock signal switching circuit 601 that realizes the functions of the clock signal switching device 600 illustrated in FIG. 39.

As shown in FIG. 40, the clock signal switching circuit 601 is composed of an eighth multiplexer 611 and a sixth AND circuit 621.

When a first clock signal, a second clock signal, and a switching signal are inputted into the eighth multiplexer 611, the eighth multiplexer 611 selects either the first or second clock signal as a selected clock signal based on the inputted switching signal. When the selected clock signal and a mask signal are inputted into the sixth AND circuit 621, the sixth AND circuit 621 produces and outputs an output clock signal, which is the logical product of the inputted mask signal and selected clock signal.

Next, the waveforms of the signals transmitted in the clock signal switching circuit 601 are described with reference to a timing chart shown in FIG. 41.

Figure 41:
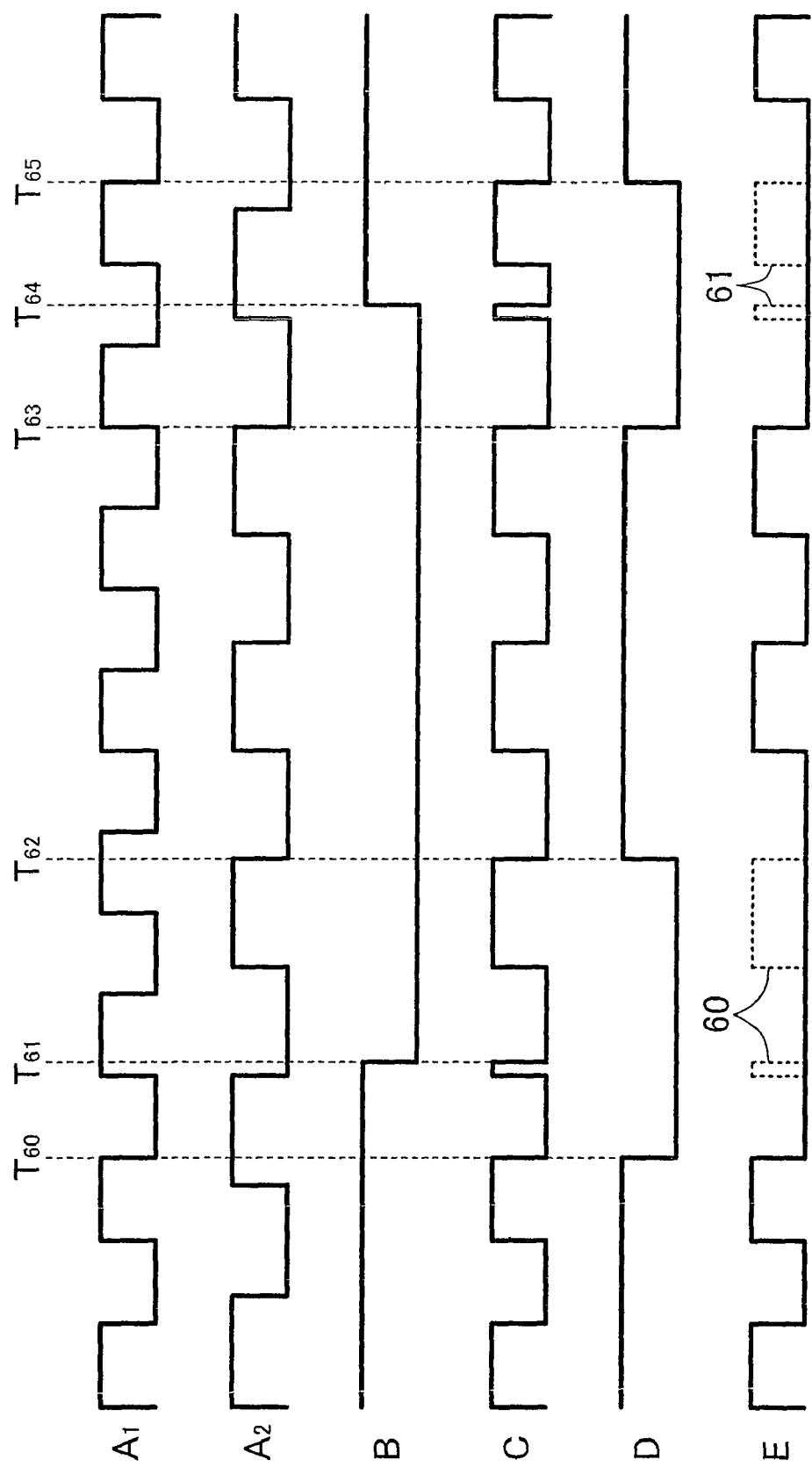
FIG. 41 is a timing chart of signals transmitted in the clock signal switching circuit of FIG. 40.

FIG. 41 is a timing chart of the signals obtained in a case where after switching from the first to second clock signal is carried out, switching from the second to first clock signal is performed in the clock signal switching circuit 601 of FIG. 40. Points $A_1$, $A_2$, B, C, D, and E shown in FIG. 41 correspond to the respective points shown in FIG. 40.

As shown in FIG. 41, in the case of switching from the first to second clock signal, when the switching signal (B) changes from a high level to a low level at time $T_{61}$, the selected clock signal (C) outputted from the eighth multiplexer 611 switches from the first clock signal ($A_1$) to the second clock signal ($A_2$) at the time $T_{61}$.

The mask signal (D) is kept at a low level during the period of time from the last negative edge (time $T_{60}$) of the first clock signal to be replaced, which occurs before the time $T_{61}$ when the switching signal (B) changes, to the first negative edge (time $T_{62}$) of the second clock signal ($A_2$) to next be selected, which occurs following the time $T_{61}$. Then, the output clock signal (E), which is the selected clock signal (C) without a waveform 60 (hazard), can be generated as the logical product of the selected clock signal (C) and the mask signal (D) obtained in the clock signal mask means 620.

On the other hand, in the case of switching from the second clock signal ($A_2$) to the first clock signal ($A_1$), when the switching signal (B) changes from a low level to a high level at time $T_{64}$, the selected clock signal (C) outputted from the eighth multiplexer 611 switches from the second clock signal ($A_2$) to the first clock signal ($A_1$) at the time $T_{64}$.

The mask signal (D) is kept at a low level during the period of time from the last negative edge (time $T_{63}$) of the to-be-replaced second clock signal ($A_2$) that occurs before the time $T_{64}$ at which the switching signal (B) changes, to the first negative edge (time $T_{65}$) of the to-next-be-selected first clock signal ($A_1$) that occurs following the time $T_{64}$. Then, the output clock signal (E), which is the selected clock signal (C) without a waveform 61 (hazard), can be generated as the logical product of the selected clock signal (C) and the mask signal (D) obtained in the clock signal mask means 620.

Figure 42:
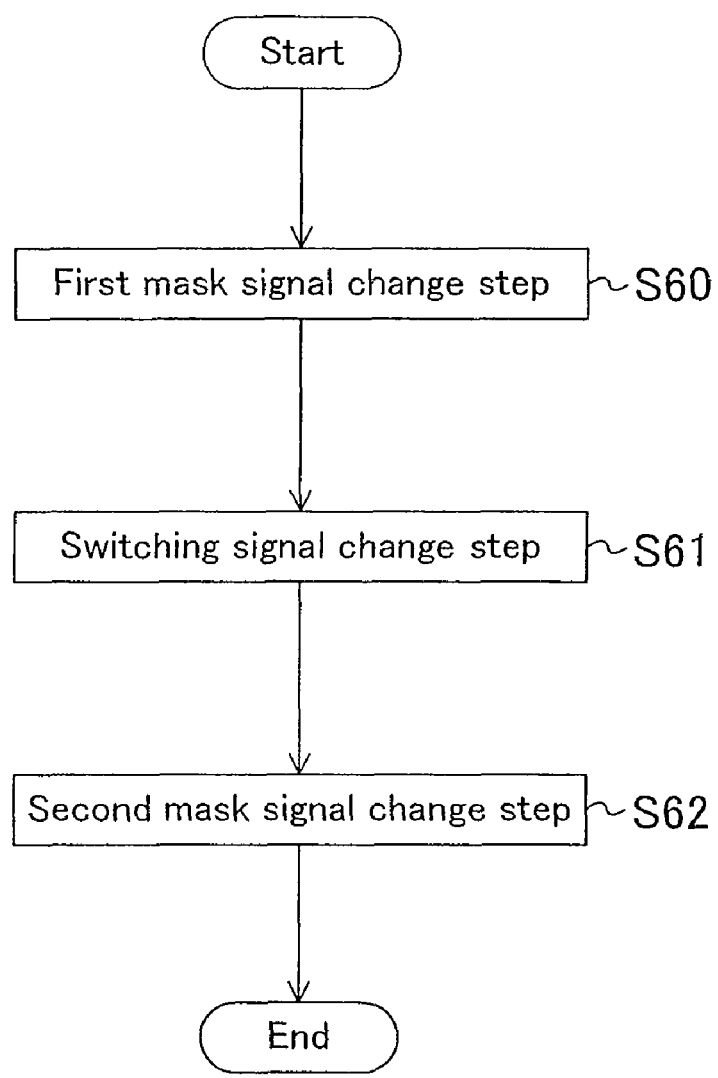
FIG. 42 indicates process steps of a method for controlling the timing of a first clock signal, a second clock signal, and a switching signal inputted to the clock signal switching circuit of FIG. 40.

FIG. 42 is a view illustrating timing at which the switching signal (B) and the mask signal (D) are changed.

First, as shown in FIG. 42, in a first mask signal change step S60, the mask signal is changes from a high level to a low level at the negative edge (the time $T_{60}$) of the first clock signal, which is the clock signal to be replaced.

Next, in a switching signal change step S61, the switching signal is changed before the time equal to one period of the to-be-replaced first clock signal passes after the time $T_{60}$.

Then, in a second mask signal change step S62, the mask signal is changed from a low level to a high level at the first negative edge (the time $T_{64}$) of the to-next-be-selected second clock signal that occurs after the time $T_6$, at which the switching signal is changed.

As described above, in the sixth embodiment, the clock signal mask means 620 masks the selected switching signal selected by the signal selection means 610, with the inputted mask signal. Thus, by controlling the timing at which the switching signal and the mask signal are changed, a hazard or duty ratio breakdown, e.g., can be removed from the selected clock signal in which the hazard, e.g., has occurred. This allows the clock signal switching to be performed without producing any operational malfunction, for example.

Moreover, in the sixth embodiment, the fact that the first and second clock signals are synchronous and in phase with each other does not affect the prevention of a hazard or duty ratio breakdown. Therefore, the output clock signal can be switched between clock signals that are asynchronous and out of phase with each other without causing any hazard and any duty ratio breakdown.

In addition, in the sixth embodiment, if the clock signal to next be selected has been inputted at the time of the clock signal switching, the clock signal switching can be performed regardless of the status of the clock signal to be replaced. Thus, it is possible to avoid a problem with some conventional devices in that the clock signal switching may fail depending upon the status of the to-be-replaced clock signal.

It should be noted that described in the sixth embodiment is an exemplary case in which the circuit structure that realizes the functions of the clock signal switching device 600 is the clock signal switching circuit 601, but those functions may be realized by other circuit structures.

Figure 43:
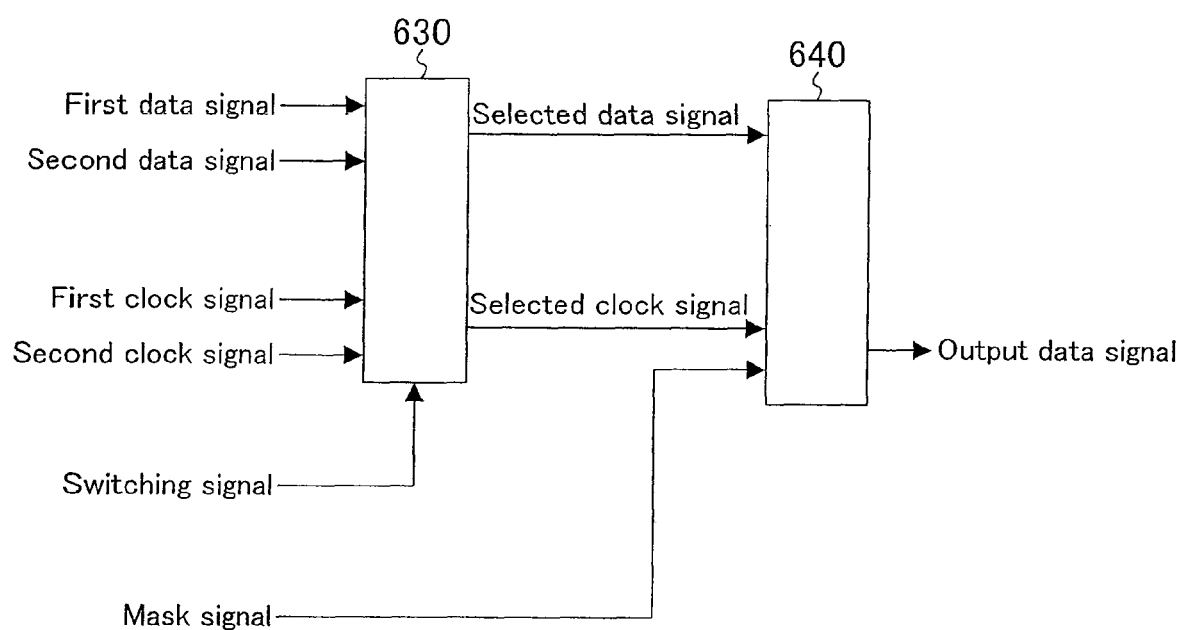
FIG. 43 is a view illustrating a structure in which a data signal selection means is added to the clock signal switching device of FIG. 39.

Also, if a data signal selection means is provided in addition to the structure of the clock signal switching device 600 of the sixth embodiment, clock signal switching and data signal switching can be performed at the same time. Such a structure is illustrated in FIG. 43. As shown in FIG. 43, a signal selection means 630 selects either a first clock signal or a second clock signal as a selected clock signal, and either a first data signal or a second data signal as a selected data signal, based on an inputted switching signal. A signal mask means 640 masks with a mask signal the selected clock signal and the selected data signal selected by the signal selection means 630, and outputs as an output data signal the selected data signal that is in synchronization with the masked selected clock signal.

In the sixth embodiment, the waveform of the mask signal is designed so as to be at a low level during the period of time from the last negative edge of the to-be-replaced clock signal that occurs before the switching signal changes, to the first negative edge of the to-next-be-selected clock signal that occurs after the switching signal changes. But the waveform of the mask signal may be designed so as to be at a low level during the period of time from the last negative edge of the to-be-replaced clock signal that occurs before the switching signal changes, to the first positive edge of the to-next-be-selected clock signal that occurs after the switching signal changes, for example.

Modified Example of the Sixth Embodiment

Hereinafter, a clock signal switching device in accordance with a modified example of the sixth embodiment of the present invention will be described with reference to the accompanying drawings.

Figure 44:
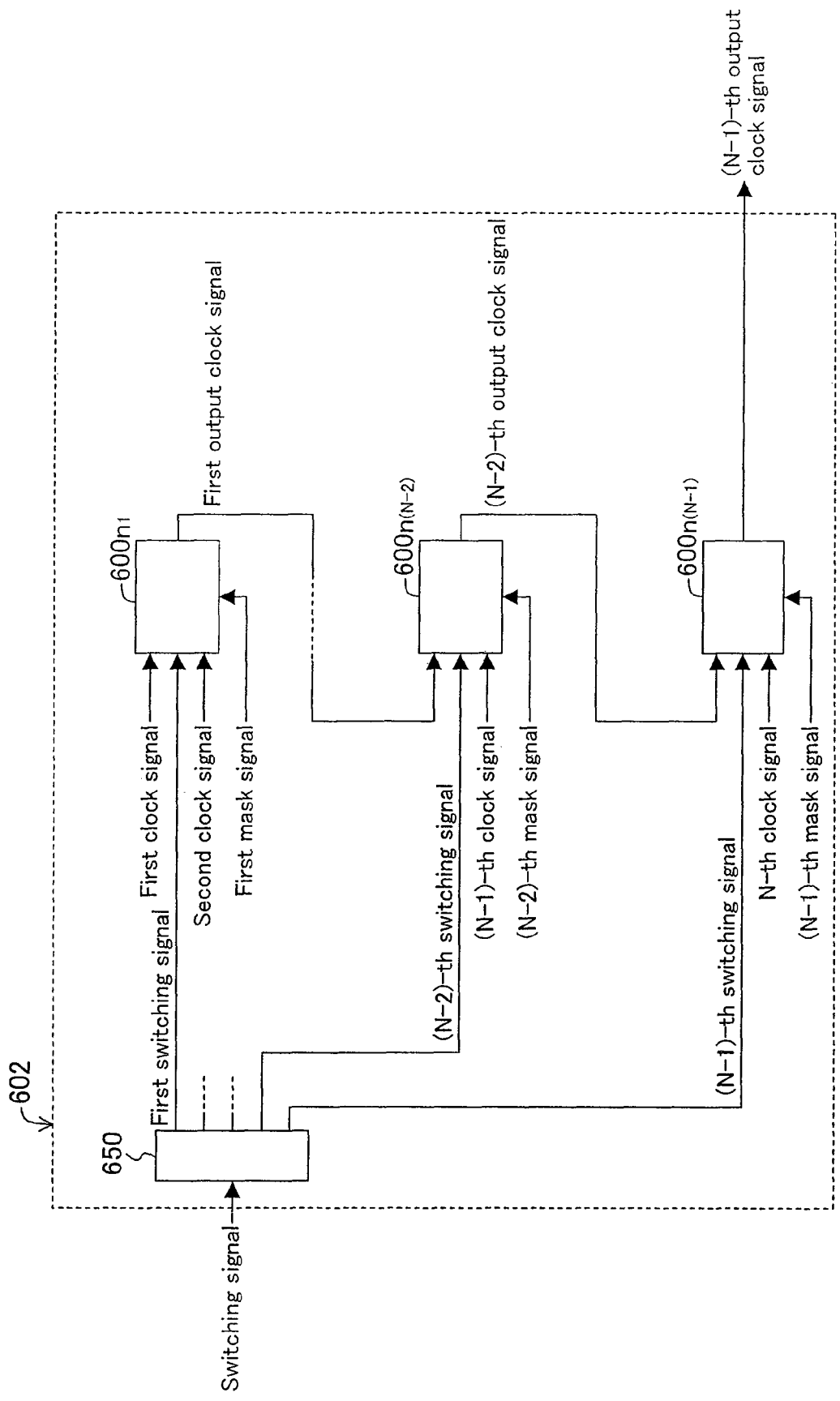
FIG. 44 is a view illustrating the structure of a clock signal switching device in accordance with a modified example of the sixth embodiment of the present invention.

FIG. 44 is a view illustrating the structure of the clock signal switching device in accordance with the modified example of the sixth embodiment.

As shown in FIG. 44, the clock signal switching device 602 of this modified example is characterized in that any one of N inputted clock signals (wherein N is an integer equal to or greater than two) can be selected as an output clock signal.

More specifically, the clock signal switching device 602 is composed of a switching signal decode means 650 and first through (N−1)-th clock signal selection means $600n_1$ through $600n_{(N-1)}$. The switching signal decode means 650 decodes an inputted switching signal to output switching signals (first through (N−1)-th switching signals) that correspond to the respective first through (N−1)-th clock signal selection means $600n_1$ through $600n_{(N-1)}$. Each clock signal selection means, e.g., the first clock signal selection means $60n_1$, selects either inputted first or second clock signal based on the inputted first switching signal, and also outputs the selected clock signal as a first output clock signal. The second clock signal selection means $600n_2$ (not shown) selects as a second output clock signal either the first output clock signal outputted from the first clock signal selection means $600n_1$ or a third clock signal based on the inputted second switching signal (decoded signal.)

Next, the specific structure of each clock signal selection means will be described with reference to FIG. 45.

Figure 45:
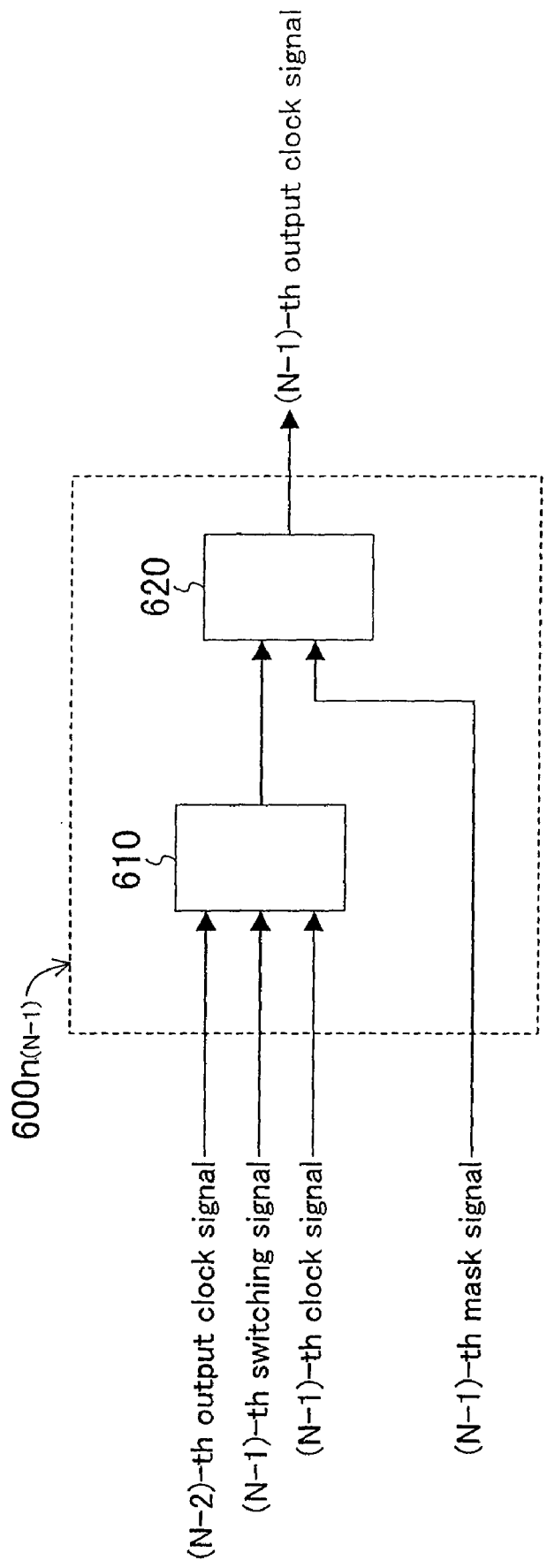
FIG. 45 is a view illustrating the structure of an (N–1)-th clock signal selection circuit that realizes functions of an (N–1)-th clock signal selection means in the clock signal switching device of FIG. 44.

FIG. 45 is a view illustrating the structure of, e.g., the (N−1)-th clock signal selection means $600n_{(N-1)}$ of the first through (N−1)-th clock signal selection means $600n_1$ through $600n_{(N-1)}$ shown in FIG. 44, in which the number of the first through (N−1)-th clock signal selection means $600n_1$ through $600n_{(N-1)}$ provided is (N−1). In FIG. 45, the same members as those of the clock signal switching device 600 of FIG. 39 are identified by the same reference numerals.

As shown in FIG. 45, the (N−1)-th clock signal selection means $600n_{(N-1)}$ has the same structure as the clock signal switching device 600 of FIG. 39. More specifically, the (N−1)-th clock signal selection means $600n_{(N-1)}$ is composed of a signal selection means 630 and a signal mask means 640. However, inputted into the (N−1)-th clock signal selection means $600n_{(N-1)}$ are an (N−2)-th output clock signal outputted from the (N−2)-th clock signal selection means $600n_{(N-2)}$, the (N−1)-th switching signal decoded by the switching signal decode means 650, an N-th clock signal, and an (N−1)-th mask signal. As in the sixth embodiment described with reference to FIG. 39, the (N−1)-th clock signal selection means $600n_{(N-1)}$ selects either the (N−2)-th output clock signal or the N-th clock signal as an (N−1)-th selected clock signal based on the (N−1)-th switching signal, and also masks the (N−1)-th selected clock signal with the inputted (N−1)-th mask signal, thereby generating and outputting an (N−1)-th output clock signal.

Operation of each clock signal selection means of FIG. 44 is the same as the operation explained in the description of the clock signal switching device 600 of FIG. 39.

As described above, in the modified example of the sixth embodiment, two or more (N−1)-th clock signal selection means $600n_{(N-1)}$ illustrated in FIG. 44, that is, two or more clock signal switching devices 600 of the sixth embodiment illustrated in FIG. 38, are provided. Thus, switching from one to another among three or more clock signals can be performed. Moreover, each of the clock signal selection means $600n_1$ through $600n_{(N-1)}$ forming the clock signal switching device 602 is the same as the clock signal switching device 600 of FIG. 39. Therefore, even in cases of switching among three or more clock signals, the effects obtainable in the sixth embodiment can be reliably attained.

It should be noted that in the modified example of the sixth embodiment, a circuit structure that realizes the functions of each clock signal selection means included in the clock signal switching device 602 may be the clock signal switching circuit 601 illustrated in FIG. 40, for example.

Moreover, as in the data bus switching device 203 of FIG. 17, if data signal selection means $210n_1$ through $210n_{(N-1)}$ are provided in addition to the structure of the data switching device of the modified example of the sixth embodiment, clock signal switching and data signal switching can be performed at the same time.

What is claimed is:

1. A clock signal switching device comprising:
   first clock signal mask means for masking a first clock signal with a first synchronized mask signal, thereby generating a first masked clock signal;
   second clock signal mask means for masking a second clock signal with a second synchronized mask signal, thereby generating a second masked clock signal;
   masked clock signal selection means for selecting either the first masked clock signal or the second masked clock signal as a selected clock signal based on a switching signal;
   first signal synchronization generation means for synchronizing a first mask signal to the first clock signal, thereby generating the first synchronized mask signal; and
   second signal synchronization generation means for synchronizing a second mask signal to the second clock signal, thereby generating the second synchronized mask signal.

2. A clock signal switching device comprising:
   first clock signal mask means for masking a first clock signal with a first mask signal, thereby generating a first masked clock signal;
   second clock signal mask means for masking a second clock signal with a second mask signal, thereby generating a second masked clock signal;
   masked clock signal selection means for selecting either the first masked clock signal or the second masked clock signal as a selected clock signal based on a switching signal;
   first signal synchronization generation means for synchronizing the switching signal to the first clock signal, thereby generating a first synchronized switching signal;
   second signal synchronization generation means for synchronizing the switching signal to the second clock signal, thereby generating a second synchronized switching signal; and
   switching signal selection means for selecting either the first synchronized switching signal that is synchronous with the first clock signal or the second synchronized switching signal that is synchronous with the second clock signal, as a selected switching signal based on the switching signal,
   wherein the masked clock signal selection means selects either the first masked clock signal or the second masked clock signal as the selected clock signal based on the selected switching signal.

3. A data receiving device comprising:
   at least one signal switching means;
   first receiving means for receiving a first data signal and a first clock signal, and outputting the first clock signal to the at least one signal switching means;
   second receiving means for receiving a second data signal and a second clock signal, and outputting the second clock signal to the at least one signal switching means; and
   transmitting means for externally transmitting a selected clock signal selected by the signal switching means, wherein
   the signal switching means includes:
      first clock signal mask means for masking the first clock signal with a first mask signal, thereby generating a first masked clock signal;
      second clock signal mask means for masking the second clock signal with a second mask signal, thereby generating a second masked clock signal; and
      masked clock signal selection means for selecting either the first masked clock signal or the second masked clock signal as the selected clock signal based on a switching signal.

4. A data bus switching device comprising:
   first clock signal mask means for masking a first clock signal inputted via a first data bus with a first mask signal, thereby generating a first masked clock signal;
   second clock signal mask means for masking a second clock signal inputted via a second data bus with a second mask signal, thereby generating a second masked clock signal;
   masked clock signal selection means for selecting either the first masked clock signal or the second masked clock signal as a selected clock signal based on a switching signal; and
   data signal selection means for selecting either a first data signal or a second data signal as a selected data signal based on the switching signal, the first data signal being inputted via the first data bus and synchronous with the first clock signal, the second data signal being inputted via the second data bus and synchronous with the second clock signal.

5. The device of claim 4, wherein the first clock signal and the second clock signal have different frequencies.

6. The device of claim 4, wherein the first clock signal and the second clock signal are out of phase with each other.

7. The device of claim 4, further comprising:
   first signal synchronization generation means for synchronizing the first mask signal to the first clock signal; and
   second signal synchronization generation means for synchronizing the second mask signal to the second clock signal, wherein the first clock signal mask means masks the first clock signal with the first mask signal that is synchronous with the first clock signal; and the second clock signal mask means masks the second clock signal with the second mask signal that is synchronous with the second clock signal.

8. The device of claim 4, further comprising:

first signal synchronization generation means for synchronizing the switching signal to the first clock signal;

second signal synchronization generation means for synchronizing the switching signal to the second clock signal; and switching signal selection means for selecting either the switching signal that is synchronous with the first clock signal or the switching signal that is synchronous with the second clock signal, as a selected switching signal based on the switching signal, wherein the masked clock signal selection means selects either the first masked clock signal or the second masked clock signal as the selected clock signal based on the selected switching signal, and the data signal selection means selects either the first data signal or the second data signal as the selected data signal based on the selected switching signal.

9. A data receiving device comprising:

at least one said data bus switching device of claim 4 as signal switching means;

first receiving means for outputting to the signal switching means the first clock signal and the first data signal that are received externally;

second receiving means for outputting to the signal switching means the second clock signal and the second data signal that are received externally; and transmitting means for externally transmitting the selected clock signal and the selected data signal selected by the signal switching means.

\* \* \* \* \*